US012155475B2

(12) United States Patent
Myung et al.

(10) Patent No.: US 12,155,475 B2
(45) Date of Patent: *Nov. 26, 2024

(54) METHOD AND APPARATUS FOR ENCODING/DECODING CHANNEL IN COMMUNICATION OR BROADCASTING SYSTEM

(71) Applicant: Samsung Electronics Co., Ltd., Suwon-si (KR)

(72) Inventors: Seho Myung, Seoul (KR); Kyungjoong Kim, Suwon-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/313,740

(22) Filed: May 8, 2023

(65) Prior Publication Data

US 2023/0275696 A1 Aug. 31, 2023

Related U.S. Application Data

(63) Continuation of application No. 17/582,300, filed on Jan. 24, 2022, now Pat. No. 11,646,818, which is a (Continued)

(30) Foreign Application Priority Data

Aug. 10, 2017 (KR) ........................ 10-2017-0101935
Aug. 30, 2017 (KR) ........................ 10-2017-0110504

(51) Int. Cl.
*H04L 1/00* (2006.01)

(52) U.S. Cl.
CPC .......... *H04L 1/0057* (2013.01); *H04L 1/0041* (2013.01); *H04L 1/0061* (2013.01); *H04L 1/0009* (2013.01); *H04L 1/0045* (2013.01)

(58) Field of Classification Search
CPC ......... H03M 13/6362; H03M 13/6356; H03M 13/116; H03M 13/09; H04L 1/0041;
(Continued)

(56) References Cited

U.S. PATENT DOCUMENTS

2010/0251062 A1 9/2010 Chen et al.
2012/0166914 A1 6/2012 Khandekar et al.
(Continued)

FOREIGN PATENT DOCUMENTS

CN 103765781 A 4/2014
CN 105284053 A 1/2016
(Continued)

OTHER PUBLICATIONS

MCC Support 'Draft Report of 3GPP TSG RAN WG1 #AH_NR2 v0.1.0', Jul. 3, 2017; Qingdao, China.
(Continued)

*Primary Examiner* — Oussama Roudani
(74) *Attorney, Agent, or Firm* — Jefferson IP Law, LLP

(57) ABSTRACT

This disclosure relates to a 5G or pre-5G communication system for supporting a higher data transfer rate than a 4G communication system such as LTE. The present invention relates to a method for encoding and decoding a channel in a communication or broadcasting system, comprising the steps of determining an input bit size (CBS), determining a code rate (R), determining a size (Z) of a block, comparing the determined CBS and code rate with predetermined reference values, determining an LDPC sequence to perform LDPC encoding according to the comparison result, and performing LDPC encoding and decoding on the basis of the LDPC sequence and the block size. Further, the present invention comprises the steps of determining a code rate (R) indicated by a modulation and coding scheme (MCS) index, determining a transport block size, and determining either a
(Continued)

first basic matrix or a second basic matrix as a basic matrix on the basis of the transport block size and the code rate.

12 Claims, 72 Drawing Sheets

Related U.S. Application Data continuation of application No. 16/629,116, filed as application No. PCT/KR2018/009194 on Aug. 10, 2018, now Pat. No. 11,258,536.

(58) Field of Classification Search
CPC ... H04L 1/0057; H04L 1/0061; H04L 1/0009; H04L 1/0045
See application file for complete search history.

(56) References Cited

U.S. PATENT DOCUMENTS

| | | | |
|---|---|---|---|
| 2014/0201592 | A1 | 7/2014 | Shen et al. |
| 2014/0372825 | A1 | 12/2014 | Jeong et al. |
| 2016/0087648 | A1 | 3/2016 | Korb et al. |
| 2017/0187489 | A1 | 6/2017 | Myung et al. |
| 2017/0250712 | A1 * | 8/2017 | Chiu .................... H04L 1/0068 |
| 2018/0152205 | A1 | 5/2018 | Kim et al. |
| 2018/0205395 | A1 | 7/2018 | Nammi |
| 2018/0205497 | A1 | 7/2018 | Wang et al. |
| 2018/0226988 | A1 * | 8/2018 | Soriaga .............. H03M 13/1102 |
| 2018/0227077 | A1 | 8/2018 | Lee et al. |
| 2018/0278267 | A1 | 9/2018 | Lee et al. |
| 2019/0037437 | A1 * | 1/2019 | Sun ...................... H04L 1/0075 |
| 2019/0222229 | A1 | 7/2019 | Montorsi et al. |
| 2020/0162109 | A1 * | 5/2020 | Zhang ................ H03M 13/1154 |
| 2020/0235752 | A1 * | 7/2020 | Sandberg .......... H03M 13/6508 |
| 2020/0235759 | A1 | 7/2020 | Ye et al. |
| 2021/0013901 | A1 | 1/2021 | Li et al. |

FOREIGN PATENT DOCUMENTS

| | | | |
|---|---|---|---|
| CN | 106685586 | A | 5/2017 |
| EP | 2 317 656 | A1 | 5/2011 |
| KR | 10-2008-0106738 | A | 12/2008 |
| WO | 2017/119922 | A1 | 7/2017 |

OTHER PUBLICATIONS

Ericsson, 'On MCS/transport Block Size Determination', 3GPP TSG RAN WG1 NR Ad-Hoc#2, R1-1711501, Jun. 17, 2017; Qingtao, P.R. China.
Samsung, 'CB Segmentation on Data Channel', 3GPP TSG RAN WG1 NR Ad-Hoc#2, R1-1710742, Jun. 19, 2017; Qingtao P.R. China.
Extended European Search Report dated Jun. 18, 2020, issued in a counterpart European Application No. 18843734.7-1220/3661084.
Intel Corporation: "LDPC Coding chain", 3GPP Draft; R1-1711344, vol. RAN WG1, No. XP051300533; Jun. 26, 2017, Qingdao, P.R. China.
Ericsson: "LDPC Code Performance for High Reliability Use Cases", 3GPP Draft; R1-1710499, vol. RAN WG1, No. XP051299707; Jun. 26, 2017, Qingdao, P.R. China.
Mediatek Inc: "On design and performance of NR eMBB LDPC Code", 3GPP Draft; #U00A0 R1-1709856, vol. RAN WG1, No. XP051285612; May 29, 2017, Hangzhou, China.
Samsung: "LDPC Code Design for eMBB", 3GPP Draft; R1-1709276, vol. RAN WG1, No. XP051285036; May 16, 2017, Hangzhou, China.
Chinese Office Action dated Apr. 6, 2022, issued in a counterpart Chinese Application No. 201880050931.9.
Korean Office Action dated Sep. 7, 2022, issued in a counterpart Korean Application No. 10-2017-0110504.
Samsung; LDPC Code Design for eMBB; 3GPP TSG RAN WG1 #89; R1-1709162; May 16, 2017, Hangzhou, China.
Chinese Notice of Allowance dated Nov. 16, 2022, issued in a counterpart Chinese Application No. 201880050931.9.
European Office Action dated Mar. 31, 2023, issued in European Patent Application No. 18843734.7.
Chinese Office Action dated May 31, 2024, issued in Chinese Patent Application No. 202310095757.2.

* cited by examiner $$H_1 = \begin{Bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{Bmatrix}$$

FIG. 19A

| | | |
|---|---|---|
| 19B | 19C | 19D |
| 19E | 19F | 19G |
| 19H | 19I | 19J |

FIG. 19B

| | | | | | | | | | | | | | | | | | | | | | | | | | | |
|---|---|---|---|---|---|---|---|---|---|---|---|---|---|---|---|---|---|---|---|---|---|---|---|---|---|---|
| 1 | 1 | 1 | 1 | 0 | 1 | 1 | 0 | 0 | 1 | 1 | 1 | 1 | 1 | 0 | 1 | 1 | 0 | 1 | 1 | 1 | 1 | 1 | 1 | 0 | 0 | 0 |
| 1 | 0 | 1 | 1 | 1 | 1 | 0 | 1 | 1 | 1 | 0 | 1 | 1 | 0 | 1 | 1 | 1 | 1 | 0 | 1 | 0 | 1 | 1 | 1 | 1 | 0 | 0 |
| 1 | 1 | 1 | 0 | 1 | 1 | 1 | 1 | 1 | 1 | 1 | 0 | 0 | 1 | 1 | 1 | 0 | 1 | 1 | 1 | 1 | 0 | 0 | 0 | 1 | 1 | 0 |
| 1 | 1 | 0 | 1 | 1 | 0 | 1 | 1 | 1 | 0 | 1 | 1 | 1 | 1 | 1 | 0 | 1 | 1 | 1 | 0 | 1 | 1 | 1 | 0 | 0 | 1 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |

FIG. 19C

| | | | | | | | | | | | | | | | | | | | |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |

FIG. 19D

| | | | | | | | | | | | | | | | | | | | | |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 19E

| | | | | | | | | | | | | | | | | | | | | | | | | | | |
|---|---|---|---|---|---|---|---|---|---|---|---|---|---|---|---|---|---|---|---|---|---|---|---|---|---|---|
| 1 | 1 | 0 | 1 | 0 | 0 | 0 | 0 | 0 | 0 | 0 | 0 | 1 | 0 | 0 | 0 | 1 | 0 | 0 | 0 | 0 | 1 | 1 | 0 | 0 | 0 | 0 |
| 1 | 0 | 0 | 0 | 0 | 0 | 1 | 0 | 0 | 0 | 1 | 1 | 0 | 1 | 0 | 0 | 0 | 1 | 1 | 0 | 1 | 0 | 0 | 0 | 0 | 0 | 0 |
| 1 | 1 | 0 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 1 | 0 | 0 | 0 | 0 | 0 | 0 | 0 | 0 | 1 | 0 | 0 | 0 | 1 | 0 | 0 | 1 | 0 | 1 | 1 | 0 | 1 | 0 | 0 |
| 1 | 1 | 0 | 0 | 0 | 0 | 0 | 0 | 0 | 0 | 1 | 1 | 0 | 1 | 0 | 0 | 0 | 1 | 1 | 0 | 1 | 0 | 0 | 0 | 0 | 0 | 0 |
| 0 | 1 | 1 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 1 | 0 | 0 | 0 | 1 | 0 | 0 | 0 | 0 | 1 | 1 | 1 | 0 | 0 | 0 |
| 1 | 1 | 0 | 0 | 0 | 0 | 0 | 0 | 0 | 0 | 1 | 1 | 0 | 1 | 0 | 0 | 0 | 0 | 1 | 0 | 0 | 0 | 0 | 0 | 0 | 0 | 0 |
| 1 | 0 | 0 | 1 | 0 | 0 | 0 | 1 | 0 | 0 | 0 | 0 | 0 | 0 | 0 | 0 | 0 | 0 | 0 | 0 | 1 | 0 | 0 | 1 | 0 | 0 | 0 |
| 1 | 0 | 0 | 0 | 0 | 0 | 0 | 0 | 0 | 0 | 0 | 0 | 1 | 0 | 0 | 1 | 1 | 1 | 0 | 0 | 0 | 1 | 0 | 0 | 0 | 0 | 0 |
| 1 | 1 | 0 | 0 | 0 | 0 | 0 | 0 | 0 | 0 | 1 | 0 | 0 | 1 | 0 | 0 | 0 | 0 | 1 | 0 | 0 | 0 | 0 | 0 | 0 | 1 | 0 |
| 0 | 1 | 0 | 1 | 0 | 0 | 0 | 0 | 0 | 0 | 0 | 1 | 0 | 0 | 0 | 0 | 0 | 0 | 0 | 0 | 1 | 0 | 1 | 0 | 0 | 0 | 0 |
| 1 | 0 | 0 | 0 | 0 | 0 | 0 | 0 | 0 | 0 | 0 | 0 | 0 | 0 | 1 | 0 | 1 | 1 | 0 | 0 | 0 | 1 | 0 | 0 | 0 | 0 | 0 |
| 0 | 1 | 0 | 0 | 0 | 0 | 0 | 0 | 0 | 0 | 0 | 0 | 1 | 1 | 0 | 0 | 0 | 0 | 1 | 1 | 0 | 0 | 0 | 0 | 0 | 0 | 0 |
| 1 | 1 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 | 0 |
| 1 | 0 | 0 | 1 | 0 | 0 | 0 | 0 | 0 | 1 | 0 | 1 | 0 | 0 | 0 | 0 | 0 | 0 | 0 | 0 | 0 | 0 | 1 | 0 | 0 | 0 | 0 |
| 0 | 1 | 0 | 0 | 0 | 1 | 0 | 0 | 0 | 0 | 0 | 0 | 0 | 0 | 0 | 0 | 1 | 0 | 0 | 0 | 1 | 1 | 0 | 0 | 0 | 0 | 0 |
| 1 | 0 | 0 | 0 | 0 | 0 | 0 | 0 | 0 | 0 | 0 | 0 | 1 | 1 | 0 | 0 | 0 | 1 | 0 | 0 | 0 | 0 | 0 | 0 | 0 | 0 | 0 |
| 0 | 1 | 1 | 0 | 0 | 0 | 0 | 0 | 0 | 0 | 1 | 0 | 0 | 0 | 0 | 0 | 0 | 0 | 1 | 0 | 0 | 0 | 0 | 0 | 0 | 0 | 0 |
| 1 | 0 | 0 | 1 | 1 | 0 | 0 | 0 | 0 | 0 | 0 | 1 | 0 | 0 | 0 | 0 | 0 | 0 | 0 | 0 | 0 | 0 | 1 | 0 | 0 | 0 | 0 |

FIG. 19F

| | | | | | | | | | | | | | | | | | | | |
|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 0 | 0 | 1 |

FIG. 19G

| | | | | | | | | | | | | | | | | | | | | |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 19H

| | | | | | | | | | | | | | | | | | | | | | | | | | | |
|---|---|---|---|---|---|---|---|---|---|---|---|---|---|---|---|---|---|---|---|---|---|---|---|---|---|---|
| 0 | 1 | 0 | 0 | 0 | 0 | 1 | 1 | 0 | 0 | 0 | 0 | 0 | 0 | 1 | 0 | 0 | 0 | 0 | 0 | 0 | 0 | 0 | 0 | 0 | 0 | 0 |
| 1 | 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| 0 | 1 | 0 | 0 | 0 | 0 | 1 | 0 | 1 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 1 | 0 | 1 | 0 | 0 | 0 | 0 | 0 |
| 0 | 1 | 0 | 0 | 0 | 0 | 0 | 0 | 0 | 0 | 0 | 0 | 0 | 0 | 1 | 0 | 0 | 0 | 1 | 0 | 0 | 0 | 0 | 0 | 0 | 1 | 0 |
| 1 | 0 | 0 | 0 | 0 | 0 | 0 | 0 | 0 | 0 | 1 | 0 | 0 | 1 | 0 | 0 | 0 | 0 | 0 | 0 | 0 | 0 | 0 | 0 | 1 | 0 | 0 |
| 0 | 1 | 0 | 0 | 0 | 0 | 0 | 1 | 0 | 0 | 0 | 0 | 0 | 0 | 0 | 0 | 0 | 0 | 0 | 0 | 0 | 0 | 1 | 0 | 0 | 1 | 0 |
| 1 | 0 | 0 | 0 | 0 | 0 | 0 | 0 | 0 | 0 | 0 | 0 | 1 | 0 | 1 | 0 | 0 | 0 | 0 | 0 | 0 | 0 | 0 | 0 | 1 | 0 | 0 |
| 0 | 1 | 1 | 0 | 0 | 0 | 0 | 0 | 0 | 0 | 0 | 1 | 0 | 0 | 0 | 0 | 0 | 0 | 0 | 0 | 0 | 1 | 0 | 0 | 0 | 0 | 0 |
| 1 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 | 0 | 0 |
| 0 | 1 | 0 | 0 | 0 | 0 | 1 | 0 | 0 | 0 | 0 | 0 | 1 | 0 | 0 | 0 | 0 | 0 | 0 | 0 | 0 | 0 | 1 | 0 | 0 | 0 | 0 |
| 1 | 0 | 0 | 0 | 0 | 0 | 0 | 0 | 0 | 0 | 0 | 0 | 0 | 0 | 1 | 1 | 0 | 0 | 1 | 0 | 0 | 0 | 0 | 0 | 0 | 0 | 0 |
| 0 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 1 | 0 | 0 | 0 |
| 1 | 0 | 0 | 0 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 |
| 0 | 1 | 0 | 1 | 0 | 0 | 0 | 1 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 0 | 0 |
| 0 | 1 | 0 | 1 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 1 | 0 | 0 | 0 | 0 | 0 | 0 | 0 | 0 | 0 | 0 | 0 | 0 | 0 | 0 | 1 | 0 | 1 | 0 | 0 | 0 | 0 | 0 | 0 | 1 | 0 |
| 1 | 0 | 0 | 0 | 0 | 0 | 0 | 1 | 0 | 1 | 0 | 0 | 0 | 0 | 0 | 0 | 0 | 0 | 0 | 0 | 0 | 0 | 1 | 0 | 0 | 0 | 0 |
| 0 | 1 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 |

FIG. 19I

| | | | | | | | | | | | | | | | | | | | |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |

FIG. 19J

| | | | | | | | | | | | | | | | | | | | | |
|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 0 | 0 | 0 | 1 |

FIG. 20A

| | | |
|---|---|---|
| 20B | 20C | 20D |
| 20E | 20F | 20G |
| 20H | 20I | 20J |

FIG. 20B

| | | | | | | | | | | | | | | | | |
|---|---|---|---|---|---|---|---|---|---|---|---|---|---|---|---|---|
| 1 | 1 | 1 | 1 | 0 | 0 | 1 | 0 | 0 | 1 | 1 | 1 | 0 | 0 | 0 | 0 | 0 |
| 1 | 0 | 0 | 1 | 1 | 1 | 1 | 1 | 1 | 1 | 0 | 1 | 1 | 0 | 0 | 0 | 0 |
| 1 | 1 | 0 | 1 | 1 | 0 | 0 | 0 | 1 | 0 | 1 | 0 | 1 | 1 | 0 | 0 | 0 |
| 0 | 1 | 1 | 0 | 1 | 1 | 1 | 1 | 1 | 1 | 1 | 0 | 0 | 1 | 0 | 0 | 0 |
| 1 | 1 | 0 | 0 | 0 | 0 | 0 | 0 | 0 | 0 | 0 | 1 | 0 | 0 | 1 | 0 | 0 |
| 1 | 1 | 0 | 0 | 0 | 1 | 0 | 1 | 0 | 0 | 0 | 1 | 0 | 0 | 0 | 1 | 0 |
| 1 | 0 | 0 | 0 | 0 | 1 | 0 | 1 | 0 | 1 | 0 | 1 | 0 | 0 | 0 | 0 | 1 |

FIG. 20C

| | | | | | | | | | | | | | | | | |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |

FIG. 20D

| | | | | | | | | | | | | | | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |

FIG. 20E

| | | | | | | | | | | | | | | | | |
|---|---|---|---|---|---|---|---|---|---|---|---|---|---|---|---|---|
| 0 | 1 | 0 | 0 | 0 | 1 | 0 | 1 | 0 | 0 | 0 | 1 | 0 | 1 | 0 | 0 | 0 |
| 1 | 1 | 0 | 0 | 0 | 0 | 0 | 0 | 0 | 0 | 0 | 0 | 1 | 0 | 0 | 0 | 0 |
| 0 | 1 | 0 | 0 | 0 | 0 | 0 | 0 | 1 | 0 | 1 | 1 | 0 | 0 | 0 | 0 | 0 |
| 1 | 1 | 0 | 0 | 0 | 0 | 1 | 1 | 0 | 0 | 0 | 0 | 0 | 0 | 0 | 0 | 0 |
| 1 | 0 | 0 | 0 | 0 | 0 | 0 | 1 | 0 | 1 | 0 | 0 | 0 | 1 | 0 | 0 | 0 |
| 0 | 1 | 0 | 1 | 0 | 0 | 0 | 0 | 0 | 0 | 0 | 1 | 0 | 0 | 0 | 0 | 0 |
| 1 | 1 | 0 | 0 | 0 | 0 | 0 | 0 | 1 | 0 | 0 | 0 | 0 | 1 | 0 | 0 | 0 |
| 0 | 1 | 0 | 0 | 0 | 0 | 1 | 0 | 0 | 0 | 0 | 1 | 0 | 1 | 0 | 0 | 0 |
| 1 | 0 | 0 | 0 | 0 | 0 | 0 | 0 | 0 | 0 | 1 | 1 | 0 | 0 | 0 | 0 | 0 |
| 0 | 1 | 0 | 0 | 0 | 0 | 0 | 0 | 0 | 1 | 0 | 1 | 1 | 0 | 0 | 0 | 0 |
| 0 | 1 | 0 | 0 | 0 | 1 | 0 | 0 | 0 | 0 | 0 | 1 | 1 | 0 | 0 | 0 | 0 |
| 1 | 0 | 0 | 0 | 0 | 0 | 1 | 1 | 0 | 0 | 0 | 0 | 0 | 0 | 0 | 0 | 0 |
| 1 | 1 | 0 | 0 | 0 | 0 | 0 | 0 | 0 | 0 | 1 | 0 | 0 | 0 | 0 | 0 | 0 |
| 0 | 1 | 0 | 0 | 1 | 0 | 0 | 0 | 0 | 0 | 0 | 1 | 0 | 0 | 0 | 0 | 0 |
| 1 | 0 | 0 | 0 | 0 | 0 | 0 | 0 | 1 | 0 | 0 | 0 | 0 | 1 | 0 | 0 | 0 |
| 0 | 1 | 1 | 0 | 0 | 0 | 0 | 0 | 0 | 0 | 0 | 0 | 0 | 0 | 0 | 0 | 0 |
| 1 | 0 | 0 | 1 | 0 | 1 | 0 | 0 | 0 | 0 | 0 | 0 | 0 | 0 | 0 | 0 | 0 |

FIG. 20F

| | | | | | | | | | | | | | | | | |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 1 |

FIG. 20G

| | | | | | | | | | | | | | | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |

FIG. 20H

| | | | | | | | | | | | | | | | | |
|---|---|---|---|---|---|---|---|---|---|---|---|---|---|---|---|---|
| 0 | 1 | 1 | 0 | 0 | 0 | 0 | 0 | 0 | 1 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 |
| 0 | 0 | 1 | 0 | 0 | 0 | 0 | 1 | 0 | 0 | 0 | 0 | 1 | 1 | 0 | 0 | 0 |
| 1 | 0 | 0 | 0 | 0 | 0 | 1 | 0 | 0 | 0 | 0 | 0 | 0 | 0 | 0 | 0 | 0 |
| 0 | 1 | 1 | 0 | 0 | 1 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 |
| 0 | 0 | 1 | 0 | 0 | 1 | 0 | 1 | 0 | 1 | 0 | 0 | 0 | 0 | 0 | 0 | 0 |
| 0 | 1 | 0 | 0 | 0 | 0 | 0 | 0 | 0 | 0 | 0 | 0 | 0 | 1 | 0 | 0 | 0 |
| 1 | 0 | 0 | 0 | 0 | 1 | 0 | 0 | 0 | 0 | 0 | 0 | 1 | 0 | 0 | 0 | 0 |
| 0 | 0 | 1 | 0 | 0 | 0 | 0 | 1 | 0 | 0 | 1 | 0 | 0 | 0 | 0 | 0 | 0 |
| 1 | 0 | 0 | 0 | 0 | 0 | 0 | 0 | 0 | 0 | 0 | 0 | 1 | 1 | 0 | 0 | 0 |
| 0 | 1 | 0 | 0 | 0 | 1 | 0 | 0 | 0 | 0 | 0 | 1 | 0 | 0 | 0 | 0 | 0 |
| 1 | 0 | 1 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 1 | 0 | 0 | 0 |
| 0 | 1 | 0 | 0 | 0 | 1 | 0 | 0 | 0 | 0 | 0 | 1 | 0 | 0 | 0 | 0 | 0 |
| 1 | 0 | 0 | 0 | 0 | 0 | 0 | 1 | 0 | 0 | 0 | 0 | 1 | 0 | 0 | 0 | 0 |
| 0 | 0 | 1 | 0 | 0 | 0 | 0 | 0 | 0 | 0 | 1 | 0 | 0 | 1 | 0 | 0 | 0 |
| 0 | 1 | 0 | 0 | 0 | 1 | 0 | 0 | 0 | 0 | 0 | 1 | 0 | 0 | 0 | 0 | 0 |

FIG. 20I

| | | | | | | | | | | | | | | | | |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 |

FIG. 20J

| | | | | | | | | | | | | | | | | | |
|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 1 |

(a) (b)

METHOD AND APPARATUS FOR ENCODING/DECODING CHANNEL IN COMMUNICATION OR BROADCASTING SYSTEM

CROSS-REFERENCE TO RELATED APPLICATION(S)

This application is a continuation application of prior application Ser. No. 17/582,300 filed on Jan. 24, 2022, which will be issued as U.S. Pat. No. 11,646,818 on May 9, 2023; which is a continuation application of prior application Ser. No. 16/629,116 filed on Jan. 7, 2020, which has issued as U.S. Pat. No. 11,258,536 on Feb. 22, 2022; which is a U.S. National Stage application under 35 U.S.C. § 371 of an International application number PCT/KR2018/009194, filed on Aug. 10, 2018, which is based on and claims priority of a Korean patent application number 10-2017-0101935, filed on Aug. 10, 2017, in the Korean Intellectual Property Office, and of a Korean patent application number 10-2017-0110504, filed on Aug. 30, 2017, in the Korean Intellectual Property Office, the disclosure of each of which is incorporated by reference herein in its entirety.

TECHNICAL FIELD

The disclosure relates to a method and an apparatus for encoding/decoding a channel in a communication or broadcasting system.

BACKGROUND ART

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a communication or broadcasting system, the performance of a link may be noticeably degraded by various channel noises, a fading phenomenon, and inter-symbol interference (ISI). Accordingly, in order to implement high-speed digital communication or broadcasting systems requiring a large amount of data processing and a high level of reliability, such as next-generation mobile communication, digital broadcasting, and portable Internet, it is required to develop a technology for overcoming the noise, fading, and ISI. As a part of research for overcoming the noise and the like, there has recently been active research on an error-correcting code, as a method for improving the reliability of communication by efficiently restoring distortion of information.

DETAILED DESCRIPTION OF INVENTION

Technical Problem

The disclosure provides a method and an apparatus for encoding/decoding an LDPC capable of supporting various input lengths and code rates.

The disclosure provides a method and an apparatus for encoding/decoding an LDPC code suitable for a case having a short information word length of approximately 100 bits and having a fixed code rate.

Solution to Problem

The disclosure proposes a method for designing an LDPC code capable of supporting various lengths and code rates by simultaneously considering a lifting method and trapping set characteristics.

The disclosure proposes a method for designing a dedicated LDPC code suitable for a case having a small information bit number and having a fixed code rate.

In accordance with an aspect of the disclosure, a method for encoding a channel by a transmitting device includes: determining a code rate (R) indicated by a modulation and coding scheme (MCS) index; determining a transport block size; and determining one of a first base matrix or a second base matrix as a base matrix, based on the transport block size and the code rate.

In accordance with another aspect of the disclosure, a method for decoding a channel by a receiving device includes: determining a code rate (R) indicated by a modulation and coding scheme (MCS) index; determining a transport block size; and determining one of a first base matrix or a second base matrix as a base matrix, based on the transport block size and the code rate.

In accordance with another aspect of the disclosure, an apparatus for encoding a channel in a communication or broadcasting system includes: a transmitter/receiver; and a controller configured to determine a code rate (R) indicated by a modulation and coding scheme (MCS) index, to determine a transport block size, and to determine one of a first base matrix or a second base matrix as a base matrix, based on the transport block size and the code rate.

In accordance with another aspect of the disclosure, an apparatus for decoding a channel in a communication or broadcasting system includes: a transmitter/receiver; and a controller configured to determine a code rate (R) indicated by a modulation and coding scheme (MCS) index, to determine a transport block size, and to determine one of a first base matrix or a second base matrix as a base matrix, based on the transport block size and the code rate.

Advantageous Effects of Invention

The disclosure can support an LDPC code with regard to a variable length and a variable rate.

BRIEF DESCRIPTION OF DRAWINGS

FIG. 19A, FIG. 19B, FIG. 19C, FIG. 19D, FIG. 19E, FIG. 19F, FIG. 19G, FIG. 19H, FIG. 19I, and FIG. 19J are diagrams illustrating an exemplary LDPC code base matrix according to an embodiment of the disclosure.

FIG. 20A, FIG. 20B, FIG. 20C, FIG. 20D, FIG. 20E, FIG. 20F, FIG. 20G, FIG. 20H, FIG. 20I, and FIG. 20J are diagrams illustrating an exemplary LDPC code base matrix according to an embodiment of the disclosure.

MODE FOR THE INVENTION

Figure 1:
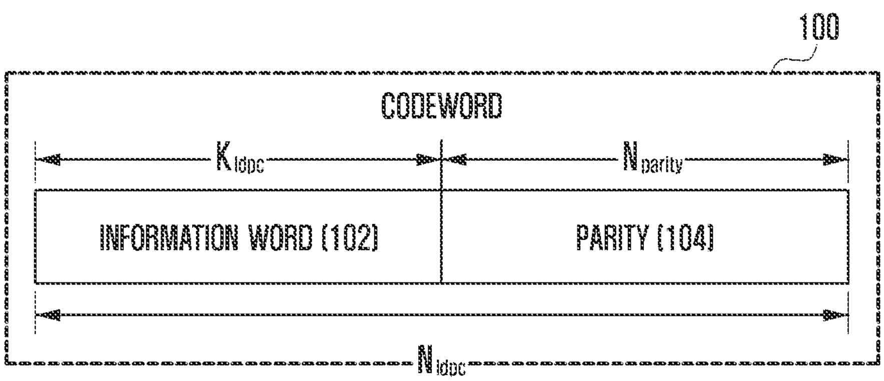
FIG. 1 is a diagram illustrating the structure of a systematic LDPC codeword.

Hereinafter, exemplary embodiments of the disclosure will be described in detail with reference to the accompanying drawings. Further, in the following description of the disclosure, a detailed description of known functions and configurations incorporated herein will be omitted when it may make the subject matter of the disclosure rather unclear. The terms which will be described below are terms defined in consideration of the functions in the disclosure, and may be different according to users, intentions of the users, or customs. Therefore, the definitions of the terms should be made based on the contents throughout the specification.

The major gist of the disclosure is applicable to other systems having similar technical backgrounds through a minor modification, without substantially deviating from the scope of the disclosure, and this could be possible based on a determination by a person skilled in the art to which the disclosure pertains.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

A low density parity check (hereinafter, referred to as LDPC) code has been initially introduced by Gallager in 1960s, but has long been forgotten due to the degree of complexity that was difficult to implement at the technical level at that time. However, Berrou, Glavieux, and Thitimajshima proposed in 1993 a turbo code, which exhibited a performance close to the Shannon channel capacity. Accordingly, there has been extensive analysis regarding the performance and characteristics of the turbo code, and there has been extensive study on channel encoding based on iterative decoding and graphs. As a result thereof, the LDPC code has been restudied in the late 1990s, and it has been discovered that, if iterative decoding based on a sum-product algorithm is applied to perform decoding on a Tanner graph corresponding to the LDPC code, the LDPC code also comes to have a performance close to the Shannon channel capacity.

The LDPC code is normally defined as a parity-check matrix, and may be expressed by using a bipartite graph commonly referred to as a Tanner graph.

FIG. 1 is a diagram illustrating the structure of a systematic LDPC codeword.

According to FIG. 1, in connection with the LDPC code, an information word 102 including $K_{ldpc}$ bits or symbols is received as an input and is subjected to LDPC encoding such that a codeword 100 including $N_{ldpc}$ bits or symbols is generated. It will be assumed in the following, for convenience of description, that an information word 102 including $K_{ldpc}$ bits is received as an input, and a codeword 100 including $N_{ldpc}$ bits is generated. That is, if an information word $I=[i_0, i_1, i_2, \ldots, i_{K_{ldpc}-1}]$ 102 including $K_{ldpc}$ input bits is subjected to LDPC encoding, a codeword $c=[c_0, c_1, c_2, \ldots, c_{N_{ldpc}-1}]$ 100 is generated. That is, the information word and the codeword are bit strings including multiple bits, and information word bits and codeword bits refer to bits constituting the information word and the codeword, respectively. In general, if a codeword includes an information word such as $c=[c_0, c_1, c_2, \ldots, c_{N_{ldpc}-1}]=I=[i_0, i_1, i_2, \ldots, i_{K_{ldpc}-1}, p_0, p_1, p_2, \ldots, p_{K_{ldpc}-K_{ldpc}-1}]$, the same is referred to as a systematic code. In this regard, $P=[p_0, p_1, p_2, \ldots, p_{K_{ldpc}-K_{ldpc}-1}]$ may be parity bits 104, and the number $N_{parity}$ of parity bits may be $N_{parity}=N_{ldpc}-K_{ldpc}$.

The LDPC code is a kind of linear block code, and includes a process of determining a codeword satisfying a condition as given in Equation 1 below:

Equation 1

$$H \cdot c^T = \begin{bmatrix} h_1 & h_2 & h_3 & \ldots & h_{N_{ldpc}-1} \end{bmatrix} \cdot c^T = \sum_{i=0}^{N_{ldpc}} c_i \cdot h_i = 0$$

wherein $c = [c_0, c_1, c_2, \ldots, c_{N_{ldpc}-1}]$.

In Equation 1, H refers to a parity-check matrix, C refers to a codeword, $c_i$ refers to the $i^{th}$ bit of the codeword, and $N_{ldpc}$ refers to the length of the LDPC codeword. In addition, $h_i$ refers to the $i^{th}$ column of the parity-check matrix H.

The parity-check matrix H includes $N_{ldpc}$ columns, $N_{ldpc}$ being identical to the number of bits of the LDPC codeword. Equation 1 means that the sum of the product of the $i^{th}$ column $h_i$ of the parity-check matrix and the $i^{th}$ codeword bit $c_i$ becomes "0", and thus means that the $i^{th}$ column $h_i$ is related to the $i^{th}$ codeword bit $c_i$.

A method for expressing the LDPC code by a graph will be described with reference to FIG. 2.

Figure 2:
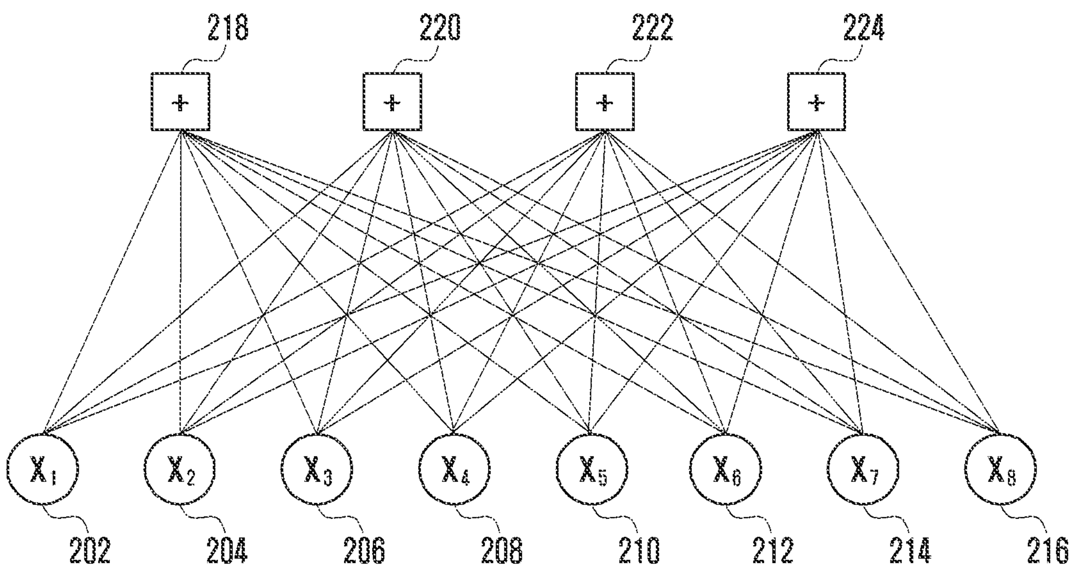
FIG. 2 is a diagram illustrating a method for graph expression of an LDPC code.
Figure 3A:
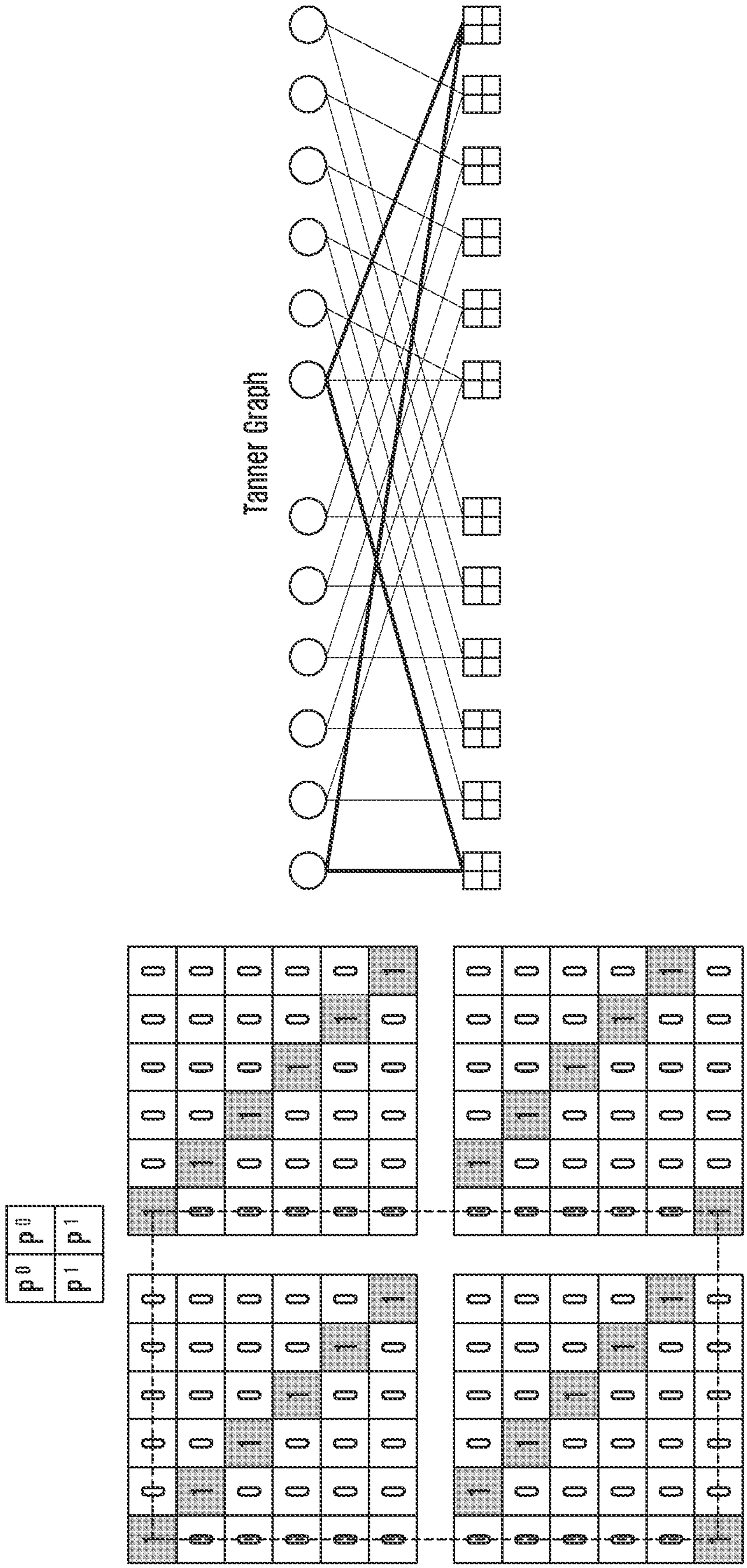
FIG. 3A and FIG. 3B are exemplary diagrams illustrating cycle characteristics of an QC-LDPC code.
Figure 3B:
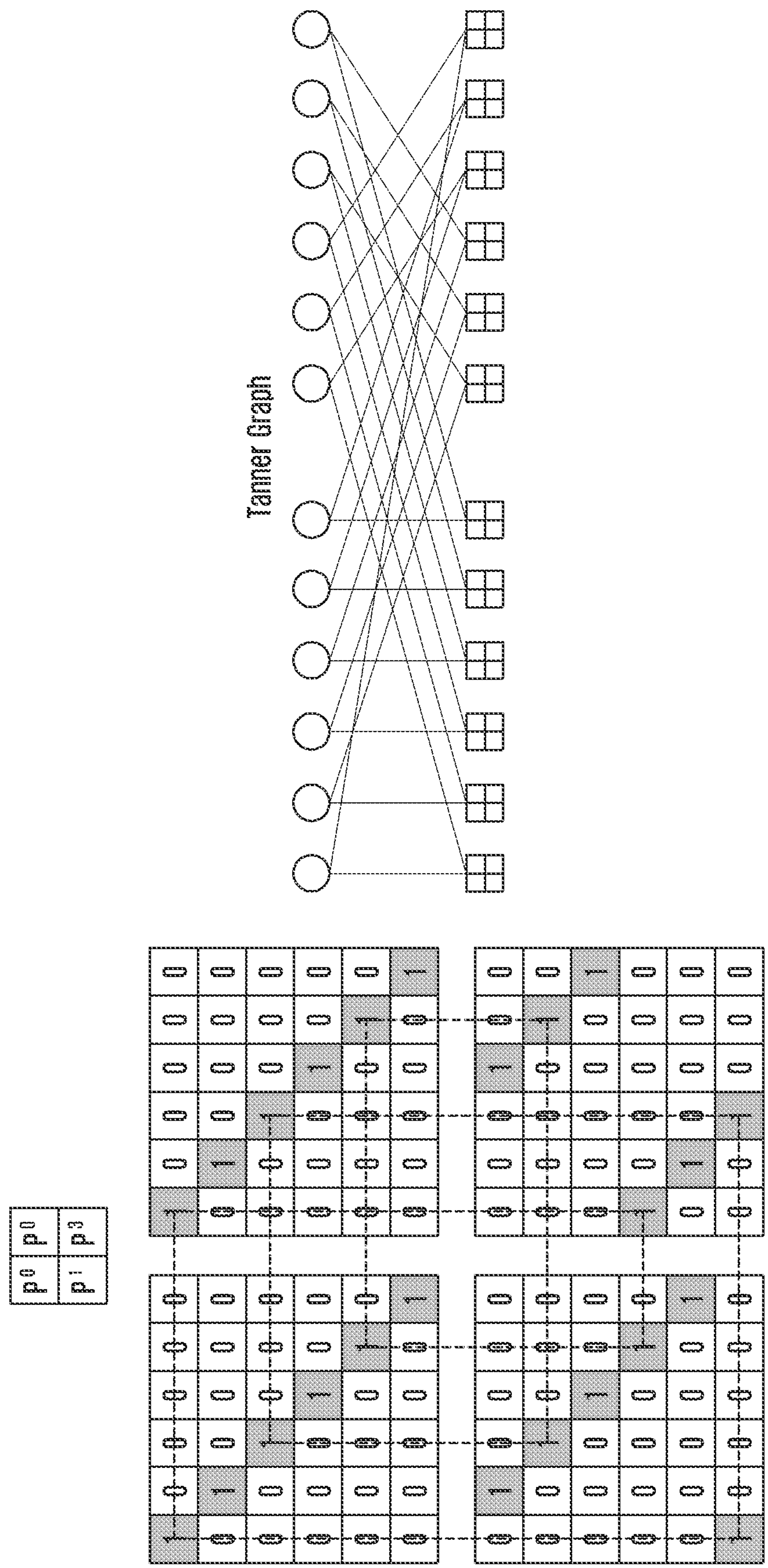

FIG. 2 is a diagram illustrating an example of a parity-check matrix $H_1$ of an LDPC code including four rows and eight columns, and a Tanner graph corresponding thereto. Referring to FIG. 2, since the parity-check matrix $H_1$ has eight columns, a codeword having a length of 8 is generated. A code generated through H1 refers to an LDPC code, and respective columns correspond to encoded eight bits.

Referring to FIG. 2, the Tanner graph of the LDPC code that encodes and decodes based on the parity-check matrix $H_1$ includes eight variable nodes, that is, $x_1$ 202, $x_2$ 204, $x_3$ 206, $x_4$208, $x_5$210, $x_6$ 212, $x_7$ 214, and $x_8$ 216, and four check nodes 218, 220, 222, and 224. In this regard, the $i^{th}$ column and the $j^{th}$ row of the parity-check matrix $H_1$ of the LDPC code correspond to variable node $x_i$ and $j^{th}$ check node, respectively. In addition, the value of 1 at the point of intersection between the $j^{th}$ column and the $j^{th}$ row of the parity-check matrix $H_1$ of the LDPC code, that is, a non-zero value, means that there exists an edge connecting the variable node $x_i$ and $j^{th}$ check node on the Tanner graph as in FIG. 2.

In the Tanner graph of the LDPC code, the degree of a variable node and a check node refers to the number of edges connected to respective nodes, and is identical to the number of non-zero entries in the column or row corresponding to the corresponding node in the parity-check matrix of the LDPC code. For example, the degree of each of the variable nodes $x_1$ 202, $x_2$ 204, $x_3$ 206, $x_4$ 208, $x_5$ 210, $x_6$ 212, $x_7$ 214, and $x_8$ 216 in FIG. 2 is successively 4, 3, 3, 3, 2, 2, 2, 2, and the degree of each of the check nodes 218, 220, 222, and 224 is successively 6, 5, 5, 5. In addition, the number of non-zero entries in respective columns of the parity-check matrix $H_1$ in FIG. 2, corresponding to the variable nodes in FIG. 2, is identical to the series of above-mentioned degrees 4, 3, 3, 3, 2, 2, 2, 2, and the number of non-zero entries in respective rows of the parity-check matrix $H_1$ in FIG. 2, corresponding to the check nodes in FIG. 2, is to the series of above-mentioned degrees 6, 5, 5, 5.

The LDPC code may be subjected to iterative decoding by using an iterative decoding algorithm based on a sum-product algorithm on the bipartite graphs enumerated in FIG. 2. As used herein, the sum-product algorithm is a kind of message passing algorithm, and the message passing algorithm refers to an algorithm configured to exchange messages through an edge on a bipartite graph, to calculate an output message from messages inputted to a variable node or a check node, and to update the same.

In this regard, the value of $i^{th}$ encoding bit may be determined based on the message of the $i^{th}$ variable node. Either hard decision or soft decision is possible with regard to the value of the $i^{th}$ encoding bit. Therefore, the performance of $i^{th}$ bit of the LDPC codeword, that is, $c_i$, corresponds to the performance of the $i^{th}$ variable node on the Tanner graph, and this may be determined according to the position and number of is in the $i^{th}$ column of the parity-check matrix. In other words, the performance of $N_{ldpc}$ codeword bits of the codeword may depend on the position and number of is of the parity-check matrix, and this means that the performance of the LDPC code is heavily influenced by the parity-check matrix. Therefore, a method for designing a good parity-check matrix is necessary to design an LDPC code having an excellent performance.

As a parity-check matrix used in a communication or broadcasting system, a quasi-cyclic LDPC code (or QC-LDPC code; hereinafter, referred to as QC-LDPC code) that normally uses a quasi-cyclic type parity-check matrix for ease of implantation is most commonly used.

The QC-LDPC code is characterized in that the same has a parity-check matrix including a zero matrix having the form of a small square matrix, or circulant permutation matrices. As used herein, a permutation matrix refers to a square matrix configured such that every entry thereof is 0 or 1, and each row or column includes only one 1. In addition, the circulant permutation matrix refers to a matrix obtained by circularly shifting respective entries of an identify matrix rightwards.

The QC-LDPC code will now be described in detail.

Firstly, a circulant permutation matrix $P=(P_{i,j})$ having a size of L×L is defined as in Equation 2. In this regard, $P_{i,j}$ refers to the entry in the $i^{th}$ row and $j^{th}$ column of the matrix P (wherein $0 \le i, j < L$).

$$P_{i,j} = \begin{cases} 1 & \text{if } i+1 \equiv j \bmod L \\ 0 & \text{otherwise} \end{cases}. \qquad \text{Equation 2}$$

It can be understood that, with regard to the permutation matrix P defined as above, $P^i$ $(0 \le i < L)$ is a circulant permutation matrix obtained by circularly shifting respective entries of an identify matrix having a size of L×L in the rightward direction i times.

The parity-check matrix H of the simplest QC-LDPC code can be defined as in Equation 3 below:

$$H = \begin{bmatrix} P^{a_{11}} & P^{a_{12}} & \dots & P^{a_{1n}} \\ P^{a_{21}} & P^{a_{22}} & \dots & P^{a_{2n}} \\ \vdots & \vdots & \ddots & \vdots \\ P^{a_{m1}} & P^{a_{m2}} & \dots & P^{a_{mn}} \end{bmatrix} \qquad \text{Equation 3}$$

If $P^{-1}$ is defined as a 0-matrix having a size of L×L, each index $a_{i,j}$ of the circulant permutation matrix or 0-matrix in Equation 3 above has a value selected from {−1, 0, 1, 2, . . . , L−1}. In addition, it can be understood that the parity-check matrix H of Equation 3 above has n column blocks and m row blocks, and thus has a size of mL×nL.

It would be obvious that, if the parity-check matrix of Equation 3 above has a full rank, the size of the information word bit of the QC-LDPC code corresponding to the parity-check matrix is (n−m)L. For convenience of description, (n−m) column blocks corresponding to information word bits will be referred to as information word column blocks, and m column blocks corresponding to the remaining parity bits will be referred to as parity column blocks (for convenience of description, the value of L is also referred to as a block size.)

In general, a binary matrix having a size of m×n obtained by replacing each circulant permutation matrix and 0-matrix in the parity-check matrix of Equation 3 above with 1 and 0, respectively, is referred to as a mother matrix or base matrix M(H) of the parity-check matrix H, and an integer matrix having a size of m×n obtained by selecting the index of each circulant permutation matrix or 0-matrix, as defined in Equation 4 below, is referred to as an exponent matrix E(H) of the parity-check matrix H.

$$E(H) = \begin{bmatrix} a_{11} & a_{12} & \dots & a_{1n} \\ a_{21} & a_{22} & \dots & a_{2n} \\ \vdots & \vdots & \ddots & \vdots \\ a_{m1} & a_{m2} & \dots & a_{mn} \end{bmatrix} \qquad \text{Equation 4}$$

Consequently, one integer included in the exponent matrix corresponds to a circulant permutation matrix in the parity-check matrix, and the exponent matrix may also be expressed as sequences including integers, for convenience of description (the sequences may also be referred to as LDPC sequences or LDPC code sequences to be distinguished from other sequences.) In general, a parity-check matrix can be expressed not only as an exponent matrix, but also as a sequence having the same algebraic characteristics. Although the parity-check matrix is expressed in the disclosure as an exponent matrix or a sequence indicating the position of 1 in the parity-check matrix, for example, there are various methods for describing sequences such that the position of 1 or 0 included in the parity-check matrix can be identified. Accordingly, the method of expression is not limited to those described herein, and the same may be expressed as various sequences having the same algebraic effect.

In addition, although it is possible to perform LDPC encoding and decoding by directly generating a parity-check matrix by the transmitting/receiving device on the apparatus, LDPC encoding and decoding can also be performed by using an exponent matrix or sequence having the same algebraic effect as the parity-check matrix, according to implementation-related characteristics. Therefore, it is to be noted that, although encoding and decoding based on a parity-check matrix are described in the disclosure for convenience of description, the same can be implemented by various methods that can exhibit the same effect as the parity-check matrix. For this reason, the exponent matrix or LDPC sequence may also be referred to as a parity-check matrix for convenience of description.

For reference, the same algebraic effect, as used herein, means that, with regard to at least two different expressions, it can be described or converted that they are completely identical to each other logically or mathematically.

Although it is assumed in the description of the disclosure that only one circulant permutation matrix corresponds to one block for convenience of description, the same disclosure is applicable to a case in which multiple circulant permutation matrices are included in one block. For example, if the sum of two circulant permutation matrices $P^{a_{ij}^{(1)}}$, $P^{a_{ij}^{(2)}}$ is included in the position of one $i^{th}$ row block and $j^{th}$ column block as in Equation 5 below, the exponent matrix thereof may be expressed as in Equation 6 below. It can be understood from Equation 6 that the matrix has two integers corresponding to the $i^{th}$ row and $j^{th}$ column, corresponding to the row block and column block including the sum of the multiple circulant permutation matrices.

$$H = \begin{bmatrix} \ddots & \square & \square & \iddots \\ \square & P^{a_{ij}^{(1)}} + P^{a_{ij}^{(2)}} & \square & \square \\ \square & & \square & \square \\ \iddots & \square & \square & \ddots \end{bmatrix} \quad \text{Equation 5}$$

$$E(H) = \begin{bmatrix} \ddots & \square & \square & \iddots \\ \square & \left(a_{ij}^{(1)}, a_{ij}^{(2)}\right) & \square & \square \\ \square & & \square & \square \\ \iddots & \square & \square & \ddots \end{bmatrix} \quad \text{Equation 6}$$

As in the above embodiment, a QC-LDPC code may normally have multiple circulant permutation matrices corresponding to a single row block and a single column block in a parity-check matrix. Although it will be assumed in the description of the disclosure that one circulant permutation matrix corresponds to one block for convenience of description, the gist of the disclosure is not limited thereto. For reference, a matrix having a size of L×L configured such that multiple circulant permutation matrices overlap a single row block and a single column block in this manner is referred to as a circulant matrix or a circulant.

Meanwhile, the mother matrix or base matrix regarding the parity-check matrix and exponent matrix in Equation 5 and Equation 6 above refers to a binary matrix obtained by replacing each circulant permutation matrix and 0-matrix with 1 and 0, respectively, similarly to the definition used in Equation 3 above. The sum of multiple circulant permutation matrices included in one block (that is, circulant matrix) is also simply replaced with 1.

Since the performance of the LDPC code is determined by the parity-check matrix, it is necessary to design the parity-check matrix for an LDPC code having an excellent performance. In addition, a method for LDPC encoding or decoding capable of supporting various input lengths and code rates is also necessary.

Lifting refers to a method used not only to efficiently design the QC-LDPC code, but also to generate a parity-check matrix having various lengths from a given exponent matrix or to generate an LDPC codeword therefrom. That is, the lifting refers to a method applied to efficiently design a very large parity-check matrix by configuring an L value that determines the size of a circulant permutation matrix or 0-matrix from a given small mother matrix according to a specific rule, or to generate a parity-check matrix having various lengths or to generate an LDPC codeword by applying an L value suitable for the given exponent matrix or a sequence corresponding thereto.

An existing lifting method and characteristics of a QC-LDPC code designed through such lifting will now be described briefly with reference to the following reference document [Myung2006]:

Reference [Myung2006]

S. Myung, K. Yang, and Y. Kim, "Lifting Methods for Quasi-Cyclic LDPC Codes," IEEE Communications Letters. vol. 10, pp. 489-491, June 2006.

Firstly, it will be assumed that, if an LDPC code C0 is given, as many as S QC-LDPC codes to be designed by the lifting method are $C_1, \ldots, C_S$, and a value corresponding to the size of row blocks and column blocks of the parity-check matrix of each QC-LDPC code is $L_k$. In this regard, $C_0$ corresponds to the smallest LDPC code having the mother matrix of codes $C_1, \ldots, C_S$ as a parity-check matrix, and the Lo value corresponding to the size of row blocks and column blocks is 1. For convenience of description, the parity-check matrix $H_k$ of each code $C_k$ has an exponent matrix $E(H_k)=(e_{i,j}^{(k)})$ having a size of m×n, and respective indices $e_{i,j}^{(k)}$ are selected as one from the values of $\{-1, 0, 1, 2, \ldots, L_k-1\}$.

The existing lifting method proceeds in steps such as $C_0 \rightarrow C_1 \rightarrow \ldots \rightarrow C_S$, and is characterized in that the same satisfies a condition such as $L_{k+1}=q_{k+1}L_k$ ($q_{k+1}$ is a positive integer, k=0, 1, . . . , S−1). In addition, as long as the parity-check matrix $H_S$ is stored according to the characteristics of the lifting process, all of the QC-LDPC codes $C_0, C_1, \ldots, C_S$ can be expressed by using Equation 7 below according to the lifting scheme:

$$E(H_k) \equiv \left\lfloor \frac{L_k}{L_S} E(H_S) \right\rfloor \quad \text{Equation 7}$$

or $$E(H_k) \equiv E(H_S) \bmod L_k \quad \text{Equation 8}$$

As such, not only the method for designing larger QC-LDPC codes $C_1, \ldots, C_S$ and the like from $C_0$, but also the method for generating small codes $C_i$ (i=k−1, k−2, . . . 1, 0) from a large code $C_k$ by using an appropriate method as in Equation 7 or Equation 8, is referred to as lifting.

According to the lifting scheme defined by Equation 7 or Equation 8, $L_k$ corresponding to the size of row blocks or column blocks in the parity-check matrix of each QC-LDPC code $C_k$ has a multiple relation with each other, and the exponent matrix is also determined by a specific scheme. Such an existing lifting scheme improves the algebraic or graph characteristics of each parity-check matrix designed based on lifting, and thus facilitates designing of a QC-LDPC code having improved error floor characteristics.

However, the existing lifting scheme has a shortcoming in that, since respective $L_k$ values have a multiple relation with each other, the length of each code is heavily limited. For example, assuming that a minimum listing scheme such as $L_{k+1}=2*L_k$ is applied to each $L_k$ value, the size of the parity-check matrix of each QC-LDPC code in this case may have a size of $2^k m\times 2^k n$. That is, if ten steps of lifting are applied (S=10), a total of ten sizes of the parity-check matrix can be generated, and this means that a QC-LDPC code having ten kinds of lengths can be supported.

For such a reason, the existing lifting scheme has somewhat disadvantageous characteristics in connection with designing a QC-LDPC code supporting various lengths. However, commonly used communication systems require a very high level of length compatibility in view of various types of data transmission. For this reason, the LDPC encoding technique based on the existing lifting scheme has a problem in that it is difficult to apply the same to a communication system.

Figure 4:
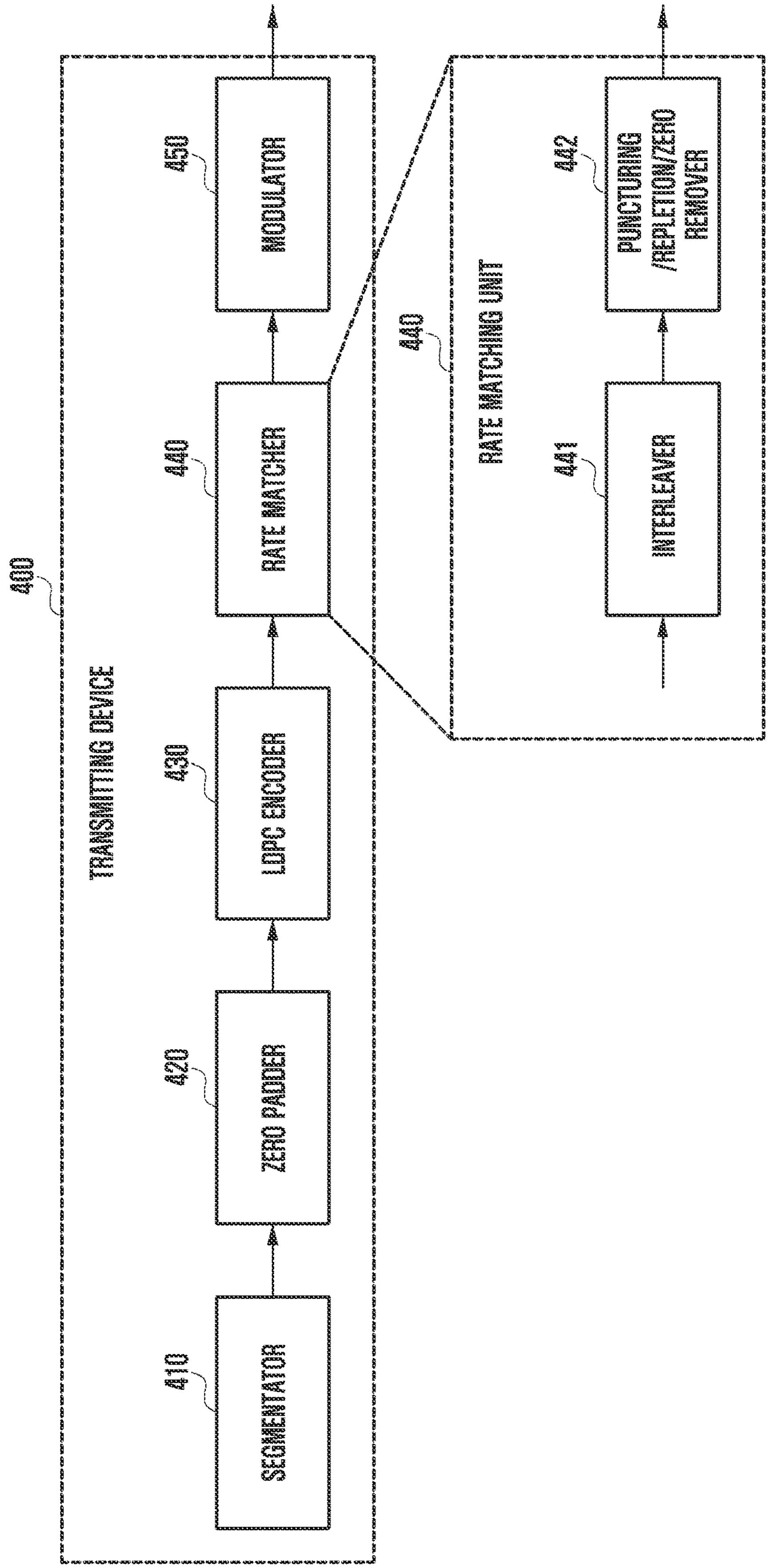
FIG. 4 is a block diagram illustrating the configuration of a transmitting device according to an embodiment of the disclosure.

In order to solve the above problem, the disclosure employs the following lifting method:

In general, it can also be considered in connection with lifting that the exponent matrix in FIG. 4 is used for LDPC encoding and decoding after changing values of the entries thereof with regard to various L values. For example, assuming that the exponent matrix in FIG. 4 is $E=(a_{i,j})$, and the exponent matrix changed according to the L value is $E_L=(a_{i,j}^{(L)})$, a conversion formula as defined in Equation 9 below may normally be applied:

$$a_{i,j}^{(L)} = \begin{cases} a_{i,j} & a_{i,j} < 0 \\ f(a_{i,j}, L) & a_{i,j} \geq 0 \end{cases} \quad \text{Equation 9}$$

or $$a_{i,j}^{(L)} = \begin{cases} a_{i,j} & a_{i,j} \leq 0 \\ f(a_{i,j}, L) & a_{i,j} > 0 \end{cases}$$

In Equation 9 above, f(x,L) may be defined in various types and, for example, f(x, L)=x (mod L) may be simply applied based on a modulo operation. It is also possible to define and use various functions as in Equation 10 below:

$$f(x, L) = \mathrm{mod}\left(x, 2^{\lfloor log_2 L \rfloor}\right) \quad \text{Equation 10}$$

or $$f(x, L) = \left\lfloor \frac{x}{2^{D-\lfloor log_2 L \rfloor}} \right\rfloor$$

or $$f(x, L) = \left\lfloor \frac{L}{D} x \right\rfloor$$

In Equation 10 above, mod(a,b) refers to a modulo-b operation regarding a, and D refers to a constant which is a predefined positive integer.

For reference, although it has been assumed in the conversion formula of Equation 9 above that the reference for applying conversion formula f is 0 for convenience of description, the reference value may be differently configured according to the block size L value to be supported.

FIG. 4 is a block diagram illustrating the configuration of a transmitting device according to an embodiment of the disclosure.

Specifically, as illustrated in FIG. 4, the transmitting device 400 may include, in order to process variable-length input bits, a segmentator 410, a zero padder 420, an LDPC encoder 430, a rate matcher 440, a modulator 450, and the like. The rate matcher 440 may include an interleaver 441, a puncturing/repetition/zero remover 442, and the like.

The constituent elements illustrated in FIG. 4 are only exemplary constituent elements for performing encoding and modulation with regard to variable-length input bits. If necessary, some of the constituent elements illustrated in FIG. 4 may be omitted or modified, and other constituent elements may be added.

Meanwhile, the transmitting device 400 may determine necessary parameters (for example, the input bit length, the modulation and code rate (MOdCod), a parameter for zero padding (or shortening), the code rate/codeword length of the LDPC code, a parameter for interleaving, a parameter for repetition, puncturing, and the like, the modulation scheme, and the like), may conduct encoding based on the determined parameters, and may transmit the result of encoding to the receiving device 500.

Given that the number of input bits is variable, the input bits may be segmented so as to have a length equal to or smaller than a preconfigured value if the number of input bits is larger than the preconfigured value. In addition, each segmented block may correspond to one LDPC-coded block. If the number of input bits is smaller than or equal to the preconfigured value, the input bits do not undergo segmentation. The input bits may correspond to one LDPC-coded block.

Meanwhile, the transmitting device 400 may have various parameters used for encoding, interleaving, and modulation prestored therein. As used herein, the parameter used for encoding may be the code rate of the LDPC code, the length of the codeword, and information regarding the parity-check matrix. The parameter used for interleaving may be information regarding an interleaving rule, and the parameter used for modulation may be information regarding the modulation scheme. The information regarding puncturing may be the puncturing length. Information regarding repetition may be the repetition length. The information regarding the parity-check matrix may store the index value of the circulant matrix if the parity matrix proposed in the disclosure is used.

In this case, respective constituent elements constituting the transmitting device 400 may perform operations by using such parameters.

Although not illustrated, the transmitting device 400 may further include, if necessary, a controller (not illustrated) for controlling the operation of the transmitting device 400. Accordingly, the operation of the transmitting device described above and the operation of the transmitting device described in the disclosure may be controlled by the controller, and the controller according to the disclosure may be defined as a circuit, an application-specific integrated circuit, or at least one processor.

Figure 5:
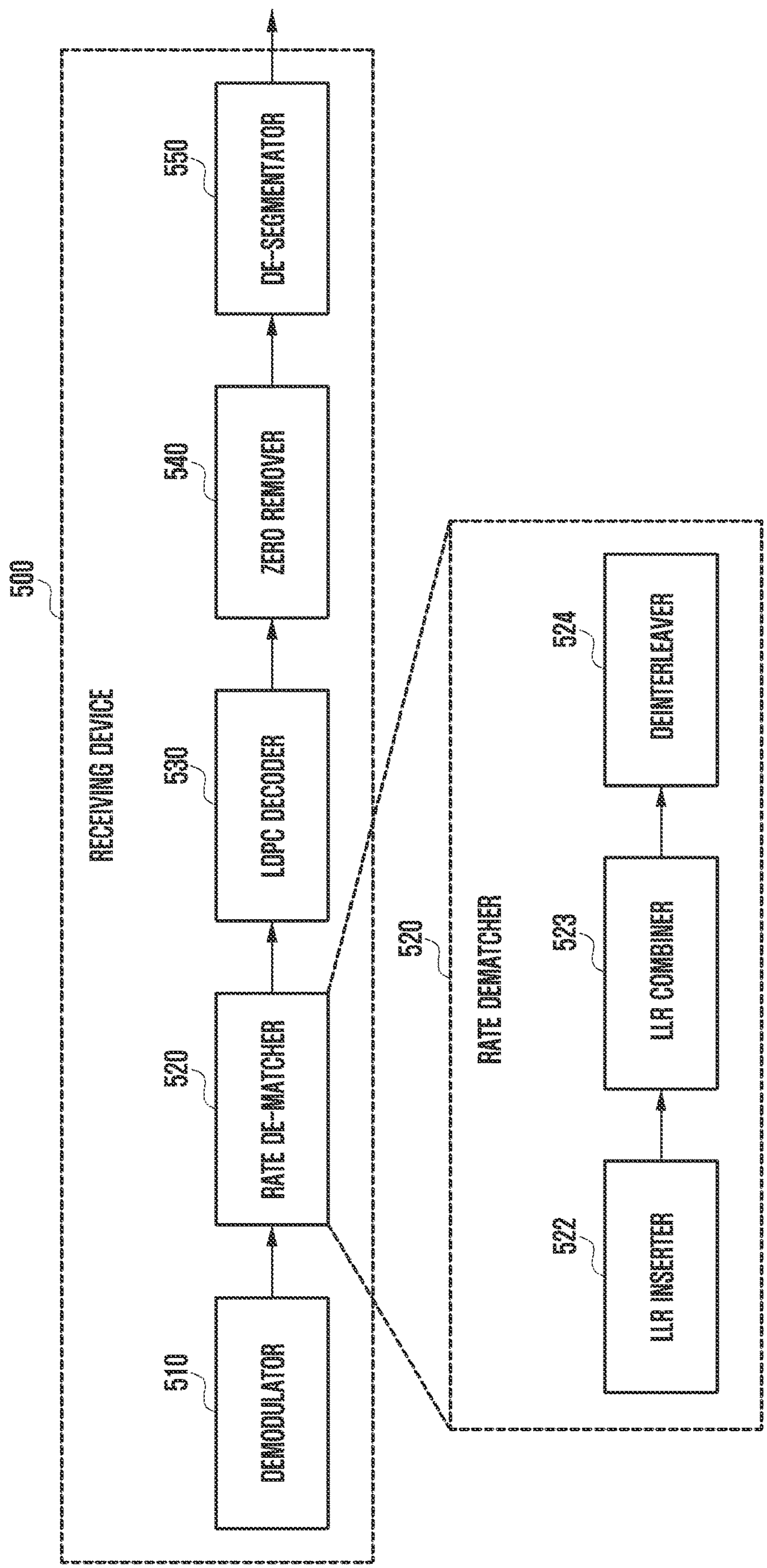
FIG. 5 is a block diagram illustrating the configuration of a receiving device according to an embodiment of the disclosure.

FIG. 5 is a block diagram illustrating the configuration of a receiving device according to an embodiment of the disclosure.

Specifically, as illustrated in FIG. 5, the receiving device 500 may include, in order to process pieces of variable length information, a demodulator 510, a rate dematcher 520, an LDPC decoder 530, a zero remover 540, a desegmentator 550, and the like. The rate dematcher 520 may include a log likelihood ratio (LLR) inserter 522, an LLR combiner 523, a deinterleaver 524, and the like.

The constituent elements illustrated in FIG. 5 are only exemplary constituent elements for performing functions corresponding to the constituent elements illustrated in FIG. 5. If necessary, some of the constituent elements illustrated in FIG. 5 may be omitted or modified, and other constituent elements may be added.

The parity-check matrix in the disclosure may be read by using a memory, may be given in advance by the transmitting device or the receiving device, or may be directly generated by the transmitting device or the receiving device. In addition, the transmitting device may store or generate a sequence, an exponent matrix, or the like corresponding to the parity-check matrix, and may apply the same to encoding. It is obvious that the receiving device may likewise store or generate a sequence, an exponent matrix, or the like corresponding to the parity-check matrix, and may apply the same to decoding.

Hereinafter, a receiver operation will be described in detail with reference to FIG. 5.

The demodulator 510 demodulates a signal received from the transmitting device 400.

Specifically, the demodulator 510, which is a constituent element corresponding to the modulator 450 of the transmitting device 400, may demodulate a signal received from the transmitting device 400, thereby generating values corresponding to bits transmitted by the transmitting device 400.

To this end, the receiving device 500 may have information prestored therein regarding the modulation scheme used by the transmitting device 400 for modulation according to a mode. Accordingly, the demodulator 510 may demodulate the signal received from the transmitting device 400 according to the mode, thereby generating values corresponding to LDPC codeword bits.

Meanwhile, a value corresponding to bits transmitted by the transmitting device 400 may be a log likelihood ratio (LLR) value.

Specifically, the LLR value may be expressed as the logarithm of the ratio between the likelihood that a bit transmitted by the transmitting device 400 will be 0 and the likelihood that the same will be 1. Alternatively, the LLR value may be the bit value itself. In addition, the LLR value may be a representative value determined according to the range to which the likelihood that the bit transmitted by the transmitting device 400 will be 0 or 1 belongs.

The demodulator 510 includes a process of performing multiplexing (not illustrated) with regard to the LLR value. Specifically, the demodulator 510 is a constituent element corresponding to a bit demux (not illustrated) of the transmitting device 400, and may perform an operation corresponding to that of the bit demux (not illustrated).

To this end, the receiving device 500 may have information prestored therein regarding the parameter used by the transmitting device 400 for demultiplexing and block interleaving. Accordingly, the mux (not illustrated) may inversely perform demultiplexing and block interleaving operations performed by the bit demux (not illustrated) with regard to the LLR value corresponding to a cell word, thereby multiplexing the LLR value corresponding to the cell word bit by bit.

The rate dematcher 520 may insert an LLR value into an LLR value outputted from the demodulator 510. In this case, the rate dematcher 520 may insert pre-promised LLR values between LLR values outputted from the demodulator 510.

Specifically, the rate dematcher 520 is a constituent element corresponding to the rate matcher 440 of the transmitting device 400, and may perform operations corresponding to those of the interleaver 441 and the zero removing and puncturing/repetition/zero remover 442.

Firstly, the rate dematcher 520 conducts deinterleaving so as to correspond to the interleaver 441 of the transmitter. Output values from the deinterleaver 524 may insert an LLR value corresponding to zero bits in a position in which zero bits have been padded in the LDPC codeword by the LLR inserter 522. In this case, the LLR value corresponding to the padded zero bits, that is, shortened zero bits, may be ∞ or −∞. However, ∞ or −∞ is a theoretical value, and the same may substantially be the maximum value or minimum value of the LLR value used by the receiving device 500.

To this end, the receiving device 500 may have information prestored therein regarding the parameter used by the transmitting device 400 to pad zero bits. Accordingly, the rate dematcher 520 may determine the position in which zero bits have been padded in the LDPC codeword, and may insert an LLR value corresponding to shortened zero bits in the corresponding position.

In addition, the LLR inserter 522 of the rate dematcher 520 may insert an LLR value corresponding to punctured bits in the position of the punctured bits in the LDPC codeword. In this case, the LLR value corresponding to the punctured bits may be 0.

To this end, the receiving device 500 may have information prestored therein regarding the parameter used by the transmitting device 400 for puncturing. Accordingly, the LLR inserter 522 may insert an LLR value corresponding to LDPC parity bits in the position in which they were punctured.

The LLR combiner 523 may combine (summate) LLR values outputted from the LLR inserter 522 and the demodulator 510. Specifically, the LLR combiner 523 is a constituent element corresponding to the puncturing/repetition/zero remover 442 of the transmitting device 400, and may perform an operation corresponding to that of the repetition unit 442. Firstly, the LLR combiner 523 may combine an LLR value corresponding to repeated bits with another LLR value. The other LLR value may be an LLR value regarding bits, based on which repeated bits were generated by the transmitting device 400, that is, LDPC parity bits selected as repetition targets.

That is, as described above, the transmitting device 400 selects bits from LDPC parity bits, repeats them between LDPC information word bits and LDPC parity bits, and transmits the same to the receiving device 500.

Accordingly, the LLR value regarding LDPC parity bits may include an LLR value regarding repeated LDPC parity bits and an LLR value regarding non-repeated LDPC parity bits, that is, LDPC parity bits generated by encoding. Therefore, the LLR combiner 523 may combine identical LDPC parity bits with LLR values.

To this end, the receiving device 500 may have information prestored therein regarding the parameter used by the transmitting device 400 for repetition. Accordingly, the LLR combiner 523 may determine the LLR value regarding the repeated LDPC parity bits, and may combine the same with the LLR value regarding LDPC parity bits, which served as the basis of repetition.

In addition, the LLR combiner 523 may combine an LLR value corresponding to bits that have undergone retransmission or increment redundancy (IR) with another LLR value. The other LLR value in this regard may be the LLR value regarding bits selected to generate LDPC codeword bits, which served as a basis for generating the bits that has undergone retransmission or IR by the transmitting device 400.

That is, as described above, the transmitting device 400 may, if a NACK occurs for a HARQ, transmit some or all of codeword bits to the receiving device 500.

Accordingly, the LLR combiner 523 may combine the LLR value regarding bits received through retransmission or IR with the LLR value regarding LDPC codeword bits received through the previous codeword or frame.

To this end, the receiving device 500 may have information prestored therein regarding the parameter used by the transmitting device 400 to generate the retransmission or IR bits. Accordingly, the LLR combiner 523 may determine the LLR value regarding the number or retransmission or IR bits, and may combine the same with the LLR value regarding the LDPC parity bits that served as a basis for generating the retransmission bits.

The deinterleaver 524 may deinterleave an LLR value outputted from the LLR combiner 523.

Specifically, the deinterleaver unit 524 is a constituent element corresponding to the interleaver 441 of the transmitting device 400, and may perform an operation corresponding to that of the interleaver 441.

To this end, the receiving device 500 may have information prestored therein regarding the parameter used by the transmitting device 400 for interleaving. Accordingly, the deinterleaver 524 may inversely perform the interleaving operation performed by the interleaver 441 with regard to the LLR value corresponding to LDPC codeword bits, thereby deinterleaving the LLR value corresponding to the LDPC codeword bits.

The LDPC decoder 530 may perform LDPC decoding based on the LLR value outputted from the rate dematcher 520.

Specifically, the LDPC decoder 530 is a constituent element corresponding to the LDPC encoder 430 of the transmitting device 400, and may perform an operation corresponding to that of the LDPC encoder 430.

To this end, the receiving device 500 may have information prestored therein regarding the parameter used by the transmitting device 400 to perform LDPC encoding according to a mode. Accordingly, the LDPC decoder 530 may perform LDPC decoding based on the LLR value outputted from the rate dematcher 520 according to the mode.

For example, the LDPC decoder 530 may perform LDPC decoding based on an LLR value outputted from the rate dematcher 520 based on an iterative decoding scheme based on a sum-product algorithm, and may output bits that have been error-corrected as a result of LDPC decoding.

The zero remover 540 may remove zero bits from the bits outputted from the LDPC decoder 530.

Specifically, the zero remover 540 is a constituent element corresponding to the zero padder 420 of the transmitting device 400, and may perform an operation corresponding to that of the zero padder 420.

To this end, the receiving device 500 may have information prestored therein regarding the parameter used by the transmitting device 400 to pad zero bits. Accordingly, the zero remover 540 may remove zero bits, which has been padded by the zero padder 420, from the bits outputted from the LDPC decoder 530.

The desegmentator 550 is a constituent element corresponding to the segmentator 410 of the transmitting device 400, and may perform an operation corresponding to that of the segmentator 410.

To this end, the receiving device 500 may have information prestored therein regarding the parameter used by the transmitting device 400 for segmentation. Accordingly, the desegmentator 550 may couple segments regarding bits outputted from the zero remover 540, that is, variable-length input bits, thereby restoring pre-segmentation bits.

Although not illustrated, the receiving device 400 may further include, if necessary, a controller (not illustrated) for controlling the operation of the receiving device 400. Accordingly, the operation of the receiving device described above and the operation of the receiving device described in the disclosure may be controlled by the controller, and the controller according to the disclosure may be defined as a circuit, an application-specific integrated circuit, or at least one processor.

Meanwhile, the LDPC code may be decoded by using an iterative decoding algorithm based on a sum-product algorithm on the bipartite graph enumerated in FIG. 2, and the sum-product algorithm is a kind of message passing algorithm.

Hereinafter, a message passing operation normally used during LDPC decoding will be described with reference to FIG. 6A and FIG. 6B.

Figure 6A:
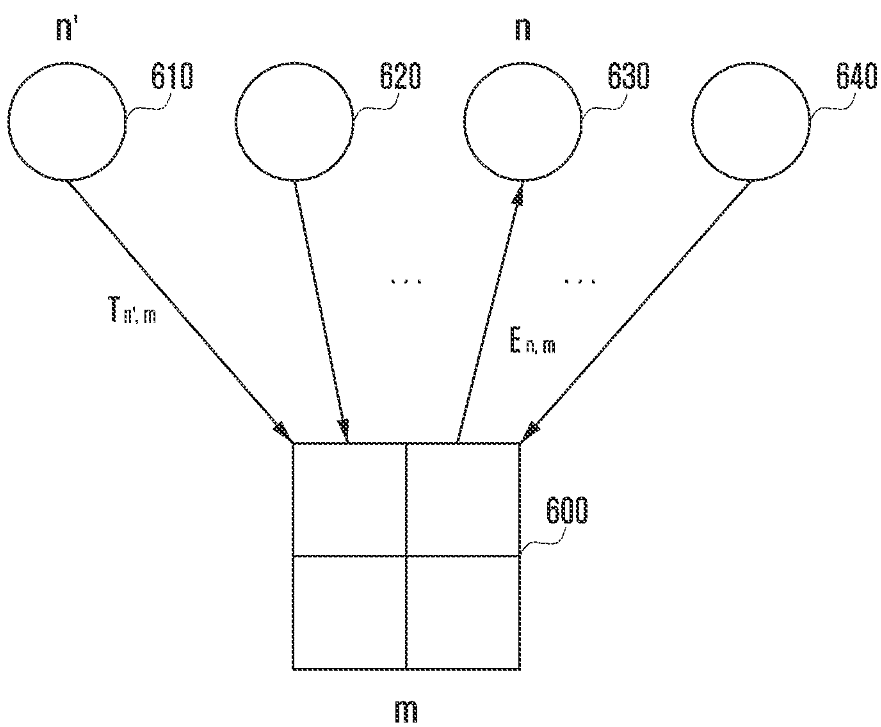
FIG. 6A and FIG. 6B are message structure diagrams illustrating message passing operations between specific check nodes and variable nodes for LDPC encoding.
Figure 6B:
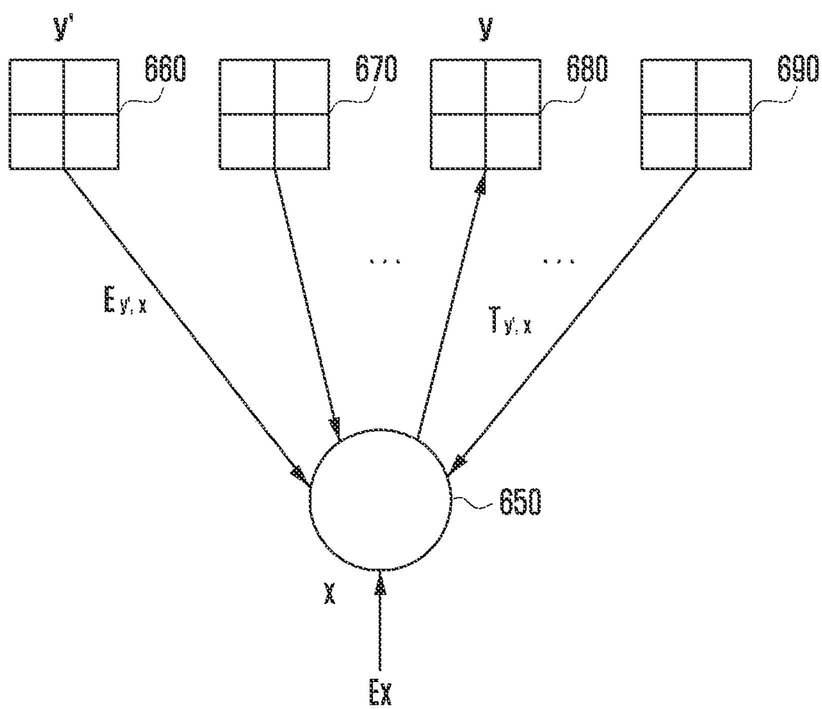

FIG. 6A and FIG. 6B illustrate message passing operations in specific check nodes and variable nodes for LDPC decoding.

FIG. 6A illustrates check node m 600 and multiple variable nodes 610, 620, 630, and 640 connected to the check node m 600. In addition, illustrated Tn',m refers to a message passed from variable node n' 610 to check node m 600, and En,m refers to a message passed from check node m 600 to variable node n 630. In this regard, the set of all variable nodes connected to check node m 600 will be defined as N(m), and the set obtained by excluding variable node n 630 from N(m) will be defined as N(m)|n.

In this case, a message update rule based on a sum-product algorithm may be defined by Equation 11 below:

$$|E_{n,m}| = \Phi\left[\sum_{n' \in N(m)\backslash n} \Phi(|T_{n',m}|)\right] \qquad \text{Equation 11}$$

$$\text{Sign}\,(E_{n,m}) = \prod_{n' \in N(m)\backslash n} \text{sign}\,(T_{n',m})$$

wherein Sign($E_{n,m}$) refers to the sign of message $E_{n,m}$, and $|E_{n,m}|$ refers to the magnitude of message $E_{n,m}$. Meanwhile, function Φ(x) may be defined by Equation 12 below:

$$\Phi(x) = -\log\left(\tanh\left(\frac{x}{2}\right)\right) \qquad \text{Equation 12}$$

Meanwhile, FIG. 6B illustrates variable node x 650 and multiple check nodes 660, 670, 680, and 690 connected to the variable node x 650. In addition, illustrated $E_{y',x}$ refers to a message passed from check node y' 660 to variable node x 650, and $T_{y,x}$ refers to a message passed from variable node x 650 to variable node y 680. In this regard, the set of all variable nodes connected to variable node x 650 will be defined as M(x), and the set obtained by excluding check node y 680 from M(x) will be defined as M(x)|y. In this case, a message update rule based on a sum-product algorithm may be defined as in Equation 13 below:

$$T_{y,x} = E_x + \sum_{y' \in M(x)\backslash y} E_{y',x} \qquad \text{Equation 13}$$

wherein $E_x$ refers to the initial message value of variable node x.

In addition, determining the bit value of node x may be defined by Equation 14 below:

$$P_x = E_x + \sum_{y' \in M(x)} E_{y',x} \quad \text{Equation 14}$$

In this case, an encoding bit corresponding to node x may be determined according to the value of $P_x$.

The scheme described above with reference to FIG. 6A and FIG. 6B is a normal decoding method, and further detailed description thereof will thus be omitted herein. It is to be noted that other methods than those described with reference to FIG. 6A and FIG. 6B may be applied to determine a message value passed between a variable node and a check node, and detailed description in this regard will be referred to ⌈Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519)⌋.

Figure 7:
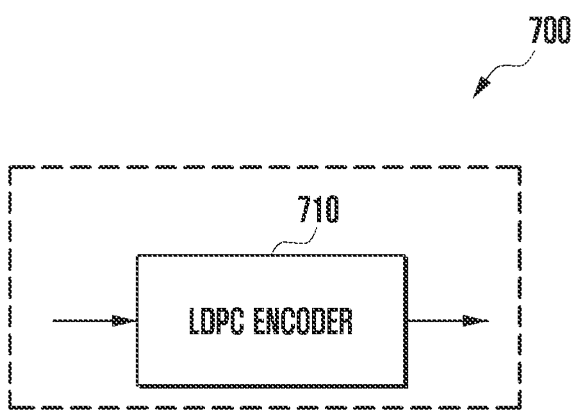
FIG. 7 is a block diagram illustrating the detailed configuration of an LDPC encoder according to an embodiment of the disclosure.

FIG. 7 is a block diagram illustrating the detailed configuration of an LDPC encoder according to an embodiment of the disclosure.

As many as $K_{ldpc}$ bits may constitute $K_{ldpc}$ LDPC information word bits $I=(i_0, i_1, \ldots, K_{ldpc}-1)$ for the LDPC encoder 700. The LDPC encoder 700 may systematically LDPC-encode the $K_{ldpc}$ LDPC information word bits, thereby generating an LDPC codeword $\Lambda=(c_0, c_1, \ldots, c_{Nldpc-1})=(i_0, i_1, \ldots, i_{Kldpc-1}, p_0, p_1, \ldots, p_{Nldpc-Kldpc-1})$ including $N_{ldpc}$ bits.

As described above with reference to Equation 1, a process of determining a codework such that the product of the LDPC codeword and the parity-check matrix becomes a zero vector is included.

According to FIG. 7, the encoding device 700 includes an LDPC encoder 710. The encoding device 700 may have the same configuration as that of the transmitting device described with reference to FIG. 4. Alternatively, the encoding device 700 may further include some of the constituent elements of the transmitting device, or may not include some thereof. The LDPC encoder 710 may perform LDPC encoding with regard to input bits, based on a parity-check matrix or an exponent matrix or sequence corresponding thereto, thereby generating an LDPC codeword. In this case, the LDPC encoder 710 may perform LDPC encoding by using a parity-check matrix defined differently according to the code rate (that is, code rate of the LDPC code).

Meanwhile, the encoding device 700 may further include a memory (not illustrated) for pre-storing the code rate of the LDPC code, the codeword length, and information regarding the parity-check matrix, and the LDPC encoder 710 may perform LDPC encoding by using such information. The information regarding the parity-check matrix may store information regarding the index value of the circulant matrix if the parity matrix proposed in the disclosure is used.

Figure 8:
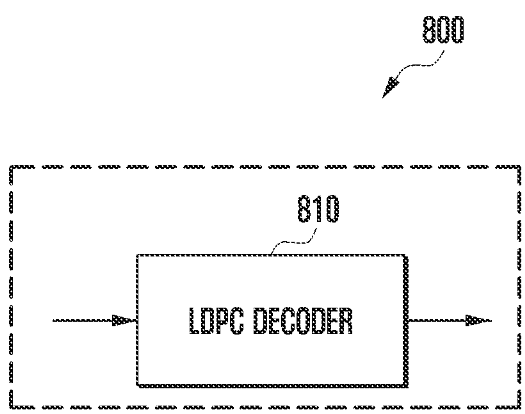
FIG. 8 is a block diagram illustrating the configuration of a decoding device according to an embodiment of the disclosure.

FIG. 8 is a block diagram illustrating the configuration of a decoding device according to an embodiment of the disclosure.

According to FIG. 8, the decoding device 800 may include an LDPC decoder 810. The decoding device 800 may have the same configuration as that of the receiving device described with reference to FIG. 5. Alternatively, the decoding device 800 may further include some of the constituent elements of the transmitting device or may not include some thereof.

The LDPC decoder 810 performs LDPC decoding with regard to an LDPC codeword, based on a parity-check matrix or an exponent matrix or a sequence corresponding thereto.

For example, the LDPC decoder 810 may pass a log likelihood ratio (LLR) value corresponding to LDPC codeword bits through an iterative decoding algorithm such that LDPC decoding is performed, thereby generating information word bits.

The LLR value is a channel value corresponding to LDPC codeword bits, and may be expressed in various methods.

For example, the LLR value may be expressed as the logarithm of the ratio between the likelihood that a bit transmitted from the transmitting side through a channel will be 0 and the likelihood that the same will be 1. Alternatively, the LLR value may be the bit value itself determined by hard decision, or may be a representative value determined according to the range to which the likelihood that the bit transmitted from the transmitting side will be 0 or 1 belongs.

In this case, the transmitting side may generate an LDPC codeword by using the LDPC encoder 710 as in FIG. 7.

In this case, the LDPC decoder 810 may perform LDPC decoding by using a parity-check matrix defined differently according to the code rate (that is, code rate of the LDPC code).

Figure 9:
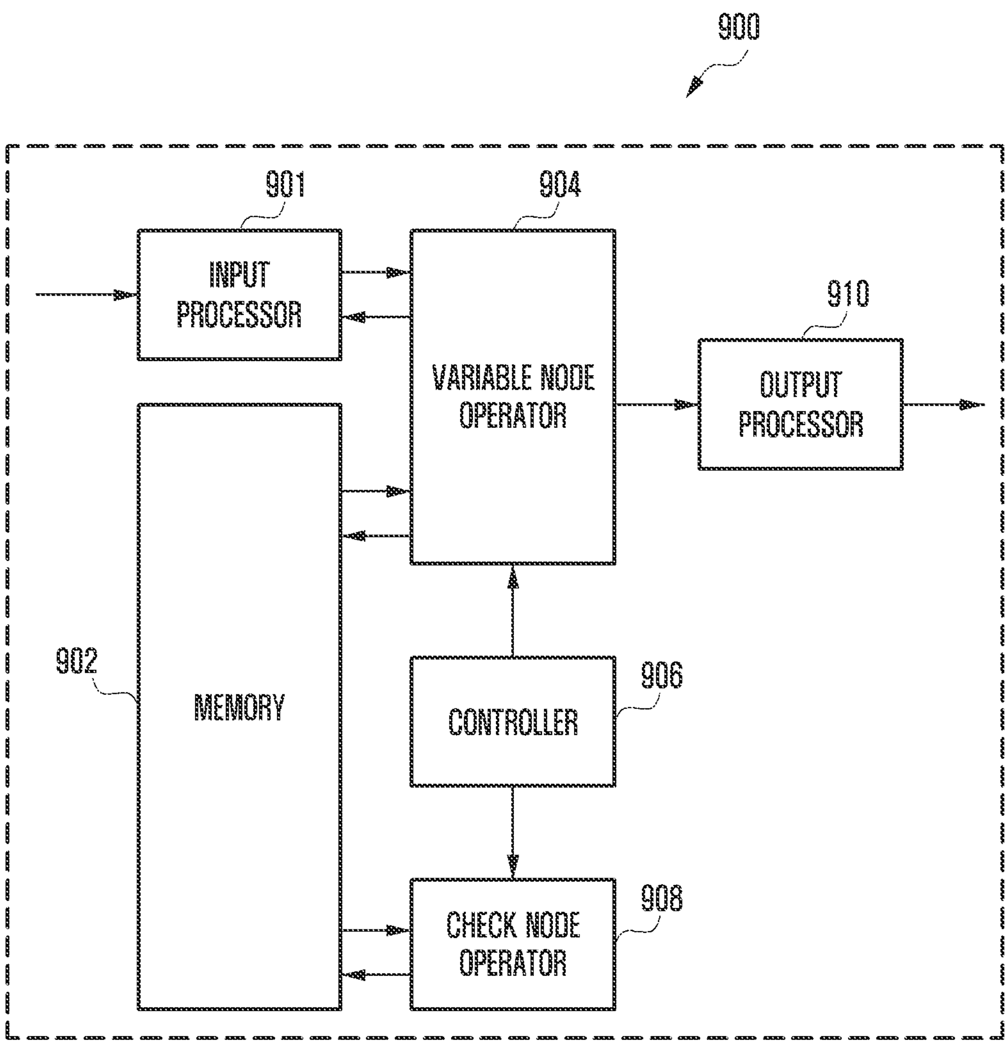
FIG. 9 is a diagram illustrating the structure of an LDPC decoder according to another embodiment of the disclosure.

FIG. 9 is a diagram illustrating the structure of an LDPC decoder according to another embodiment of the disclosure.

Meanwhile, the LDPC decoder 810 may perform LDPC decoding by using an iterative decoding algorithm as described above, and the LDPC decoder 810 in this case may be configured in the same structure as illustrated in FIG. 9. It is to be noted that the iterative decoding algorithm is already known, and the detailed configuration illustrated in FIG. 9 is accordingly only an example.

According to FIG. 9, the decoding device 900 includes an input processor 901, a memory 902, a variable node operator 904, a controller 906, a check node operator 908, an output processor 910, and the like.

The input processor 901 stores an inputted value. Specifically, the input processor 901 may store the LLR value of a reception signal received through a wireless channel.

The controller 904 determines the number of values inputted to the variable node operator 904, the address value thereof in the memory 902, the number of values inputted to the check node operator 908, the address value thereof in the memory 902, and the like, based on the size of a block of a reception signal received through the wireless channel (that is, the length of the codeword) and the parity-check matrix corresponding to the code rate.

The memory 902 stores input data and output data of the variable node operator 904 and the check node operator 908.

The variable node operator 904 receives pieces of data inputted from the memory 902 and performs a variable node operation according to address information of input data inputted from the controller 906 and information regarding the number of pieces of input data. The variable node operator 904 then stores the variable node operation results in the memory 902, based on information regarding the address of output data received from the controller 906 and information regarding the number of pieces of output data. In addition, the variable node operator 904 inputs the variable node operation result to the output processor 910, based on data received from the input processor 901 and the memory 902. The variable node operation has already been described with reference to FIGS. 6A and 6B.

The check node operator 908 receives pieces of data from the memory 902 and performs a variable node operation, based on address information of input data inputted from the controller 906 and information regarding the number of pieces of input data. The check node operator 908 then stores the variable node operation results in the memory 902, based on information regarding the address of output data received from the controller 906 and information regarding the number of pieces of output data. The check node operation has already been described with reference to FIGS. 6A and 6B.

The output processor 910 makes a hard decision regarding whether information word bits of the transmitting-side codeword were 0s or 1s, based on data inputted from the variable node operator 904, and then outputs the result of hard decision, and the output value of the output processor 910 finally becomes a decoded value. In this case, the hard decision may be made based on the summation of all message values inputted to a single variable node in FIGS. 6A and 6B (initial message value and all message values inputted from the check node).

Meanwhile, the decoding device 900 may further include a memory (not illustrated) for pre-storing the code rate of the LDPC code, the codeword length, and information regarding the parity-check matrix, and the LDPC decoder 810 may perform LDPC decoding by using such information. However, this is only an example, and the corresponding pieces of information may be provided from the transmitting side.

Figure 10:
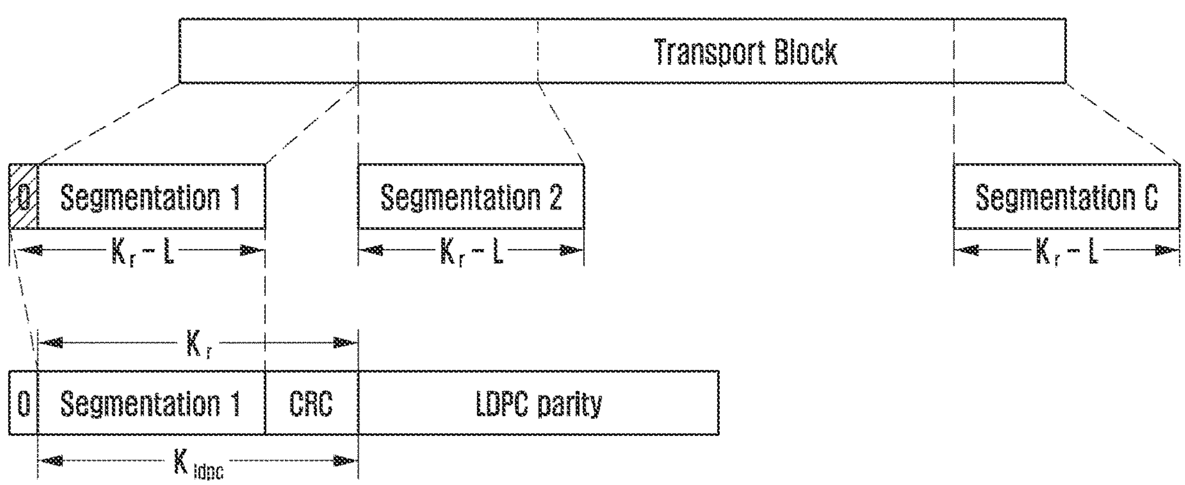
FIG. 10 is a diagram illustrating the structure of a transport block according to another embodiment of the disclosure.

FIG. 10 is a block diagram illustrating the structure of a transport block according to another embodiment of the disclosure.

Referring to FIG. 10, <Null> bits may be added to make the segmented lengths identical.

In addition, <Null> bits may be added so as to conform to the information length of the LDPC code.

A method for applying various block sizes, based on a QC-LDPC code, has been described in connection with a communication and broadcasting systems supporting LDPC codes having various lengths. Next, a method for further improving the encoding performance in connection with the proposed method will be proposed.

In general, there are many advantages if an appropriate sequence is converted from a single LDPC exponent matrix, sequence, or the like and then used with regard to very diversified block size L, as in the case of the lifting method described with reference to Equation 9 and Equation 10, because the system needs to be implemented with regard to only one sequence or a small number of sequences. However, if the type of block sizes to be supported increases, it becomes very difficult to design an LDPC code having a good performance with regard to all block sizes.

The disclosure proposes a method and an apparatus for LDPC encoding/decoding by using multiple index matrices (or LDPC sequences) corresponding to respective base matrices, on two determined base matrices. The two base matrices are fixed, and lifting is applied according to the block size included in each block size group, from the exponent matrix or sequence of an LDPC code defined on the base matrices, thereby performing variable-length LDPC encoding and decoding. This scheme is characterized in that the entries or numbers constituting the exponent matrix or LDPC sequence of multiple LDPC codes may have different values, but the position of the corresponding entries or numbers is accurately limited according to the base matrices.

As such, the exponent matrix or LDPC sequences refer to the index of each circulant permutation matrix, that is, a kind of circular shift value regarding bits. If the positions of all entries or numbers are identically configured, it becomes easy to recognize the position of bits corresponding to the circulant permutation matrix. For reference, since the exponent matrix or LDPC sequence proposed in the disclosure corresponds to the circular shift value of bits corresponding to the block size Z, the same can be variously referred to as a shift matrix, a shift value matrix, a shift sequence, a shift value sequence, or the like.

In addition, the disclosure proposes a method for improving the performance by appropriately selecting the two base matrices according to the information word length or code rate of the LDPC code and then applying the same to the system. If there are two base matrices, there is a trade-off between some degree of increase in the system complexity and the advantage of substantial improvement in the encoding performance.

It is normally difficult to optimize an LDPC code, based on a single base matrix, with regard to all lengths and code rates. Accordingly, it is possible to implement a method and an apparatus for encoding and decoding, which support stable and good performance with regard to various lengths and code rates by using two or more base matrices and index matrices based on the same, even if the degree of complexity increases to some extent.

For more detailed description, block sizes Z to be supported may be classified into multiple block size groups (or sets) as in Equation 15 below. The block size Z may refer to a value corresponding to the size Z×Z of a circulant permutation matrix or circulant matrix in connection with the parity-check matrix of an LDPC code.

$$Z1=\{2,4,8,16,32,64,128,256\}$$

$$Z2=\{3,6,12,24,48,96,192,384\}$$

$$Z3=\{5,10,20,40,80,160,320\}$$

$$Z4=\{7,14,28,56,112,224\}$$

$$Z5=\{9,18,36,72,144,288\}$$

$$Z6=\{11,22,44,88,176,352\}$$

$$Z7=\{13,26,52,104,208\}$$

$$Z8=\{15,30,60,120,240\} \quad \text{Equation 15}$$

As described above, the disclosure proposes a method and an apparatus for LDPC encoding/decoding by using multiple index matrices (or LDPC sequences) corresponding to respective base matrices, on two determined base matrices.

Equation 15 above is only an example. It is possible to use all block size Z values included in the block size groups in Equation 15 above. It is possible to appropriately use a block size value included in a subset of a block size group in Equation 15, as defined in Equation 16 below. It is possible to add or exclude appropriate values to or from a block size group (or set) in Equation 15 or Equation 16 and to use the same.

$$Z1'=\{8,16,32,64,128,256\}$$

$$Z2'=\{12,24,48,96,192,384\}$$

$$Z3'=\{10,20,40,80,160,320\}$$

$$Z4'=\{14,28,56,112,224\}$$

$$Z5'=\{9,18,36,72,144,288\}$$

$Z6'=\{11,22,44,88,176,352\}$ $Z7'=\{13,26,52,104,208\}$ $Z8'=\{15,30,60,120,240\}$  Equation 16

The block size groups in Equation 15 and Equation 16 above are characterized in that they not only have different granularities, but the ratio between adjacent block sizes is the same integer. In other words, block sizes included in one group are divisors or multiples with each other. It will be assumed that each exponent matrix corresponding to the $p^{th}$ group (p=1, 2, . . . , 8) is $E_p=(e_{i,j}^{(p)})$, the exponent matrix corresponding to the Z value included in the $p^{th}$ $E_p(Z)=(e_{i,j}(Z))$, and a sequence conversion method as in Equation 9 is applied by using $f_p(x,Z)=x \pmod Z$. That is, if the block size Z is determined Z=28, for example, each entry $e_{i,j}(28)$ of the exponent matrix (or LDPC sequence) $E_4(28)=(e_{i,j}(28))$ regarding Z=28 can be obtained, as defined in Equation 17 below, with regard to the exponent matrix (or LDPC sequence) $E_4=(e_{(i,j)}^{(4)})$ corresponding to the fourth block size group including Z=28.

$$e_{i,j}(28)=\begin{cases} e_{i,j}^{(4)} & e_{i,j}^{(4)}\le 0 \\ e_{i,j}^{(4)}(\mathrm{mod}\,28) & e_{i,j}^{(4)}>0 \end{cases}$$  Equation 17 or $$e_{i,j}(28)=\begin{cases} e_{i,j}^{(4)} & e_{i,j}^{(4)}< 0 \\ e_{i,j}^{(4)}(\mathrm{mod}\,28) & e_{i,j}^{(4)}\ge 0 \end{cases}$$

The conversion as in Equation 17 above may also be expressed as in Equation 18 below:

$E_p(Z)=E_p(\mathrm{mod}\ Z), ZHZ_p$  Equation 18

For reference, although it has been assumed in the above description that the lifting or exponent matrix conversion scheme according to Equation 9 or Equation 15 to Equation 18 is applied to all of the exponent matrix corresponding to the parity-check matrix, the same may also be applied to a part of the exponent matrix.

For example, a submatrix corresponding to the parity bit of a parity-check matrix normally has a special structure for efficient encoding, in many cases. In this case, lifting may change the encoding method or the degree of complexity. Accordingly, lifting may not be applied to a part of the exponent matrix regarding the submatrix corresponding to the parity in the parity-check matrix, in order to maintain the same encoding method or degree of complexity, or lifting may be applied in a different manner from the lifting applied to the exponent matrix regarding the submatrix corresponding to the information word bit. In other words, it is possible to differently configure the lifting scheme applied to the sequence corresponding to the information word bit inside the exponent matrix and the lifting scheme applied to the sequence corresponding to the parity bit. If necessary, no lifting may be applied to part or all of the sequence corresponding to the parity bit such that a fixed value is used without sequence conversion.

A flowchart of an embodiment of LDPC encoding and decoding processes based on a base matrix and an exponent matrix (or LDPC sequence) of an LDPC code, designed through the design method in view of Equation 15 to Equation 18 above, is illustrated in FIG. 11 to FIG. 18.

Figure 11:
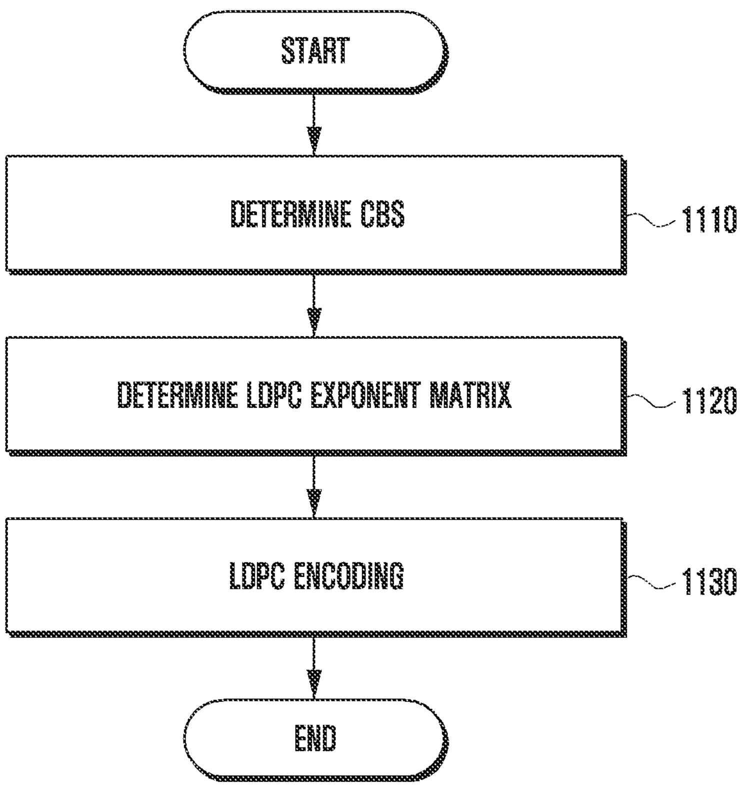
FIG. 11 is a diagram illustrating an exemplary LDPC encoding process according to an embodiment of the disclosure.

FIG. 11 is a diagram illustrating an exemplary LDPC encoding process according to an embodiment of the disclosure.

An encoding device or a transmitting device (hereinafter, referred to as a transmitting device) initially determines the length of an information word as in step 1110 in FIG. 11. The length of an information word is also referred to as a code block size (CBS), if necessary, in the disclosure.

The transmitting device may next determine an LDPC exponent matrix or sequence conforming to the determined CBS as in step 1120.

In addition, the transmitting device performs LDPC encoding in step 1130, based on the exponent matrix or sequence.

Figure 12:
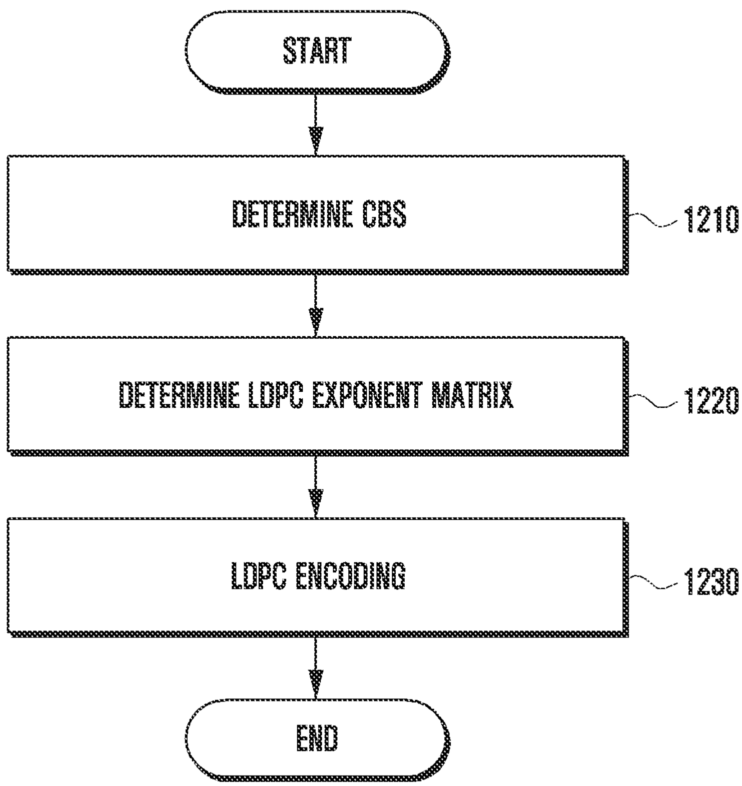
FIG. 12 is a diagram illustrating an exemplary LDPC decoding process according to an embodiment of the disclosure.

The LDPC decoding process may also be similarly illustrated as in FIG. 12.

FIG. 12 is a diagram illustrating an exemplary LDPC decoding process according to an embodiment of the disclosure.

If a CBS is determined in step 1210, a decoding device or a receiving device (hereinafter, referred to as a receiving device) may determine an appropriate exponent matrix or sequence in step 1220.

In addition, the receiving device may perform LDPC decoding by using the exponent matrix or sequence in step 1230.

Figure 13:
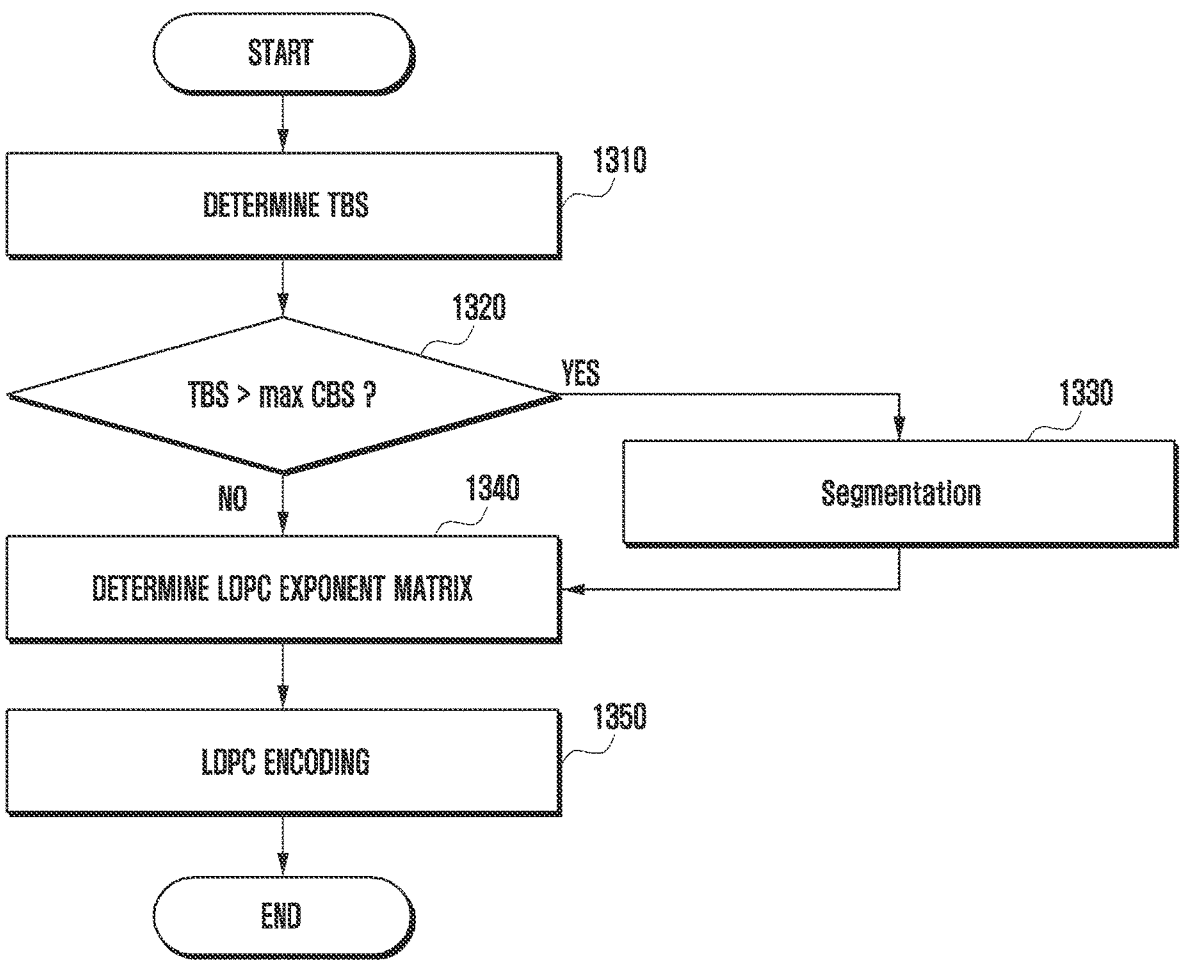
FIG. 13 is a diagram illustrating another exemplary LDPC encoding process according to an embodiment of the disclosure.
Figure 14:
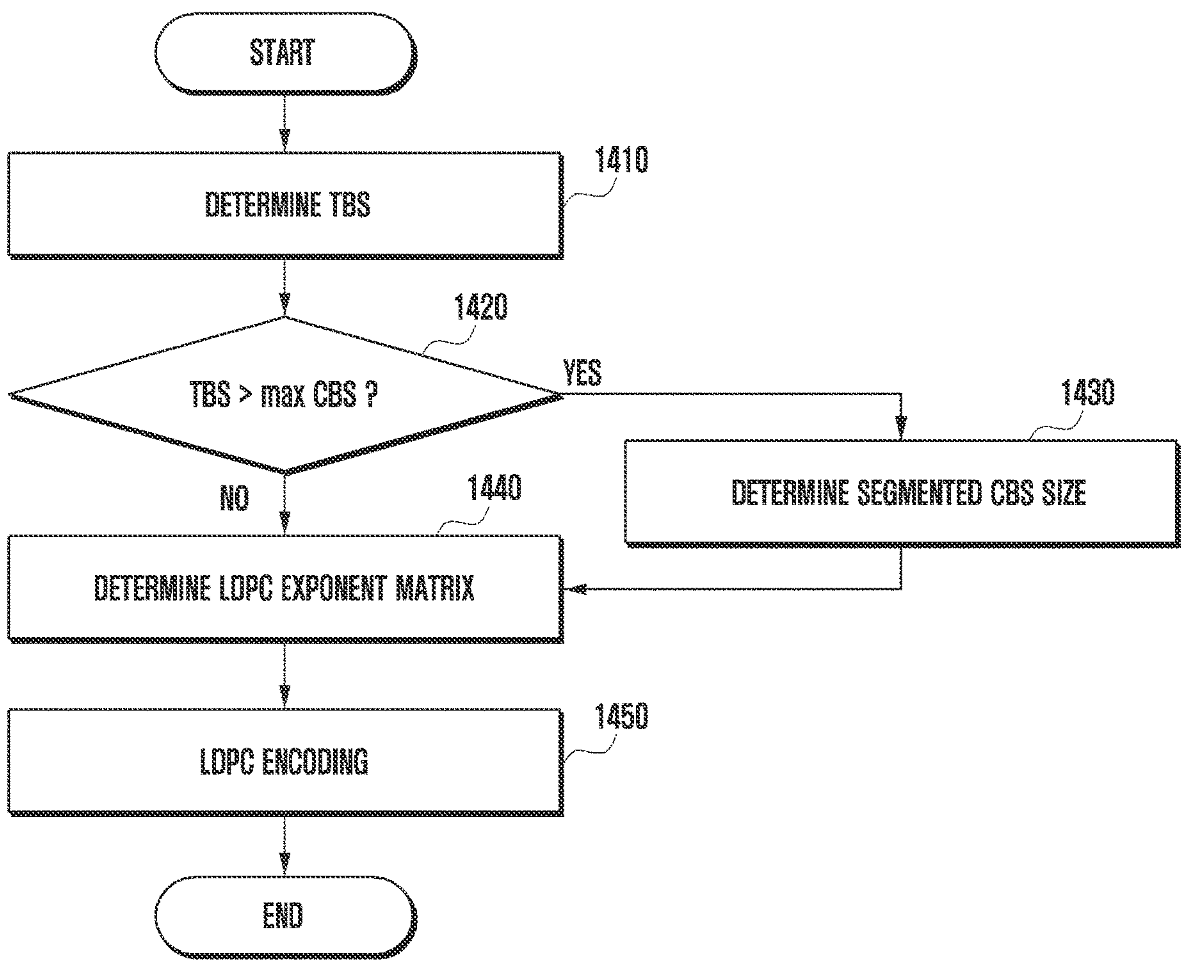
FIG. 14 is a diagram illustrating another exemplary LDPC decoding process according to an embodiment of the disclosure.

A flowchart of another embodiment of LDPC encoding and decoding processes based on a designed base matrix or exponent matrix is illustrated in FIG. 13 and FIG. 14.

FIG. 13 is a diagram illustrating another exemplary LDPC encoding process according to an embodiment of the disclosure.

The transmitting device determines the size of a transport block to be transmitted, that is, transport block size (TBS), as in step 1310 in FIG. 13.

If the length of the largest information word to which encoding can be applied once in connection with a channel code given by the system is the maximum CBS size (hereinafter, referred to as max-CBS), and if the size of the TBS is larger than max-CBS, encoding needs to be performed after segmenting the transport block into multiple information word blocks (or code blocks). The max-CBS may be determined in advance according to the system, or may be changed according to the channel situation or the characteristics of data to be transmitted. It will be assumed, for example, that there are two base matrices of the LDPC code to be used in the system, that rules to use respective base matrices are determined according to the MCS, and that the max-CBS of the first base matrix is larger than the max-CBS of the second base matrix. In this case, the base matrix to be used for LDPC encoding is determined if the MCS to be applied by the transceiver is determined, and an appropriate max-CBS value is also determined if the base matrix is determined. In addition, if the same is changed according to the channel situation or the characteristics of data to be transmitted, the max-CBS may be determined by the base station, and the terminal may receive the information from the base station.

Accordingly, the transmitting device may determine in step 1320 whether the TBS is larger than the max-CBS, smaller than the same, or equal to the same.

In addition, if the TBS is larger than the max-CBS, the transmitting device may segment the transport block so as to determine a new CBS in step 1330. The transmitting device may determine the size of the CBS to be segmented, and may segment the transport block according to the size. In addition, the transmitting device may determine an LDCP exponent matrix or sequence in step 1340.

On the other hand, if the TBS is smaller than the max-CBS or is equal to the same, the transmitting device omits the segmentation operation, determines the TBS as the CBS, and then determines an appropriate LDPC exponent matrix or sequence according to the TBS or CBS value in step 1340. Thereafter, the transmitting device may perform LDPC encoding, based on the determined exponent matrix or sequence, in step 1350.

It will be assumed, as a specific example, that it is determined in step 1310 that the TBS is 9216, and that the system-given max-CBS=8448. In this case, the transmitting device may determine in step 1320 that the TBS is larger than the max-CBS, and may appropriately apply segmentation in step 1330. Accordingly, two information word blocks (or code blocks) having CBS=4608 are obtained as a result of the segmentation. Accordingly, the transmitting device may determine an exponent matrix or sequence appropriate for CBS=4608 in step 1340, and may perform LDPC encoding by using the determined exponent matrix or sequence in step 1350.

The LDPC decoding process may also be similarly illustrated as in FIG. 14.

FIG. 14 is a diagram illustrating another exemplary LDPC decoding process according to an embodiment of the disclosure.

The receiving device determines the size of a transport block to be transmitted, that is, transport block size (TBS), as in step 1410.

If the length of the largest information word to which encoding can be applied once in connection with a channel code given by the system is the maximum CBS size (hereinafter, referred to as max-CBS), and if the size of the TBS is larger than the max-CBS, decoding needs to be performed after segmenting the transport block into multiple information word blocks (or code blocks). The max-CBS may be determined in advance according to the system, or may be changed according to the channel situation. If the same is changed according to the channel situation, the max-CBS may be determined by the base station, and the terminal may receive the information from the base station.

Accordingly, the receiving device may determine in step 1420 whether the TBS is larger than the max-CBS, smaller than the same, or equal to the same.

In addition, if the TBS is larger than the max-CBS, the receiving device may determine the size of the CBS to which segmentation is applied, in step 1430. In addition, the receiving device may determine an LDCP exponent matrix or sequence appropriately according to the size of the CBS, in step 1440.

On the other hand, if the TBS is smaller than the max-CBS or is equal to the same, the receiving device determines the TBS as the CBS, and then determines an appropriate LDPC exponent matrix or sequence according to the TBS or CBS value in step 1440. Thereafter, the receiving device may perform LDPC decoding, based on the determined exponent matrix or sequence, in step 1450.

It will be assumed, as a specific example, that it is determined in step 1410 that the TBS is 9216, and that the system-given max-CBS=8448. Accordingly, the receiving device may determine in step 1420 that the TBS is larger than the max-CBS, and may determine the size of the CBS to which segmentation is applied, as 4608, in step 1430.

If it is determined in step 1420 that the TBS is smaller than max-CBS or is equal to the same, it is then determined that TBS is equal to CBS. Thereafter, the receiving device may determine an exponent matrix or sequence of the LDPC code in step 1440, and may perform LDPC decoding by using the determined exponent matrix or sequence in step 1450.

Figure 15:
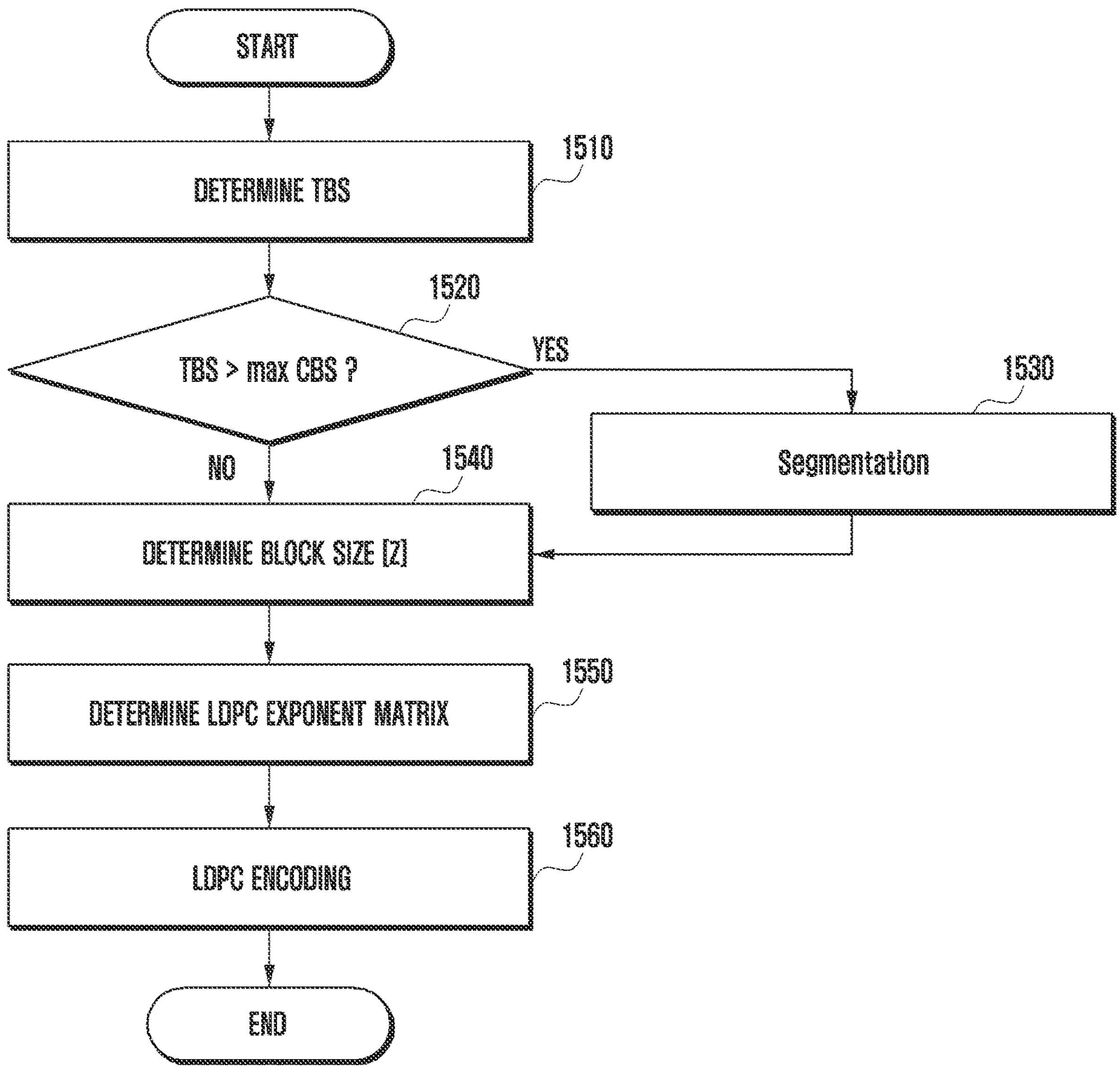
FIG. 15 is a diagram illustrating another exemplary LDPC encoding process according to an embodiment of the disclosure.
Figure 16:
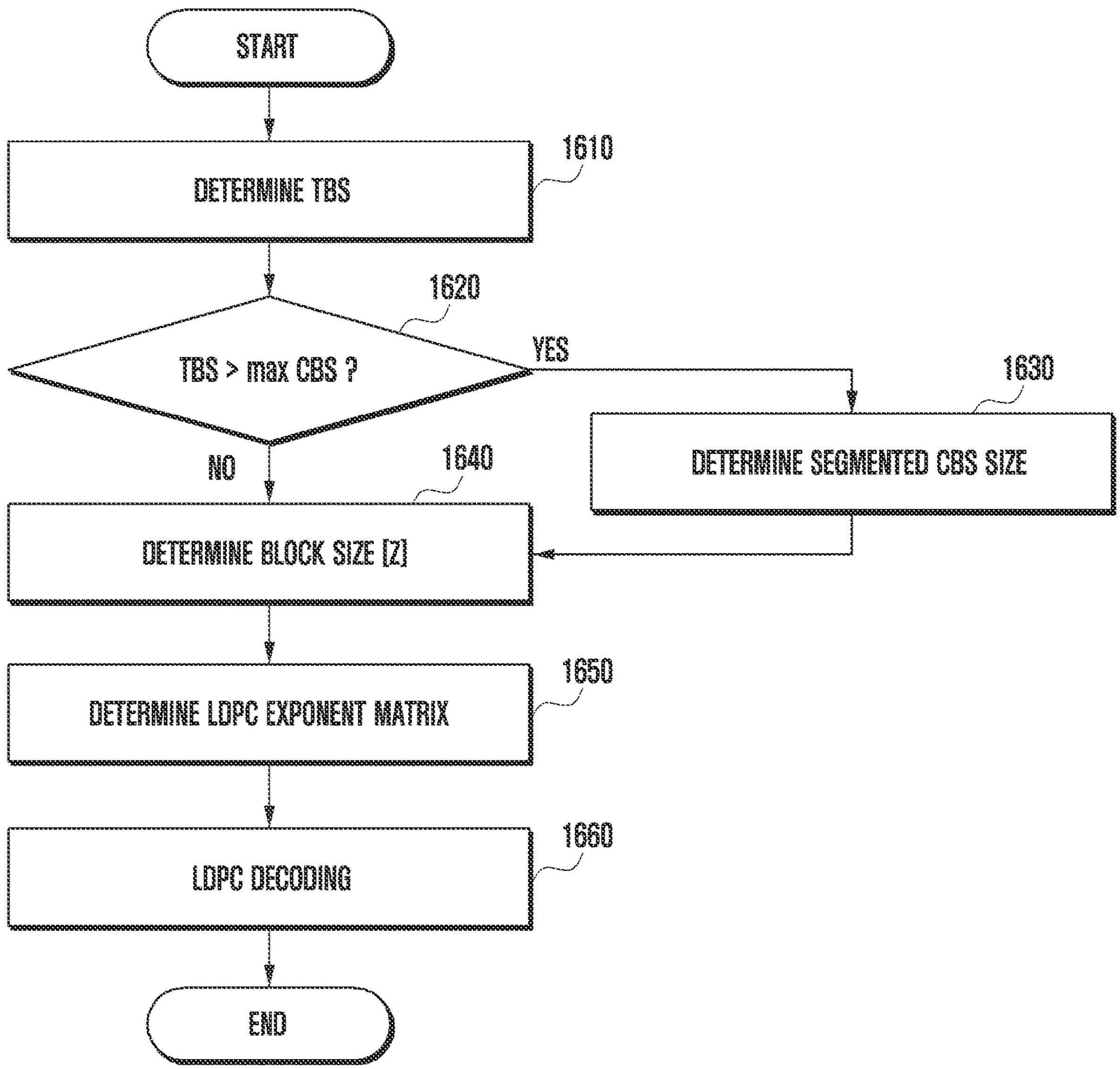
FIG. 16 is a diagram illustrating another exemplary LDPC decoding process according to an embodiment of the disclosure.

A flowchart of another embodiment of LDPC encoding and decoding processes based on a designed base matrix or exponent matrix is illustrated in FIG. 15 and FIG. 16.

FIG. 15 is a diagram illustrating another exemplary LDPC encoding process according to an embodiment of the disclosure.

The transmitting device determines the transport block size (TBS) to be transmitted as in step 1510 in FIG. 15.

In addition, the transmitting device may determine in step 1520 whether the TBS is larger than the max-CBS, smaller than the same, or equal to the same.

If the TBS is larger than the max-CBS, the transmitting device may segment the transport block in step 1530 so as to determine a new CBS.

On the other hand, if the TBS is smaller than the max-CBS or is equal to the same, the transmitting device may omit the segmentation operation and may determine the TBS as the CBS.

In addition, the transmitting device may determine the block size (Z) value to be applied to LDPC encoding, based on the CBS, in step 1540.

Thereafter, the transmitting device appropriately determines an LDPC exponent matrix or sequence according to the TBS, CBS, or block size (Z) value in step 1550.

In addition, the transmitting device performs LDPC encoding, based on the determined block size and exponent matrix or sequence, in step 1560. For reference, step 1550 may include a process of converting the determined LDPC exponent matrix or sequence, if necessary, based on the determined block size.

The LDPC decoding process may also be similarly illustrated as in FIG. 16.

FIG. 16 is a diagram illustrating another exemplary LDPC decoding process according to an embodiment of the disclosure.

If the TBA has been determined in step 1610, the receiving device may determine in step 1620 whether the TBS is larger than max-CBS, smaller than the same, or equal to the same.

If the TBS is larger than the max-CBS, the receiving device determines the size of the CBS to which segmentation is applied, in step 1630.

If it is determined in step 1620 that the TBS is smaller than the max-CBS or is equal to the same, it is then determined that the TBS is identical to the CBS.

In addition, the receiving device determines in step 1640 the block size (Z) value to be applied to LDPC decoding, and then determines in step 1650 an LDPC exponent matrix or sequence appropriate for the TBS, CBS, or block size (Z) value.

Thereafter, the receiving device may perform LDPC decoding in step 1660 by using the determined block size and the exponent matrix or sequence. For reference, step 1650 may include a process of converting the determined LDPC exponent matrix of sequence, if necessary, based on the determined block size.

Although the above embodiment has been described in connection with a case in which the process of determining the exponent matrix or sequence of the LDPC code in steps 1120, 1220, 1340, 1440, 1550, and 1650 in FIG. 11 to FIG. 16 is determined by one of the TBS, CBS, or block size (Z), various other methods may also exist.

Figure 17:
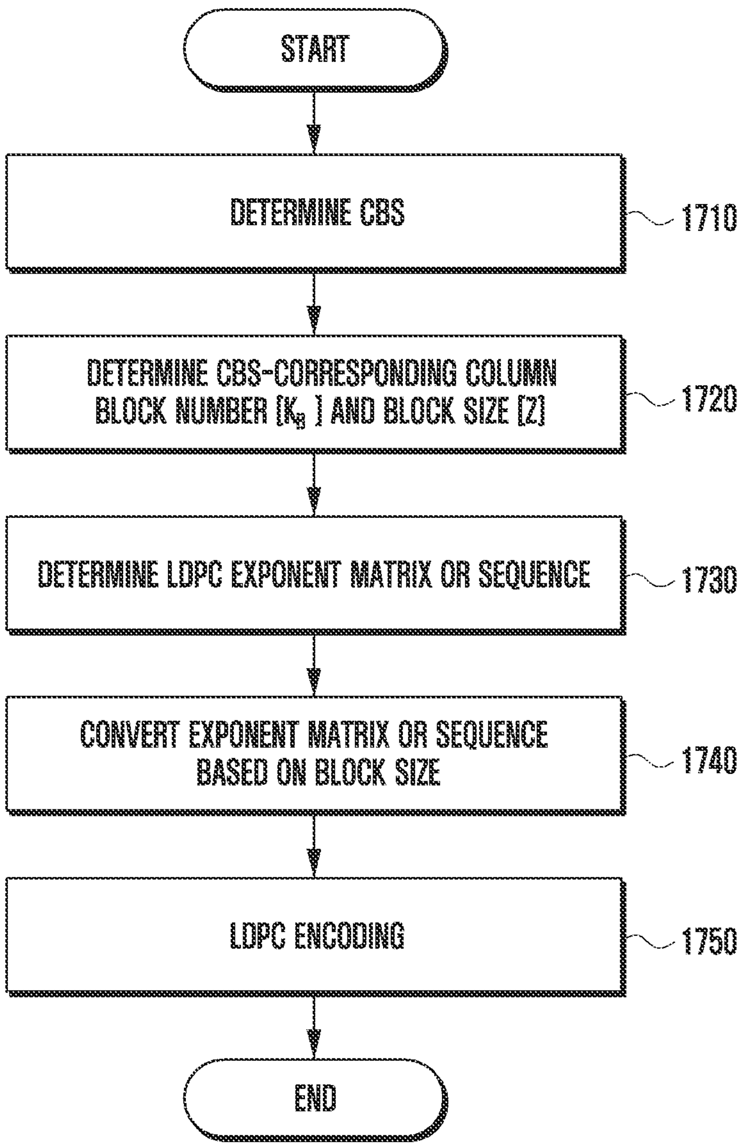
FIG. 17 is a diagram illustrating still another exemplary LDPC encoding process according to an embodiment of the disclosure.
Figure 18:
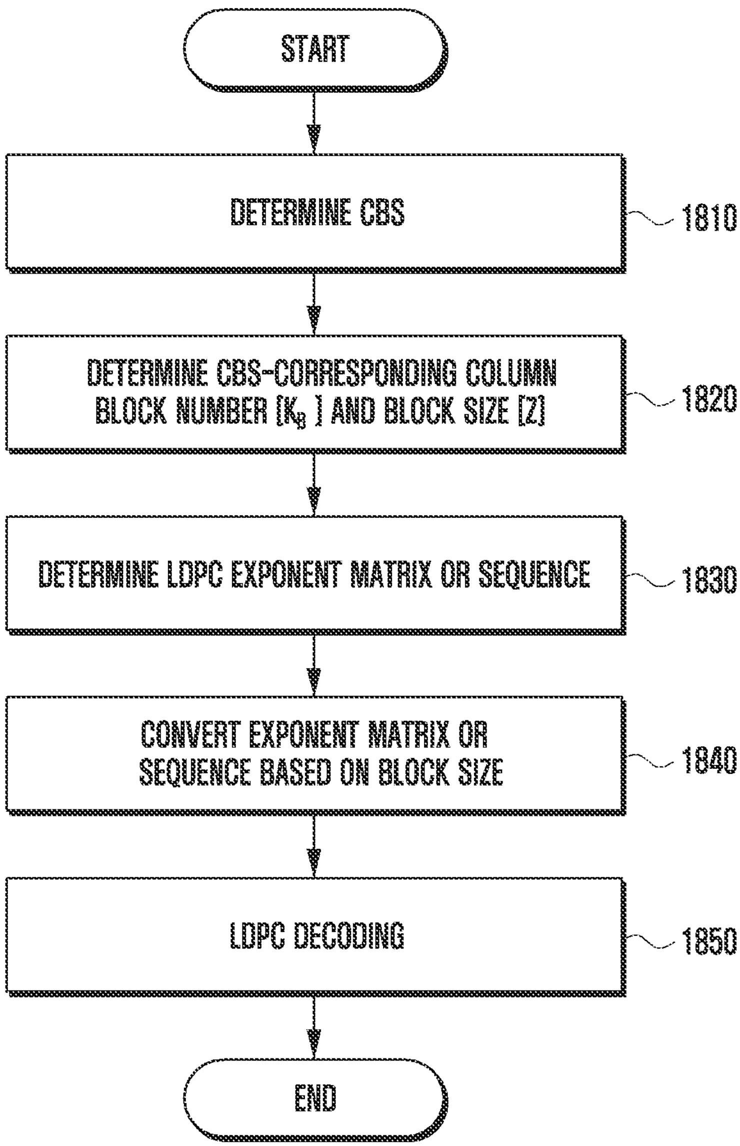
FIG. 18 is a diagram illustrating still another exemplary LDPC decoding process according to an embodiment of the disclosure.

A flowchart of another embodiment of LDPC encoding and decoding processes based on a designed base matrix or exponent matrix is illustrated in FIG. 17 and FIG. 18.

FIG. 17 is a diagram illustrating another exemplary LDPC encoding process according to an embodiment of the disclosure.

The transmitting device determines the CBS size to be transmitted as in step 1710 in FIG. 17.

In addition, the transmitting device determines, according to the CBS size, the value of the number Kb of columns corresponding to the CBS in the LDPC exponent matrix and the block size (Z) in step 1720. In the case of an exponent matrix of an LDPC code, the number of columns corresponding to the information word bit is normally fixed. However, in order to provide various CBS or optimized performance, not all columns corresponding to the information word bit may be used, and the same may be appropriately shortened (zero padded) according to the CBS and used. The Kb value is determined in view of such shortening.

The transmitting device appropriately determines an LDPC exponent matrix or sequence according to the CBS, CBS-corresponding column block number (Kb), or block size (Z) value in step 1730.

In addition, the transmitting device may perform a process of converting the determined LDPC exponent matrix or sequence, based on the determined block size and exponent matrix or sequence, in step 1740. The transmitting device performs LDPC encoding, based on the determined block size and exponent matrix or sequence, in step 1750.

The LDPC decoding process may also be similarly illustrated as in FIG. 18.

FIG. 18 is a diagram illustrating another exemplary LDPC decoding process according to an embodiment of the disclosure.

The receiving device determines the CBS size of received data as in step 1810 in FIG. 18.

In addition, the receiving device determines, according to the CBS size, the value of the number Kb of columns corresponding to the CBS in the LDPC exponent matrix and the block size (Z) in step 1820.

The receiving device appropriately determines an LDPC exponent matrix or sequence according to the CBS, CBS-corresponding column block number (Kb), or block size (Z) value in step 1830.

In addition, the receiving device may perform, in step 1840, a process of converting the determined LDPC exponent matrix or sequence, based on the determined block size and the exponent matrix or sequence. The receiving device performs LDPC decoding, based on the determined block size and the exponent matrix or sequence, in step 1850.

In connection with the embodiment of LDPC encoding and decoding processes based on the base matrix of the LDPC code and the exponent matrix (or LDPC sequence) described with reference to FIG. 11 to FIG. 18, it is possible to support LDPC encoding and decoding with various code rates and various lengths by appropriately shortening a part of the information word bit with regard to the LDPC code and puncturing a part of the codeword bit. For example, if shortening is applied to a part of the information word bit in the base matrix or exponent matrix determined for LDPC encoding and decoding in FIG. 11 to FIG. 18, if information word bits corresponding to the first two columns are always punctured, and if a part of the parity is punctured, then various information word lengths (or code block lengths) and various code rates can be supported.

Moreover, when supporting a variable information word length or variable code rate by using shortening of the LDPC code, zero padding thereof, or the like, the performance of the code can be improved according to the shortening order or shortening method. If the shortening order has been preconfigured, the encoding performance can be improved by appropriately realigning the order of part or all of the given base matrix. In addition, performance can also be improved by appropriately determining the block size or the number of column blocks, to which shortening is to be applied, with regard to a specific information word length (or code block length CBS).

Assuming, for example, that the number of columns necessary for LDPC encoding and decoding in a given LDPC base matrix, exponent matrix, or sequence is Kb, a more excellent performance may be obtained if the Kb and the block size (Z) value corresponding thereto are determined by applying an appropriate rule according to the CBS value in the following manner (for example, A=640, B=560, C=192):

```
if(CBS > A)
Kb=10;
elseif(CBS > B)
Kb=9;
elseif(CBS > C)
Kb=8;
Else
Kb=6;
End
```

In the case of the above example, if the Kb value is determined in the above manner, the block size (Z) value may be determined as the minimum value satisfying Z×Kb>=CBS. The higher the degree of freedom of determining the Kb value, the more advantageous to performance improvement, but the worse in terms of the system implementation complexity. Accordingly, an appropriate level of rule needs to be applied to improve both the performance and the system implementation efficiency. The method for determining the Kb and the block size values is only an example, and various methods are applicable.

Hereinafter, a method for improving the performance by appropriately selecting two base matrices according to the information word length or code rate of an LDPC code and then applying the same to the system, which is to be proposed in the disclosure, will be described in detail. Although the disclosure will be described with regard to two base matrices for convenience of description, the same can be normally expanded through a similar method with regard to three or more base matrices as well.

The gist of the disclosure will be described with reference to a system for LDPC encoding and decoding based on different base matrices illustrated in FIG. 19A and FIG. 20A will be described as an embodiment of the disclosure. That is, respective index matrices or LDPC sequences corresponding to the block size set corresponding to Equation 15 or Equation 16 are characterized in that they correspond to the base matrix in FIG. 19A or FIG. 20A.

FIG. 19A, FIG. 19B, FIG. 19C, FIG. 19D, FIG. 19E, FIG. 19F, FIG. 19G, FIG. 19H, FIG. 19I, and FIG. 19J are diagrams illustrating an exemplary LDPC code base matrix according to an embodiment of the disclosure.

The base matrix in FIG. 19A is divided into respective parts, which are magnified and illustrated in FIG. 19B to FIG. 19J. FIG. 19A corresponds to a matrix of diagrams corresponding to diagram numbers described in respective parts. Accordingly, FIG. 19B to FIG. 19J may be combined to constitute a single base matrix. The base matrix in FIG. 20A is divided into respective parts, which are magnified and illustrated in FIG. 20B to FIG. 20J. FIG. 20A corresponds to a matrix of diagrams corresponding to diagram numbers described in respective parts. Accordingly, FIG. 20B to FIG. 20J may be combined to constitute a single base matrix.

For reference, the base matrices in FIG. 19A and FIG. 20A may also be expressed by using sequences as given in Equation 19 and Equation 20 below, respectively. Equation 19 and Equation 20 represent the position of entry 1 with regard to each row in the above base matrices.

0,1,2,3,5,6,9,10,11,12,13,15,16,18,19,20,21,22,23

0,2,3,4,5,7,8,9,11,12,14,15,16,17,19,21,22,23,24

0,1,2,4,5,6,7,8,9,10,13,14,15,17,18,19,20,24,25

0,1,3,4,6,7,8,10,11,12,13,14,16,17,18,20,21,22,25

0,1,26

0,1,3,12,16,21,22,27

0,6,10,11,13,17,18,20,28

0,1,4,7,8,14,29

0,1,3,12,16,19,21,22,24,30

0,1,10,11,13,17,18,20,31

1,2,4,7,8,14,32

0,1,12,16,21,22,23,33

0,1,10,11,13,18,34

0,3,7,20,23,35

0,12,15,16,17,21,36

0,1,10,13,18,25,37

1,3,11,20,22,38

0,14,16,17,21,39

1,12,13,18,19,40

0,1,7,8,10,41

0,3,9,11,22,42

1,5,16,20,21,43

0,12,13,17,44

1,2,10,18,45

0,3,4,11,22,46

1,6,7,14,47

0,2,4,15,48

1,6,8,49

0,4,19,21,50

1,14,18,25,51

0,10,13,24,52

1,7,22,25,53

0,12,14,24,54

1,2,11,21,55

0,7,15,17,56

1,6,12,22,57

0,14,15,18,58

1,13,23,59

0,9,10,12,60

1,3,7,19,61

0,8,17,62

1,3,9,18,63

0,4,24,64

1,16,18,25,65

0,7,9,22,66

1,6,10,67 Equation 19

0,1,2,3,6,9,10,11

0,3,4,5,6,7,8,9,11,12

0,1,3,4,8,10,12,13

1,2,4,5,6,7,8,9,10,13

0,1,11,14

0,1,5,7,11,15

0,5,7,9,11,16

1,5,7,11,13,17

0,1,12,18

1,8,10,11,19

0,1,6,7,20

0,7,9,13,21

1,3,11,22

0,1,8,13,23

1,6,11,13,24

0,10,11,25

1,9,11,12,26

1,5,11,12,27

0,6,7,28

0,1,10,29

1,4,11,30

0,8,13,31

1,2,32

0,3,5,33

1,2,9,34

0,5,35

2,7,12,13,36

0,6,37

1,2,5,38

0,4,39

2,5,7,9,40

1,13,41

0,5,12,42

2,7,10,43

0,12,13,44

1,5,11,45

0,2,7,46

10,13,47

1,5,11,48

0,7,12,49

2,10,13,50

1,5,11,51 Equation 20

It is clear from a review of the base matrix in FIG. 19A and the base matrix in FIG. 20A that they have different weight distributions or degree distributions.

In general, it is theoretically well known that the performance of an LDPC code having an ideal condition (assuming infinite length) is proportional to the average density of the weight. However, in the case of an LDPC code used in an actual system having a finite (limited) length, the result is different from the theoretical analysis. Accordingly, if the ranges of length to be supported in an actual communication or broadcasting system are different, designing base matrices to have different distributions is advantageous to supporting good performance.

Moreover, the base matrix in FIG. 20A can basically support a lower code rate than the base matrix in FIG. 19A without applying a shortening method, and it can be understood therefrom that the base matrices in FIG. 19A and FIG. 20A are considered and designed such that supported length and code rate ranges are different. It can be actually understood that the weight density of the base matrix in FIG. 20A is substantially lower than in FIG. 19A. This is because, in the case of FIG. 20A, the design has been determined to exhibit a good performance with a relatively short length.

Reference will first be made to the flowchart in FIG. 21 to describe a method for selecting the base matrix or index matrices corresponding thereto in connection with a method and an apparatus for LDPC encoding and decoding based on two or more different base matrices described above.

Figure 21:
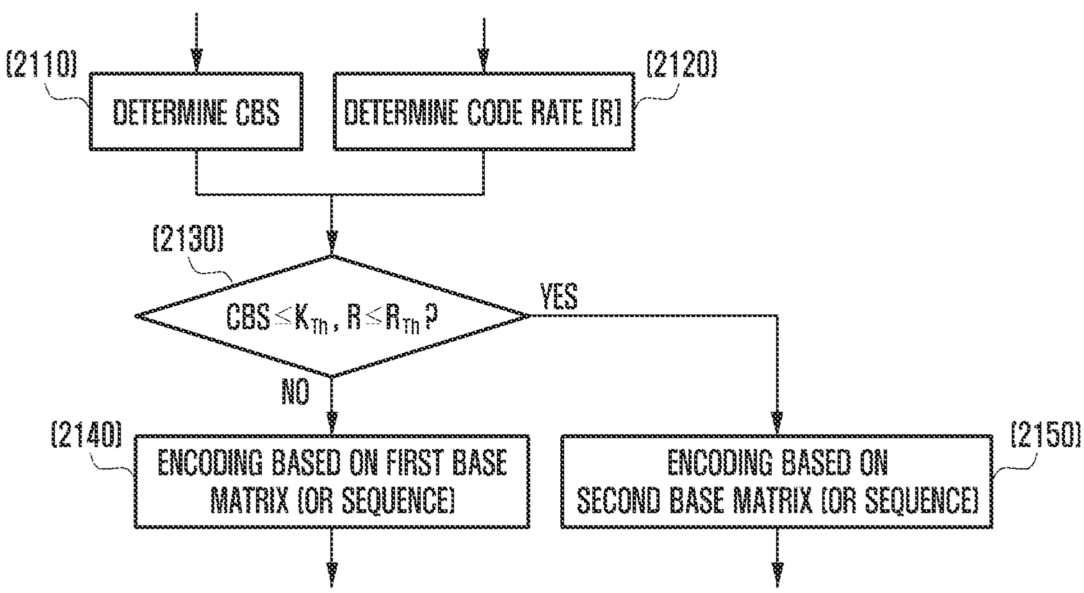
FIG. 21 is a diagram illustrating an exemplary method for determining a base matrix according to a CBS and a code rate by a transmitter.

FIG. 21 is a diagram illustrating an exemplary method for determining a base matrix according to a CBS and a code rate by a transmitter.

If a modulation and coding scheme (MCS) for transmission is determined by the system, the transmitter may determine a CBS and an initial transmission code rate corresponding thereto in steps 2110 and 2120, respectively.

Thereafter, the transmitter may compare the determined CBS value with a predetermined reference value $K_{Th}$ and may compare the determined code rate R with a predetermined reference value $R_{Th}$ in step 2130, thereby determining if a specific condition is satisfied.

According to the result of determining whether or not the CBS value and the code rate satisfy the specific condition, the transmitter determines whether to perform LDPC encoding based on the first base matrix or to perform LDPC encoding based on the second base matrix.

Specifically, the determination condition in the example of FIG. 21 may correspond to a case in which the CBS is smaller than the KTh value, and the code rate is smaller than RTh.

Accordingly, if the CBS is smaller than the KTh value, and if the code rate is smaller than RTh, the transmitter may perform LDPC encoding based on the second base matrix in step 2150, and may perform LDPC encoding based on the first matrix in step 2140 in other cases (although it is assumed in the description of the disclosure that the code rate is the initial transmission code rate for convenience of description, the code rate can normally be defined in various types by the system.)

The KTh value in the disclosure may be referred to as a CBS threshold value, and RTh may be referred to as a code rate threshold value. The KTh value and RTh may be configured by the base station or may be configured in advance. The base station may inform the terminal of the above value through RRC signaling or the like.

Figure 22:
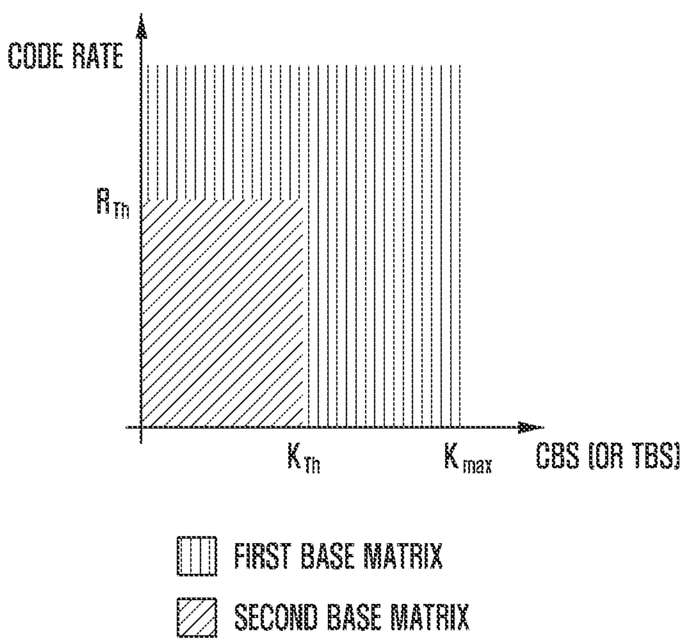
FIG. 22 is a diagram illustrating an exemplary range in which a base matrix is allocated according to a CBS and a code rate.

A case of selecting a base matrix, if such a base matrix selecting method is applied, is illustrated in FIG. 22 to describe the same briefly.

FIG. 22 illustrates a range in which a first base matrix and a second base matrix are selected, provided that the X-axis denotes the CBS, and the Y-axis denotes the initial transmission code rate. The first base matrix in the disclosure may correspond to the base matrix described with reference to FIG. 19A, and the second base matrix in the disclosure may correspond to the base matrix described with reference to FIG. 20A. However, the embodiment of the disclosure is not limited thereto, and the first base matrix may correspond to the base matrix described with reference to FIG. 20A, and the second base matrix may correspond to the base matrix described with reference to FIG. 19A. In addition, the first base matrix and the second matrix in the disclosure may correspond to two different base matrices configured separately.

If a base matrix is selected by using the method illustrated in FIG. 21 and FIG. 22, the selection criterion is simple such that the same can be efficiently implemented by the system. However, as described briefly above, the optimized weight distribution of LDPC codes may greatly differ in terms of the encoding performance, and it is not easy to support a good performance with a specific length and a specific code rate by using the simple method illustrated in FIG. 21 and FIG. 22. In other words, shortening and puncturing are necessarily applied to support various lengths and code rates from two base matrices such as the base matrices in FIG. 19A and FIG. 20A, and it may be difficult to apply shortening and puncturing techniques corresponding to a good weight distribution by using the method illustrated in FIG. 21 and FIG. 22.

Particularly, design of the base matrix in FIG. 19A is based on a case in which the maximum initial transmission code rate is relatively high, and the CBS is large, and design of the base matrix in FIG. 20A is based on a case in which the maximum initial transmission code rate is relatively lower than the maximum initial transmission code rate of FIG. 19A, and the CBS is relatively small. Accordingly, it is difficult to support a good performance, by using the method illustrated in FIG. 21 and FIG. 22, if the CBS is small and if the code rate is high.

In order to solve such a problem, the disclosure proposes the method illustrated in FIGS. 23A, 23B, 24A, 24B, 25, 26A, and 26B. The largest difference between the flowchart of FIG. 21 and the flowchart of FIGS. 23A, 23B, 24A, and 24B proposed in the disclosure is that the criterion for determining the size of the CBS may be variable according to the code rate, or the criterion for determining the size of the code rate may be variable according to the size of the CBS.

Figure 23A:
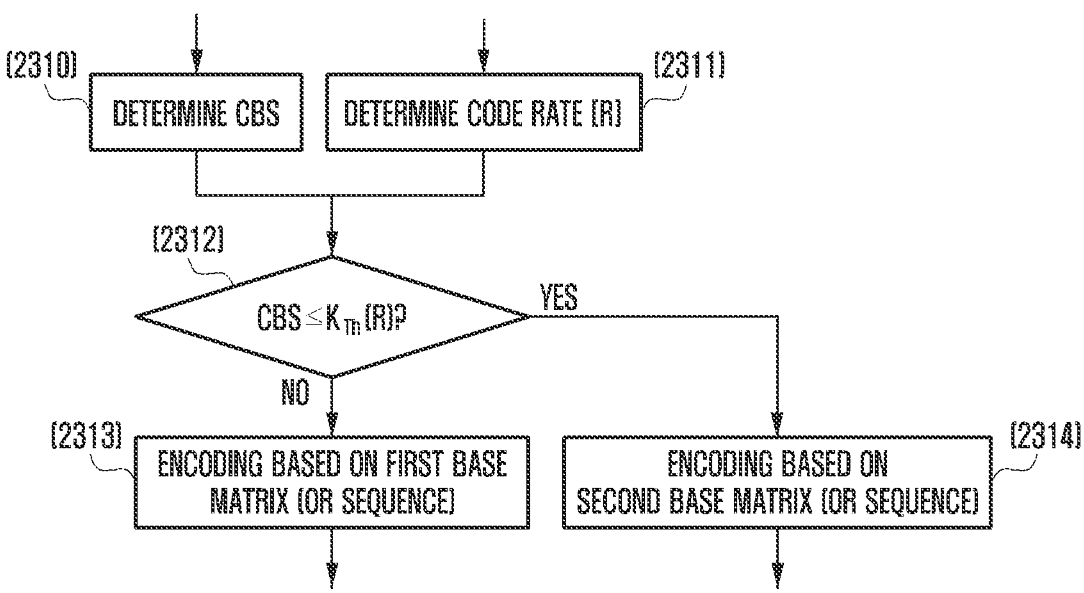
FIG. 23A and FIG. 23B are diagrams illustrating exemplary methods for determining a base matrix according to a CBS and a code rate by a transmitter and a receiver, respectively.
Figure 23B:
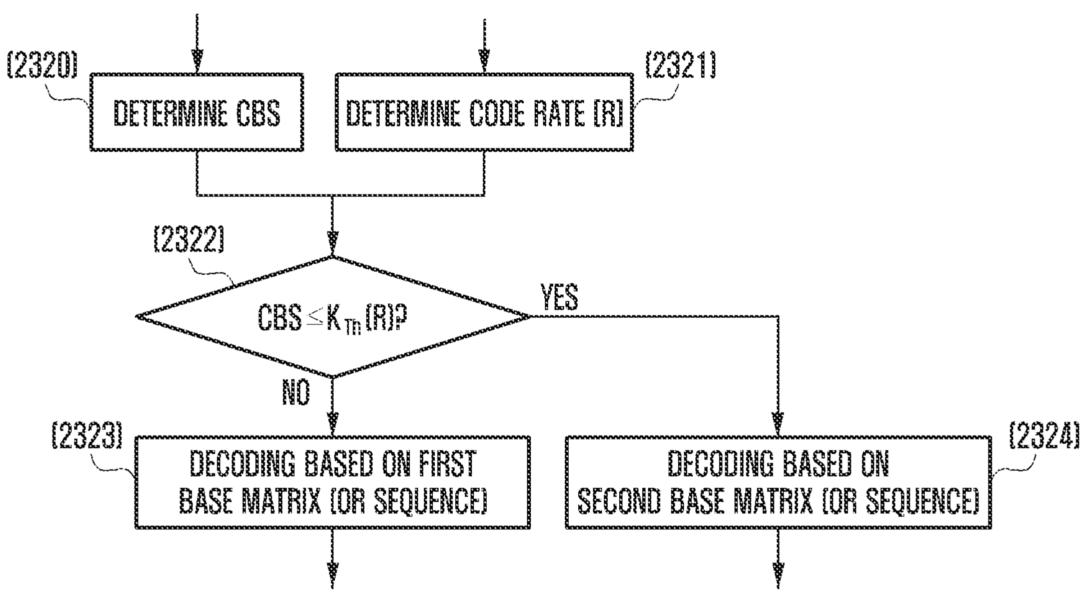

FIG. 23A and FIG. 23B are diagrams illustrating exemplary methods for determining a base matrix according to a CBS and a code rate by a transmitter and a receiver, respectively.

Referring to the transmitting operation illustrated in FIG. 23A, the CBS and the initial transmission code rate are determined in steps 2310 and 2311, respectively.

Thereafter, the transmitter may determine in step 2312 whether or not the CBS value satisfies a specific condition. For example, the transmitter may compare the determined CBS value with a predetermined reference value, and the reference value may be differently configured according to the code rate. Accordingly, the reference value may be normally expressed like a function regarding R, such as $K_{Th}(R)$.

As such, after determining if a specific condition is satisfied in step 2312, the transmitter may determine, according to the result of determination, whether to perform LDPC encoding based on the first base matrix or to perform LDPC encoding based on the second base matrix, and the detail content is similar to that described with reference to FIG. 21.

The operation of the receiver may be illustrated as in FIG. 23B. The CBS and the initial transmission code rate are determined in steps 2320 and 2321, respectively.

Thereafter, the receiver may determine in step 2322 whether or not the CBS value satisfies a specific condition. For example, the receiver may compare the determined CBS value with the predetermined reference value $K_{Th}(R)$, and the reference value may be configured differently according to the code rate. Detailed content thereof is as described above.

Accordingly, after determining if a specific condition is satisfied, the receiver may determine, according to the result of determination, whether to perform LDPC decoding based on the first base matrix or to perform LDPC decoding based on the second base matrix, and the detailed content thereof is similar to that described with reference to FIG. 21.

Figure 24A:
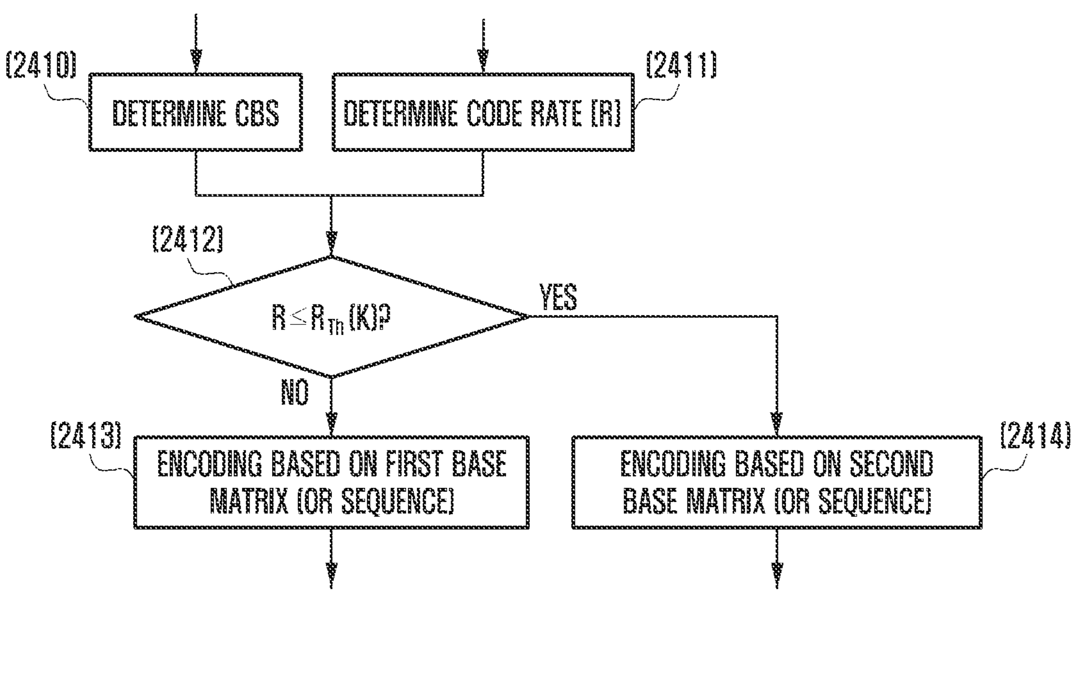
FIG. 24A and FIG. 24B are diagrams illustrating other exemplary methods for determining a base matrix according to a CBS and a code rate by a transmitter and a receiver, respectively.
Figure 24B:
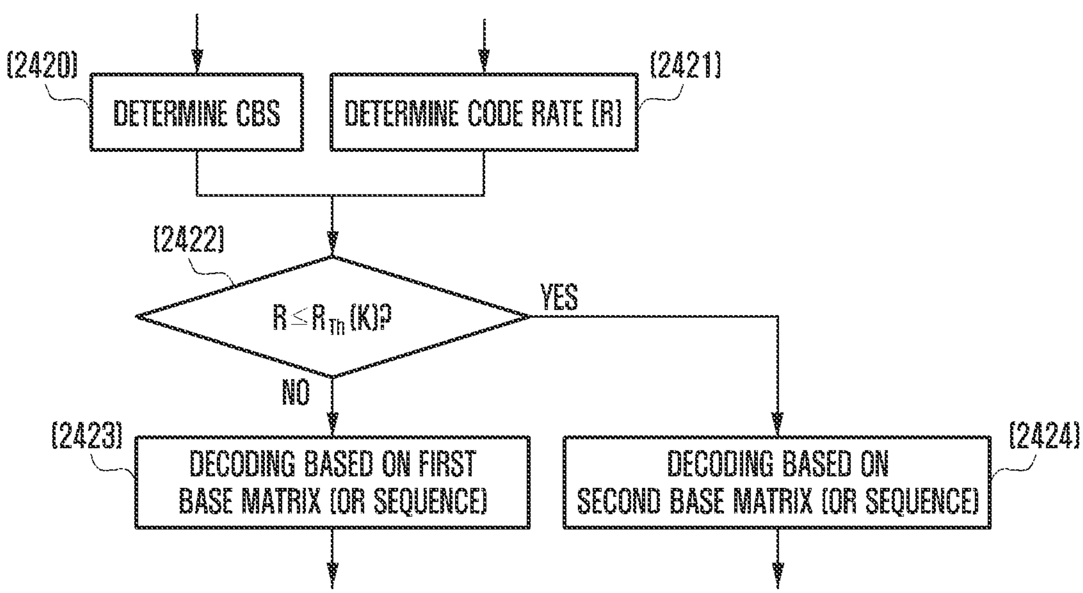

FIG. 24A and FIG. 24B are diagrams illustrating exemplary methods for determining a base matrix according to a CBS and a code rate by a transmitter and a receiver, respectively.

Referring to the transmitting operation illustrated in FIG. 24A, the CBS and the initial transmission code rate are determined in steps 2410 and 2411, respectively.

Thereafter, the transmitter may determine in step 2412 whether or not the CBS value satisfies a specific condition. For example, the transmitter may compare the determined CBS value with a predetermined reference value, and the reference value may be differently configured according to the CBS value. Accordingly, the same may be normally expressed like a function regarding K, such as RTh(K).

As such, after determining if a specific condition is satisfied in step 2412, the transmitter may determine, according to the result of determination, whether to perform LDPC encoding based on the first base matrix or to perform LDPC encoding based on the second base matrix, and the detail content is similar to that described with reference to FIG. 21.

The operation of the receiver may be illustrated as in FIG. 24B. The CBS and the initial transmission code rate are determined in steps 2420 and 2421, respectively.

Thereafter, the receiver may determine in step 2422 whether or not the transmission code rate satisfies a specific condition. For example, the receiver may compare the determined transmission code rate with the predetermined reference value RTh(K), and the reference value may be configured differently according to the CBS value. Detailed content thereof is as described above.

Accordingly, after determining if a specific condition is satisfied, the receiver may determine, according to the result of determination, whether to perform LDPC decoding based on the first base matrix or to perform LDPC decoding based on the second base matrix, and the detailed content thereof is similar to that described with reference to FIG. 21.

Figure 25:
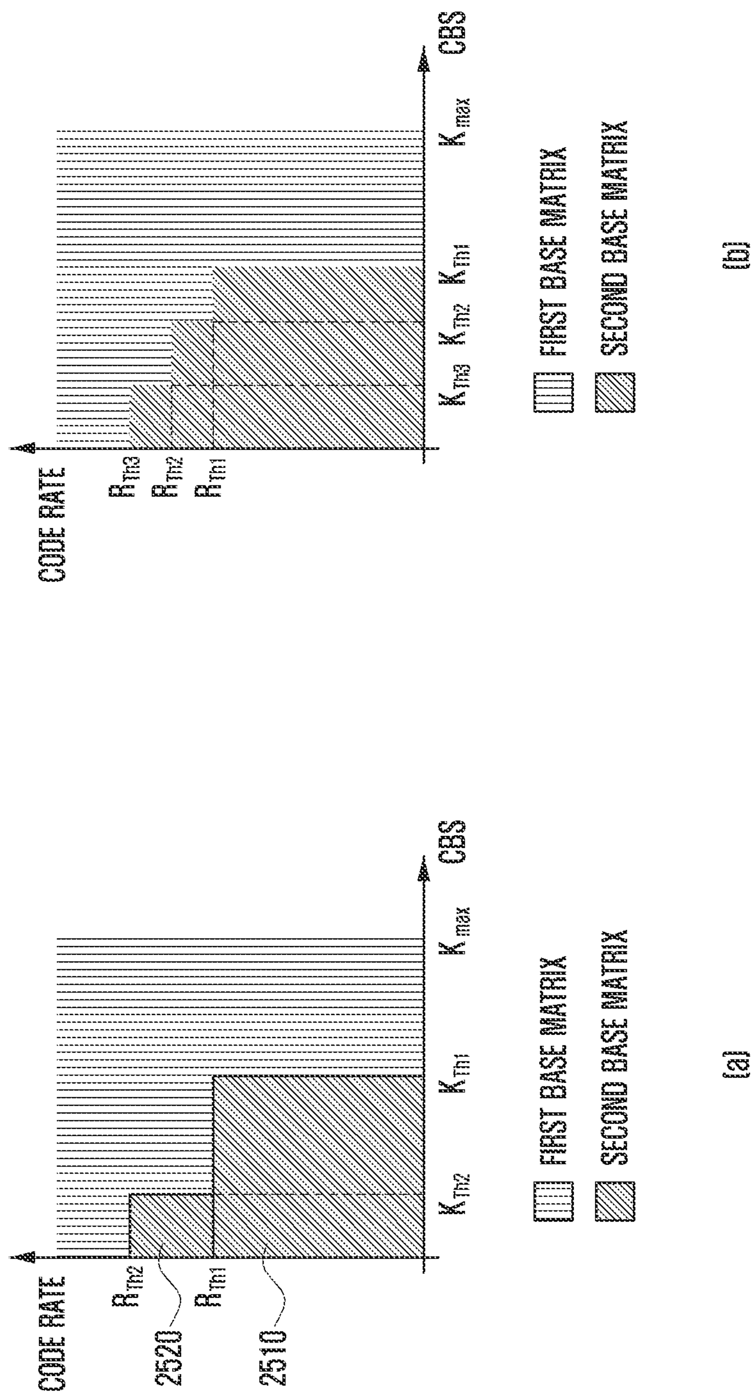
FIG. 25 is a diagram illustrating another exemplary range in which a base matrix is allocated according to a CBS and a code rate.
Figure 26A:
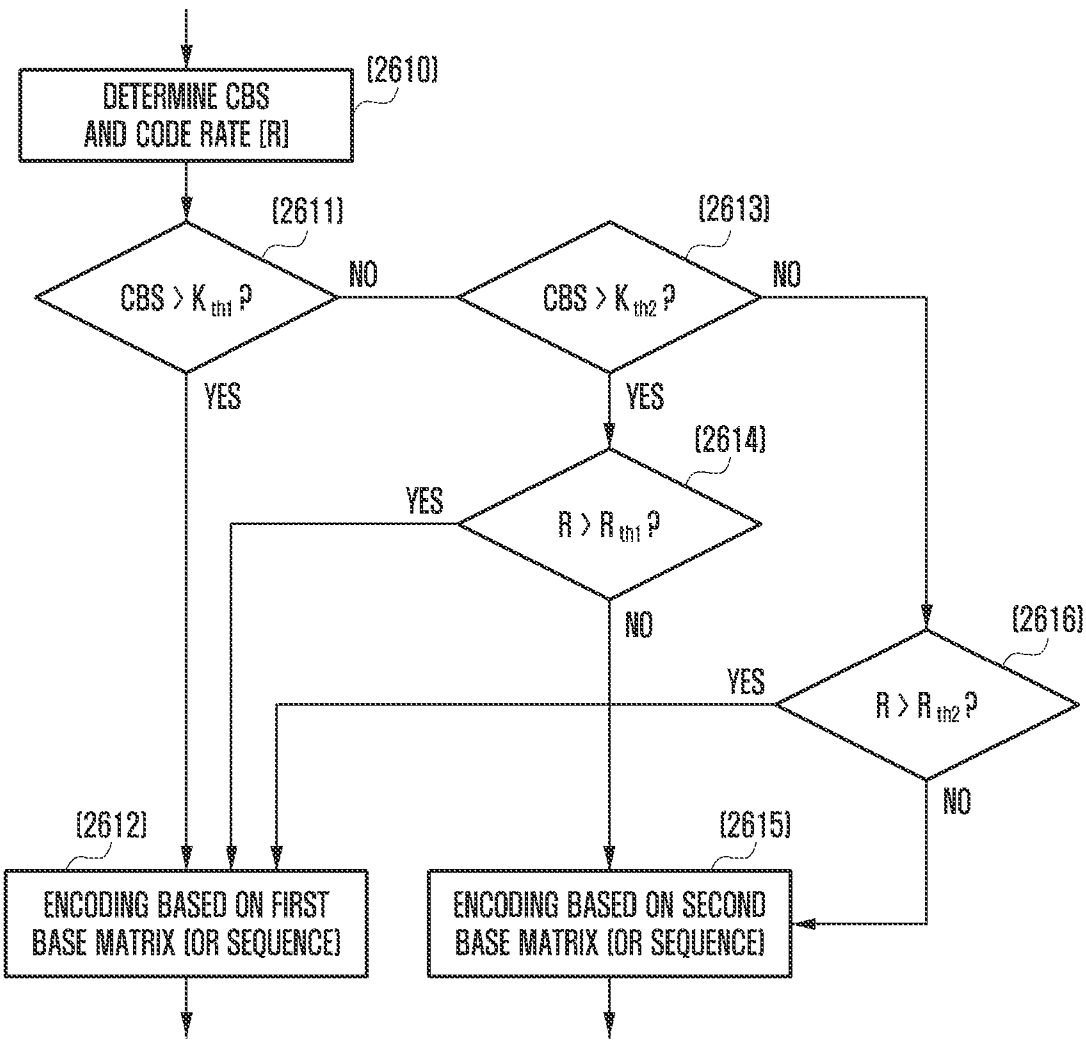
FIG. 26A and FIG. 26B are diagrams illustrating other exemplary methods for determining a base matrix according to a CBS and a code rate by a transmitter and a receiver, respectively.
Figure 26B:
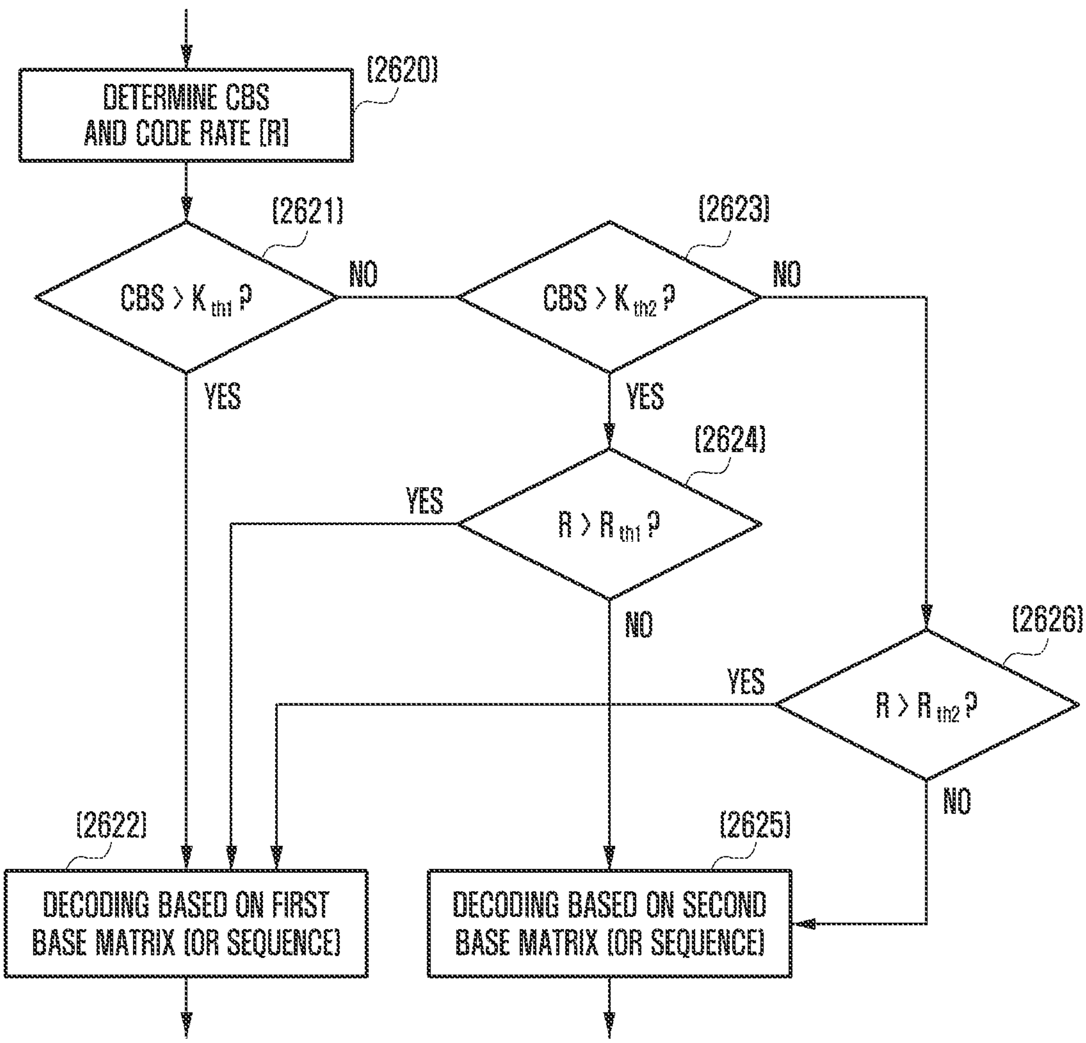

The specific example of applying a base matrix according to the CBS or transmission code rate value, which has been applied in the flowcharts illustrated in FIGS. 23A, 23B, 24A, and 24B, is illustrated in FIGS. 25, 26A, and 26B.

FIG. 25 illustrates a range in which a base matrix is allocated in a case in which KTh (R) is defined as a constant function according to a range of R, or RTh (K) value is defined as a constant function according to K value.

For example, the CBS threshold value KTh (R) may be configured to have a first CBS threshold value KTh1 if 0<R<first coding rate threshold value RTh1, to have a second CBS threshold value KTh2 if RTh1<R<second code rate threshold value RTh2, and to have a value of 0 if R>RTh2.

Accordingly, the transmitter and the receiver may use the second base matrix in a range in which the CBS is smaller than KTh (R) according to FIG. 23A and FIG. 23B, and the range in which the second base matrix is used is as illustrated in FIG. 25A.

The range in which the CBS is smaller than KTh (R) may be, specifically, the range 2510 in which, if R is smaller than RTh1, the size of CBS is smaller than KTh1, and may be the range in which, if R is larger than RTh1 and smaller than RTh2, CBS size is smaller than KTh2.

Alternatively, the code rate threshold value RTh (K) may be configured to have a value of RTh1 if 0<K<KTh1, to have a value or RTh2 if KTh1<K<KTh2, and to have a value of 0 if K>KTh2.

In such a case, the transmitter and the receiver may use the second base matrix in the range in which R is smaller than RTh (K) according to FIG. 24A and FIG. 24B, and the range in which the second base matrix is used is as illustrated in FIG. 25A.

In addition, the embodiment of the disclosure is not limited thereto, and a CBS threshold value may be configured according to three code rate threshold values, or a code rate threshold value may be determined by three CBS threshold values. In this case, a base matrix may be used according to the range illustrated in FIG. 25B.

Figure 27:
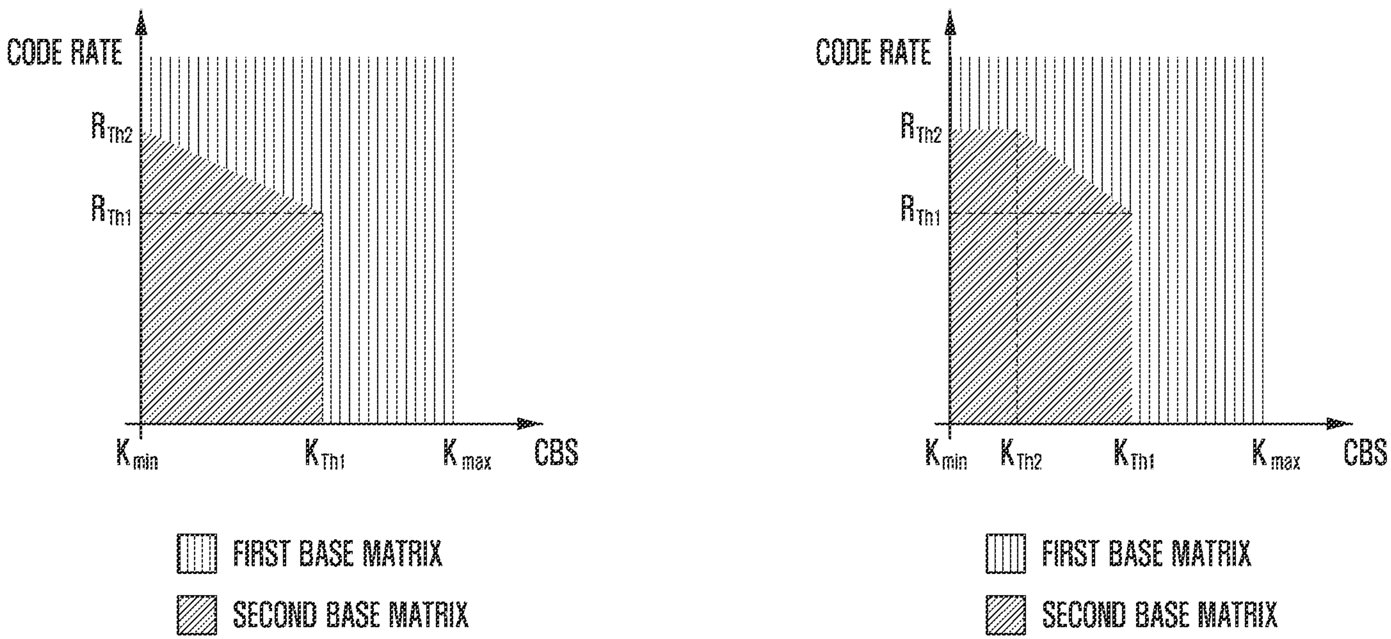
FIG. 27 is a diagram illustrating another exemplary range in which a base matrix is allocated according to a CBS and a code rate.

In addition, the CBS threshold value may be determined as a linear function regarding the code rate, or the code rate threshold value may be determined as a linear function regarding the CBS. In this case, a base matrix may be used according to the range illustrated in FIG. 27A or FIG. 27B. Detailed content thereof will be described later.

FIG. 25 is a diagram illustrating another exemplary range in which a base matrix is allocated according to a CBS and a code rate.

Referring to FIG. 25A first, the reference value regarding the CBS has two values of $K_{Th1}$ and $K_{Th2}$, and has reference values $R_{Th1}$ and $R_{Th2}$ regarding code rates corresponding to reference values of each CBS.

Another example of a flowchart regarding the system operation, in connection with the case of FIG. 25A, is illustrated in FIG. 26.

FIG. 26A and FIG. 26B are diagrams illustrating other exemplary methods for determining a base matrix according to a CBS and a code rate by a transmitter and a receiver, respectively.

Referring to FIG. 26A, the transmitter may determine a CBS and a code rate R in step 2610.

In addition, the transmitter may compare the determined CBS value with a first CBS reference value $K_{Th1}$ in step 2611.

If the CBS value is larger than $K_{Th1}$, the transmitter performs LDPC encoding based on the first base matrix in step 2612.

If the CBS value is not larger than KTh1, the transmitter may again compare the CBS value with a second CBS reference value $K_{Th2}$ in step 2613.

If the CBS value is larger than $K_{Th2}$, the transmitter may compare the code rate determined in step 2610 with a first code rate reference value $R_{Th1}$ in step 2614. If the code rate is larger than $R_{Th1}$, the transmitter may perform LDPC encoding based on the first base matrix in step 2612; otherwise, the transmitter may perform LDPC encoding based on the second base matrix in step 2615.

If the determined CBS value is not larger than $K_{Th2}$ in step 2613, the transmitter may compare the code rate determined in step 2610 with a second code rate reference value $R_{Th2}$ in step 2616. If the code rate is larger than $R_{Th2}$, the transmitter performs LDPC encoding based on the first base matrix in step 2612; otherwise, the transmitter performs LDPC encoding based on the second base matrix in step 2615.

The operation in the receiver may also be illustrated similarly to FIG. 26A, as in FIG. 26B.

The receiver may determine a CBS and a code rate R in step 2620.

In addition, the receiver may compare the determined CBS value with a first CBS reference value $K_{Th1}$ in step 2621.

If the CBS value is larger than $K_{Th1}$, the receiver performs LDPC decoding based on the first base matrix in step 2622.

If the CBS value is not larger than $K_{Th1}$, the receiver may again compare the CBS value with a second CBS reference value $K_{Th2}$ in step 2623.

If the CBS value is larger than $K_{Th2}$, the receiver may compare the code rate determined in step 2620 with a first code rate reference value $R_{Th1}$, in step 2624. If the code rate is larger than $R_{Th1}$, the receiver may perform LDPC decoding based on the first base matrix in step 2622; otherwise, the receiver may perform LDPC decoding based on the second base matrix in step 2625.

If the determined CBS value is not larger than $K_{Th2}$ in step 2623, the receiver may compare the code rate determined in step 2620 with a second code rate reference value $R_{Th2}$ in step 2626. If the code rate is larger than $R_{Th2}$, the receiver performs LDPC decoding based on the first base matrix in step 2622; otherwise, the receiver performs LDPC encoding based on the second base matrix in step 2625.

Although LDPC encoding and decoding based on a first base matrix and a second base matrix have been described with reference to the example in FIG. 25 and FIG. 26 for convenience of description, two or more index matrices, LDPC sequences, or the like may be used, if necessary, to apply LDPC encoding in step 2612 or step 2615 and to apply LDPC decoding in step 2622 or step 2625. Moreover, although the CBS may be used to determine the LDPC base matrices, index matrices, or sequences, the TBS value may also be used to determine the same if necessary, and both CBS and TBS may be considered to determine the same.

FIG. 25B is a diagram illustrating an example of configuring three reference values regarding the CBS and three reference values regarding the code rate. If LDPC encoding and decoding are performed based on multiple base matrices or LDPC index matrices or sequences corresponding thereto in such a manner, the more reference values are configured, the more optimized performance can normally be supported, but there is a drawback in that the system complexity increases. Therefore, it is necessary to appropriately configure reference values according to the system requirement.

The LDPC encoding and decoding processes illustrated in FIGS. 25, 26A, and 26B can be summarized as follows:

Firstly, the transmitter or receiver performs a process of determining the CBS (K) in the system and a process of determining the code rate (R). In addition, a process of determining the block size (Z) is also necessary for encoding and decoding of an LDPC code that can be defined by a parity-check matrix of a type as in Equation 3 to Equation 6.

In addition, the transmitter or receiver may confirm whether or not the CBS or code rate satisfies a predetermined condition, and may determine, according to the result of confirmation, whether to use the first base matrix or to use the second base matrix.

Specifically, the transmitter or receiver performs a process of comparing the determined CBS with at least one of a predetermined first CBS reference value $K_{Th1}$ or a second CBS reference value $K_{Th2}$.

Thereafter, if the CBS (K) is not larger than the first CBS reference value $K_{Th1}$, the transmitter or receiver may perform a process of comparing the determined code rate (R) with at least one of a predetermined first code rate reference value $R_{Th1}$ and a second code rate reference value $R_{Th2}$.

In addition, the transmitter or receiver performs a process of determining the LDPC base matrix, exponent matrix, or sequence according to the result of comparing the code rate (R) and the reference value.

LDPC encoding and decoding are performed based on the LDPC base matrix, exponent matrix, or sequence finally determined as such, and the block size (Z). In the process of determining the LDPC base matrix, exponent matrix, or sequence, lifting as defined in Equation 17 or Equation 18 may be additionally applied.

The method proposed in the disclosure may predefine reference values as specific values, but the same may also be defined normally through various methods. For example, the ranges regarding the CBS and the code rate may be configured in various types as in FIG. 27A and FIG. 27B so as to support more excellent performance.

In the case of FIG. 27A, one reference value is configured regarding the CBS, but the reference value of the code rate has a linear function form regarding the CBS value K as defined in Equation 21 below:

$$R_{Th}=A(K-K_{Th1})+R_{Th1},\ K_{min}\le K\le K_{Th1}(A<0) \quad \text{Equation 21}$$

It is clear from a review of Equation 21 above that the reference value $R_{Th}$ regarding the code rate decreases with regard to the CBS value K. If $R_{Th2}$ is predetermined as in FIG. 27A and configured as a linear function, A corresponding to the inclination value in Equation 21 may be defined as in Equation 22 below:

$$A=\frac{R_{Th1}-R_{Th2}}{K_{Th1}-K_{min}} \quad \text{Equation 22}$$

Equation 22 above is only an example, and may be defined as various values.

In the case of FIG. 27B, a linear function and a constant function are appropriately combined as in Equation 23 below:

$$R_{Th}=\begin{cases} R_{Th2} & K\le K_{Th2} \\ A(K-K_{Th1})+R_{Th1} & K_{Th2}<K\le K_{Th1} \end{cases},\quad \left(A=\frac{R_{Th1}-R_{Th2}}{K_{Th1}-K_{Th2}}\right) \quad \text{Equation 23}$$

The disclosure described with reference to FIG. 21 to FIG. 27 has proposed a method for determining an appropriate LDPC base matrix, exponent matrix, or sequence from the CBS, TBS, code rate, or the like. In the process of determining the LDPC base matrix, exponent matrix, or sequence, a method of selecting the LDPC base matrix, exponent matrix, or sequence according to a predetermined reference value, as defined in Equation 21 to Equation 23, has been applied. In connection with the reference value, the code rate reference value may be varied according to the CBS or TBS. To the contrary, the CBS (or TBS) reference value may be varied according to the code rate. In addition, the reference values may be simply determined by the CBS, TBS, or code rate, and may be determined in a different manner according to the system requirement. For example, the same may be adjusted according to the amount of overhead applied to a frame through which data is transmitted in the system, and the same may be appropriately changed according to the modulation order such that the performance is further improved.

The method for selecting the LDPC base matrix, exponent matrix, or sequence is not necessarily determined by using the CBS, TBS, code rate, or the like. For example, it is possible to support a method for selecting an LDPC sequence having the same effect by using the MCS or the index thereof $I_{MCS}$, the TBS or the index thereof $I_{TBS}$, or a TBS table defined from a physical resource block number $N_{PRB}$, as in the case of the LTE standard, for example. According to the LTE standard, it is actually easy to determine the accurate or approximate code rate from the MCS index, TBS index, or TBS table defined from the physical resource block. Accordingly, reference values regarding the CBS, TBS, or code rate proposed by the disclosure can be expressed by using the MCS index, TBS index, or physical resource block number $N_{PRB}$ used in the TBS table.

A method for determining an LDPC base matrix or sequence based on the MCS or index thereof $I_{MCS}$, the TBS or the index thereof $I_{TBS}$, or the physical resource block number $N_{PRB}$ and performing LDPC encoding and decoding will be described with reference to a simple embodiment.

As an example, if the MCS is determined in the communication system, the encoding device may determine information regarding the approximate code rate of the channel code. In addition, if the base station allocates an appropriate physical resource block, the TBS can also be determined. After the TBS is determined, the encoding device determines the block size for LDPC encoding. Accordingly, the LDPC base matrix, sequence, or the like for LDPC encoding can be determined based on the MCS information and the block size.

As another example, if the MCS is determined by the communication system, the encoding device can determine the TBS index $I_{TBS}$. In addition, if the base station determines an appropriate physical resource block number $N_{PRB}$, the encoding device can determine the TBS according to the TBS index $I_{TBS}$ and the physical resource block number $N_{PRB}$. After the TBS is determined, the encoding device determines the block size for LDPC encoding, and the LDPC base matrix, sequence, or the like for LDPC encoding can be determined based on the TBS index, the physical resource block number, and the block size.

After the LDPC base matrix, sequence, or the like is determined in this manner, the encoding device can perform LDPC encoding based on the block size. A process of converting the LDPC sequence according to the block size, for the sake of LDPC encoding, may also be included.

The above-described LDPC encoding method may also be applied, through a similar process, to the LDPC decoding process.

Figure 28A:
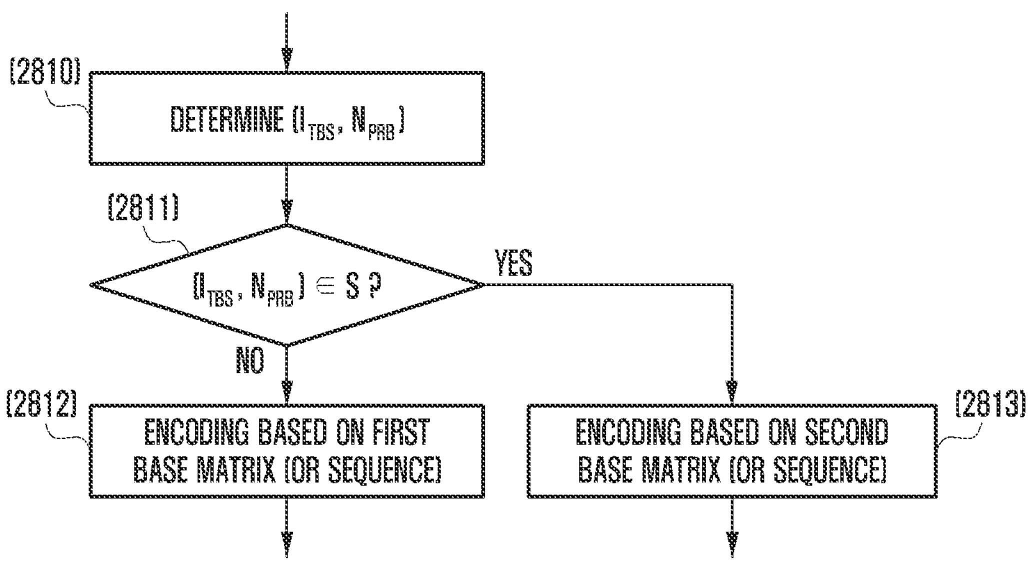
FIG. 28A and FIG. 28B are diagrams illustrating other exemplary methods for determining a base matrix according to a TBS index and the number of resource blocks by a transmitter and a receiver, respectively.
Figure 28B:
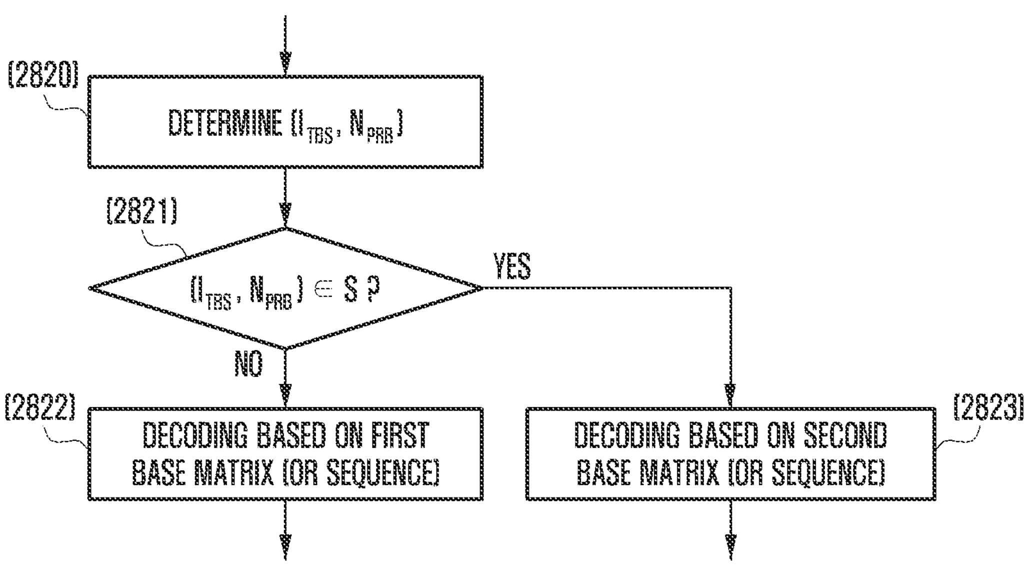

Another embodiment of the disclosure is illustrated in FIGS. 28A and 28B.

FIG. 28A and FIG. 28B are diagrams illustrating other exemplary methods for determining a base matrix according to a TBS index and the number of resource blocks by a transmitter and a receiver, respectively.

Referring first to FIG. 28A, the transmitter may determine ($I_{TBS}$, $N_{PRB}$) in step 2810. In this regard, ($I_{TBS}$, $N_{PRB}$) may be referred to as index information.

In addition, the transmitter confirms in step 2811 if the determined ($I_{TBS}$, $N_{PRB}$) value is included in a predefined set S. The set S refers to a predefined index set regarding ($I_{TBS}$, $N_{PRB}$). The method for determining if the ($I_{TBS}$, $N_{PRB}$) value is included in the predefined set S in step 2811 may be performed through 1:1 comparison between the values determined in step 2810 and the indices or values included in the set S. It is also possible to apply a method of comparing $I_{TBS}$ or $N_{PRB}$ value with each predetermined reference value, thereby determining the range of the value.

The transmitter may determine index information through steps 2810 and 2811, and may determine an appropriate LDPC base matrix, LDPC exponent matrix, or LDPC sequence in step 2812 or 2813 according to the determined ($I_{TBS}$, $N_{PRB}$), thereby performing LDPC encoding.

Specifically, if the index information is included in the index set, the transmitter may perform encoding based on the second base matrix in step 2813. If the index information is not included in the index set, the transmitter may perform encoding based on the first base matrix in step 2812.

The operation of the receiver may be performed almost similarly to the operation of the transmitter in FIG. 28A, as illustrated in FIG. 28B.

The receiver may determine ($I_{TBS}$, $N_{PRB}$) from a reception signal in step 2820. In this regard, ($I_{TBS}$, $N_{PRB}$) may be referred to as index information.

In addition, the receiver confirms in step 2821 if the determined ($I_{TBS}$, $N_{PRB}$) value is included in a predefined set S. The set S refers to a predefined index set regarding ($I_{TBS}$, $N_{PRB}$). The method for determining if the ($I_{TBS}$, $N_{PRB}$) value is included in the predefined set S in step 2821 may be performed through 1:1 comparison between the values determined in step 2820 and the indices or values included in the set S. It is also possible to apply a method of comparing $I_{TBS}$ or $N_{PRB}$ value with each predetermined reference value, thereby determining the range of the value.

The receiver may determine index information through steps 2820 and 282, and may determine an appropriate LDPC base matrix, LDPC exponent matrix, or LDPC sequence in step 2812 or 2813 according to the determined ($I_{TBS}$, $N_{PRB}$), thereby performing LDPC decoding.

Specifically, if the index information is included in the index set, the receiver may perform decoding based on the second base matrix in step 2823. If the index information is not included in the index set, the receiver may perform decoding based on the first base matrix in step 2822.

A method for varying the length of cyclic redundancy check (CRC) bits attached to a transport block according to the determined LDPC base matrix, exponent matrix, or sequence will now be described as another embodiment of the disclosure.

Figure 29:
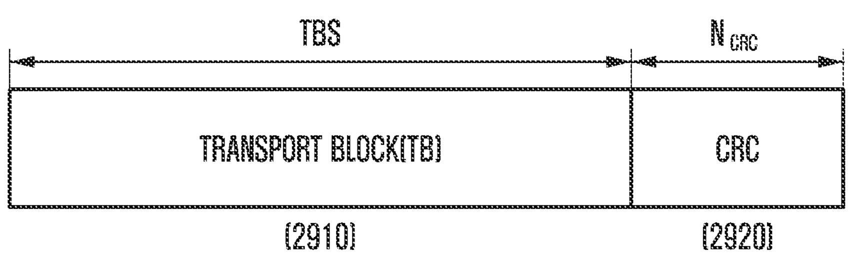
FIG. 29 is a diagram illustrating an example of attachment of a CRC bit to a given transport block.

In general, CRC bits are attached to a transport block as in FIG. 29 in order to determine whether or not errors have occurred when the receiver has decoded data in the transport block.

FIG. 29 is a diagram illustrating an example of attachment of CRC bits to a given transport block.

Referring to FIG. 29, the transmitter may add a CRC 2920 having a length of $N_{CRC}$ to a transport block 2910. The CRC bits play an important role of detecting errors in restored data, but are a kind of overhead from the viewpoint of the system. Accordingly, determining an appropriate bit number is a critical issue for reducing the system overhead.

In the case of CRC bits, in general, the more bits attached, the lower the false alarm rate (FAR) can become (FAR refers to a probability that, although an error occurred to actually restored data, the system fails to recognize the same). Accordingly, an appropriate CRC bit number needs to be determined according to the FAR level required by the system. Particularly, in the case of a system using an LDPC code, the LDPC code itself can lower the FAR to some extent. The system efficiency can be maximized only if CRC bits are determined in view of such characteristics.

In the case of an LDPC code, it is possible to determine whether or not an error has occurred through a syndrome check in the parity-check matrix, due to the characteristics of the decoding process. Accordingly, the CRC bit number needs to be determined in view of the FAR characteristics of the LDPC code used in the communication system to which the LDPC code is applied.

For example, the transmitter determines an LDPC base matrix or sequence corresponding to LDPC encoding, based on the TBS, MCS information, or part of the MCS information. Thereafter, the transmitter confirms which LDPC base matrix or sequence has been determined, and if the same is not the first LDPC base matrix or the LDPC sequence corresponding to the first base matrix, the transmitter determines that the CRC bit number $N_{CRC}$ is a predefined number X. If the first LDPC base matrix has been chosen, the transmitter may determine that the CRC bit number $N_{CRC}$ is a predefined number Y.

In addition, after determining $N_{CRC}$, the transmitter applies CRC encoding to the transport block, thereby generating $N_{CRC}$ CRC bits. In addition, the transmitter attaches the generated CRC bits to the transport block and then appropriately performs LDPC encoding. The block size (Z) value needs to be determined for the LDPC encoding, and the block size value may be determined variably according to the TBS value or the determined LDPC base matrix or sequence. As such, the CRC bit number can be configured differently according to the LDPC base matrix or sequence corresponding to LDPC encoding.

A decoding process corresponding to the encoding process may proceed similarly.

The receiver may first receive a signal including information regarding an LDPC-encoded transport block and CRC bits. From the received signal, the receiver determines an LDPC base matrix or sequence corresponding to LDPC decoding, based on the TBS, MCS information, or part of the MCS information. Thereafter, the receiver confirms which LDPC base matrix or sequence has been determined, and if the same is not the first LDPC base matrix or the LDPC sequence corresponding to the first base matrix, the receiver determines that the CRC bit number $N_{CRC}$ is a predefined number X. If the first LDPC base matrix has been chosen, the receiver may determine that the CRC bit number $N_{CRC}$ is a predefined number Y.

In addition, the receiver performs LDPC decoding with regard to the received LDPC-encoded transport block and CRC bits according to the determined LDPC base matrix or sequence. The block size (Z) value needs to be determined for the LDPC decoding, and the receiver may variably determine the block size value according to the TBS value or the determined LDPC base matrix or sequence. Thereafter, the receiver performs a CRC check in view of the fact that $N_{CRC}$ CRC are attached to the LDPC-decoded transport block, thereby detecting errors.

Figure 30:
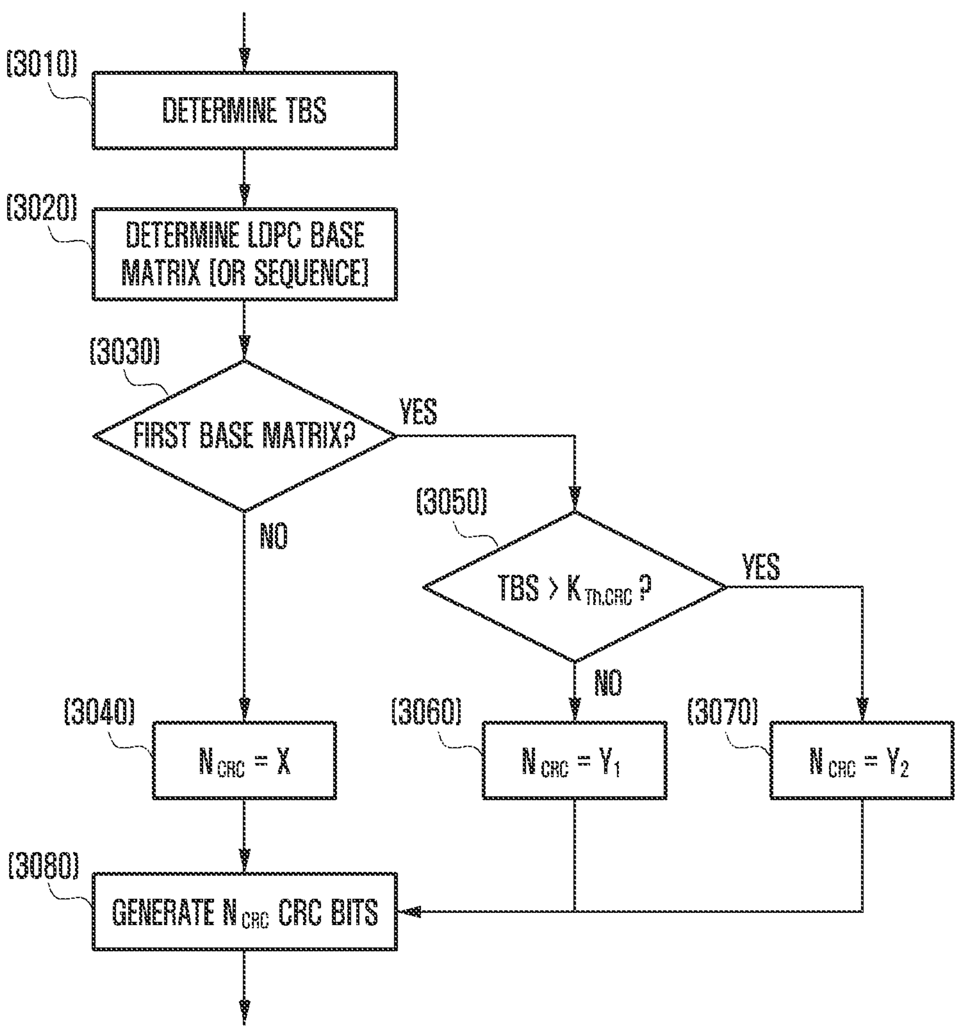
FIG. 30 is an exemplary diagram according to an embodiment of varying the number of CRC bits to be attached to a transport block according to an LDPC base matrix to be applied to encoding.

FIG. 30 is an exemplary diagram regarding another embodiment regarding the method for variably determining, by the transmitter, the number of CRC bits to be attached to a transport block in view of characteristics of the LDPC code described above.

A TBS is determined in step 3010, and the transmitter determines an LDPC base matrix or sequence in step 3020.

In addition, the transmitter determines in step 3030 which LDPC base matrix or sequence has been determined in step 3020. If the first LDPC base matrix or sequence has not been chosen, the transmitter determines that the CRC bit number $N_{CRC}$ is a predetermined number X.

If the first LDPC base matrix or sequence has been chosen, the transmitter determines an appropriate value for the CRC bit number according to the TBS.

Specifically, the transmitter confirms in step 3050 if the TBS is larger than a predetermined reference value $K_{Th,CRC}$. The reference value $K_{Th,CRC}$ may be expressed as a CRC-related CBS threshold value, which is a reference value for determining the length of the CRC. If the TBS is not larger than $K_{Th,CRC}$, the transmitter may determine in step 3060 that $N_{CRC}$ is a predetermined number $Y_1$. If the TBS is larger than the reference value, the transmitter determines in step 3070 that $N_{CRC}$ is a predetermined number $Y_2$. In this case, $Y_1$ and $Y_2$ have difference integer values.

After determining $N_{CRC}$, the transmitter applies CRC encoding to the transport block in step 3080, thereby generating $N_{CRC}$ CRC bits.

In addition, the transmitter attaches the generated CRC bits to the transport block, and then appropriately performs LDPC encoding. The block size (Z) value needs to be determined for the LDPC encoding, and the block size value may be variably determined according to the TBS value or the determined LDPC base matrix or sequence.

Figure 31:
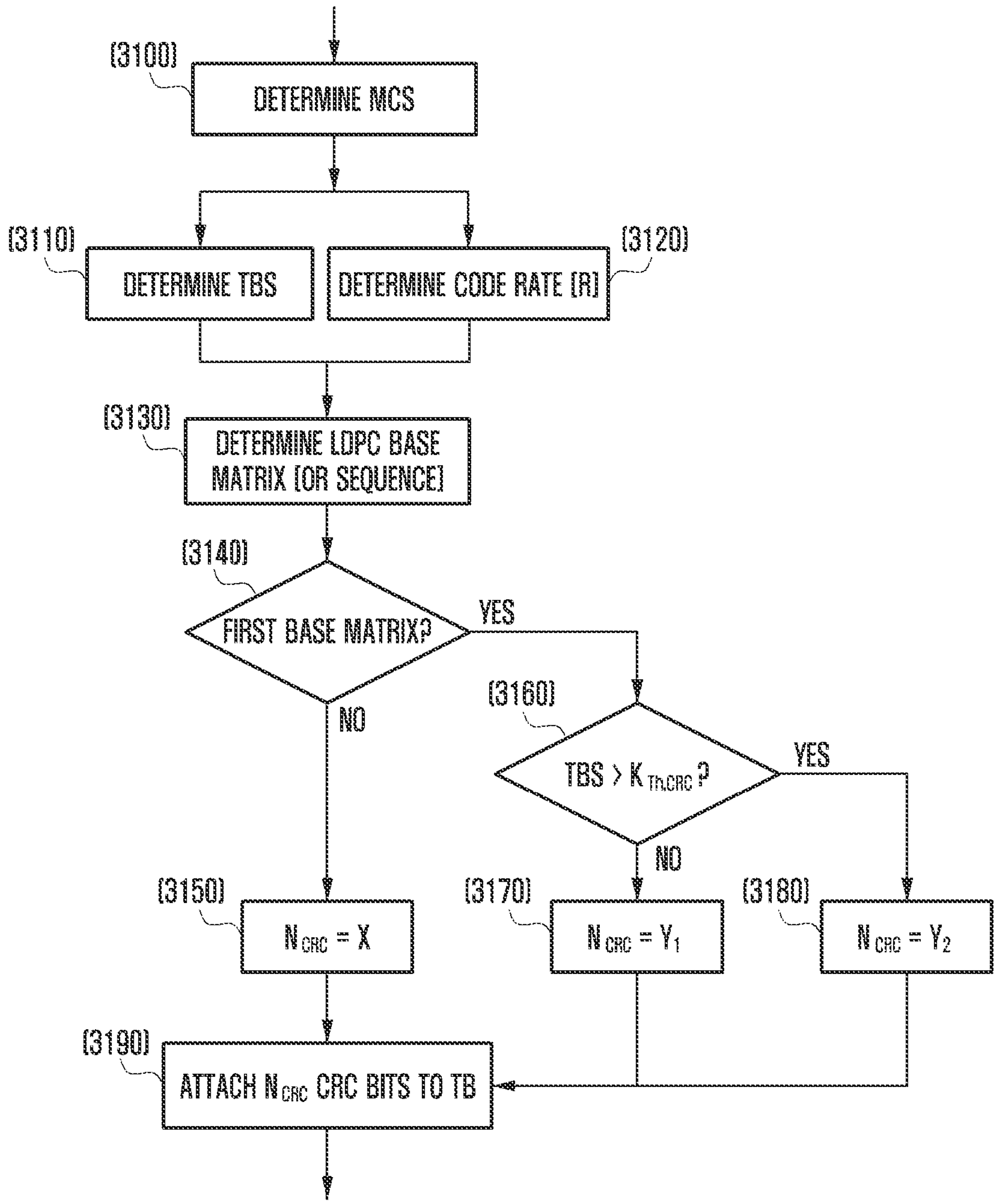
FIG. 31 is an exemplary diagram according to another embodiment of varying the number of CRC bits to be attached to a transport block according to an LDPC base matrix to be applied to encoding.

Another embodiment regarding the method for variably determining, by the transmitter, the number of CRC bits to be attached to a transport block in view of characteristics of the LDPC code is illustrated in FIG. 31.

FIG. 31 is an exemplary diagram according to another embodiment of varying the number of CRC bits to be attached to a transport block according to an LDPC base matrix to be applied to encoding.

If an MCS is determined in step 3100, a TBS and a code rate may be determined according to the MCS in steps 3110 and 3120, respectively.

The transmitter may determine an LDPC base matrix or sequence to perform encoding, in step 3130, according to the TBS and the code rate. As the method for determining the LDPC base matrix or sequence, one of the methods illustrated in FIG. 21 to FIG. 27 or a part thereof may be used. The process of determining the number of CRC bits, after the LDPC base matrix or sequence is determined in step 3130, is identical to the process following step 3030 in FIG. 30.

The transmitter applies CRC encoding to the transport block in step 3190, thereby generating $N_{CRC}$ CRC bits, attaches the generated CRC bits to the transport block, and then appropriately performs LDPC encoding. The block size (Z) value needs to be determined for the LDPC encoding, and the block size value may be variably determined according to the TBS value or the determined LDPC base matrix or sequence.

Figure 32:
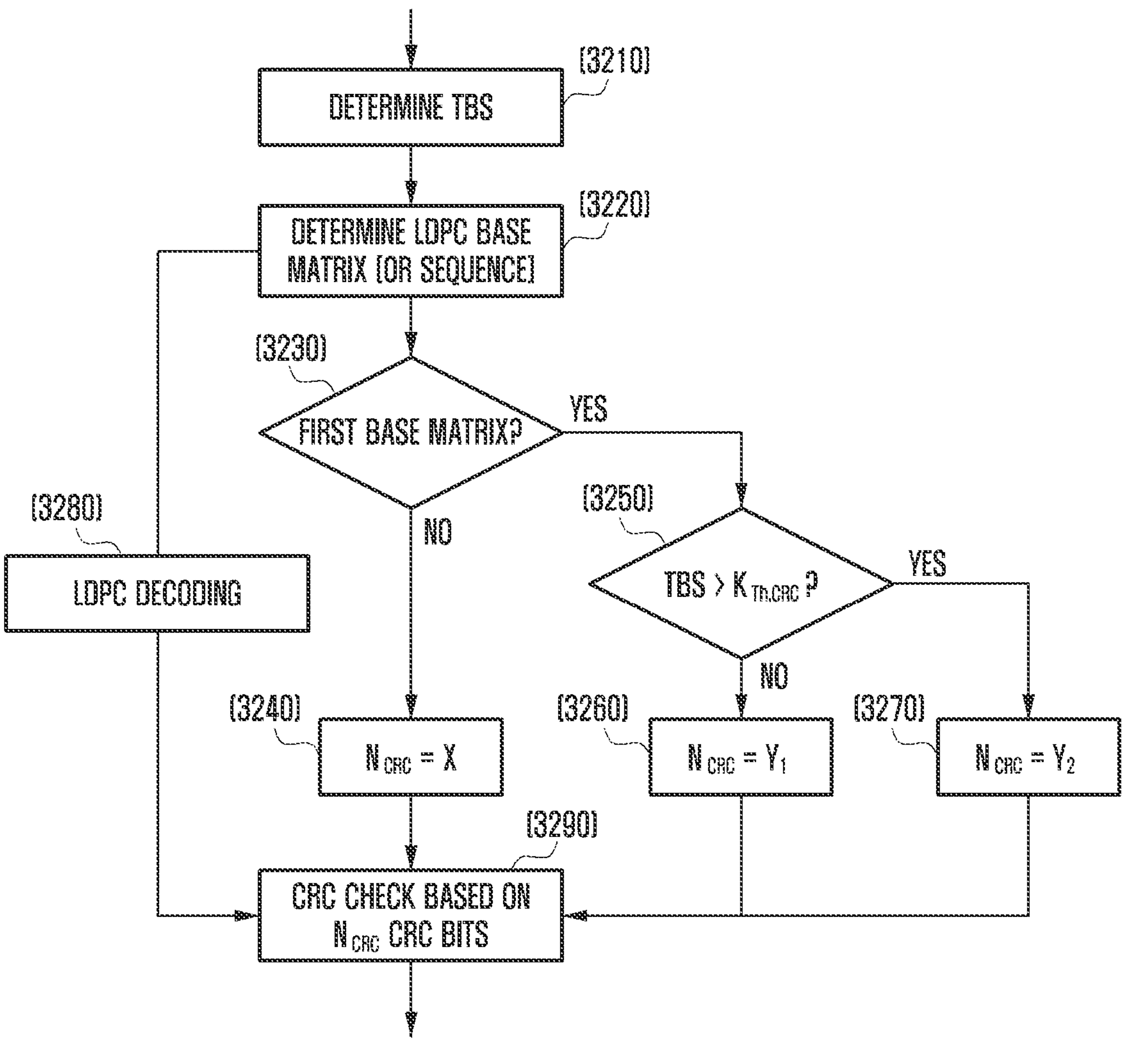
FIG. 32 is an exemplary diagram according to an embodiment of determining the number of CRC bits attached to a transport block according to an LDPC base matrix and accordingly performing a CRC check by a receiver.

FIG. 32 is an exemplary diagram regarding a method for determining, by a receiver, the number of CRC bits attached to a transport block in view of characteristics of an LDPC code and accordingly conducting a CRC check.

The receiver may receive a signal regarding an LDPC-encoded transport block and CRC bits.

Thereafter, a TBS is determined in step 3210, and an LDPC base matrix or sequence is determined in step 3220. The receiver determines in step 3230 which LDPC base matrix or sequence has been determined. If the first LDPC base matrix or sequence has not been chosen, the receiver determines that the CRC bit number $N_{CRC}$ is a predetermined number X.

If the first LDPC base matrix or sequence has been chosen, the receiver determines an appropriate value for the CRC bit number according to the TBS.

Specifically, the receiver confirms in step 3250 whether or not the TBS is larger than a predetermined reference value $K_{Th,CRC}$. The reference value $K_{Th,CRC}$ may be expressed as a CRC-related CBS threshold value, which is a reference value for determining the length of the CRC. If the TBS is not larger than $K_{Th,CRC}$, the receiver may determine in step 3260 that $N_{CRC}$ is a predetermined number $Y_1$. If the TBS is larger than the reference value, the receiver determines in step 3270 that $N_{CRC}$ is a predetermined number $Y_2$. In this case, $Y_1$ and $Y_2$ have difference integer values.

The receiver performs LDPC decoding 3280 with regard to the received LDPC-encoded transport block and CRC bits, in step 3280, according to the LDPC base matrix or sequence determined in step 3220. The receiver then performs a CRC check in final step 3290 in view of the fact that $N_{CRC}$ CRC bits are attached to the LDPC-decoded transport block, thereby detecting errors.

The block size (Z) value needs to be determined for the LDPC decoding, and the block size value may be variably determined according to the TBS value or the determined LDPC base matrix or sequence.

Figure 33:
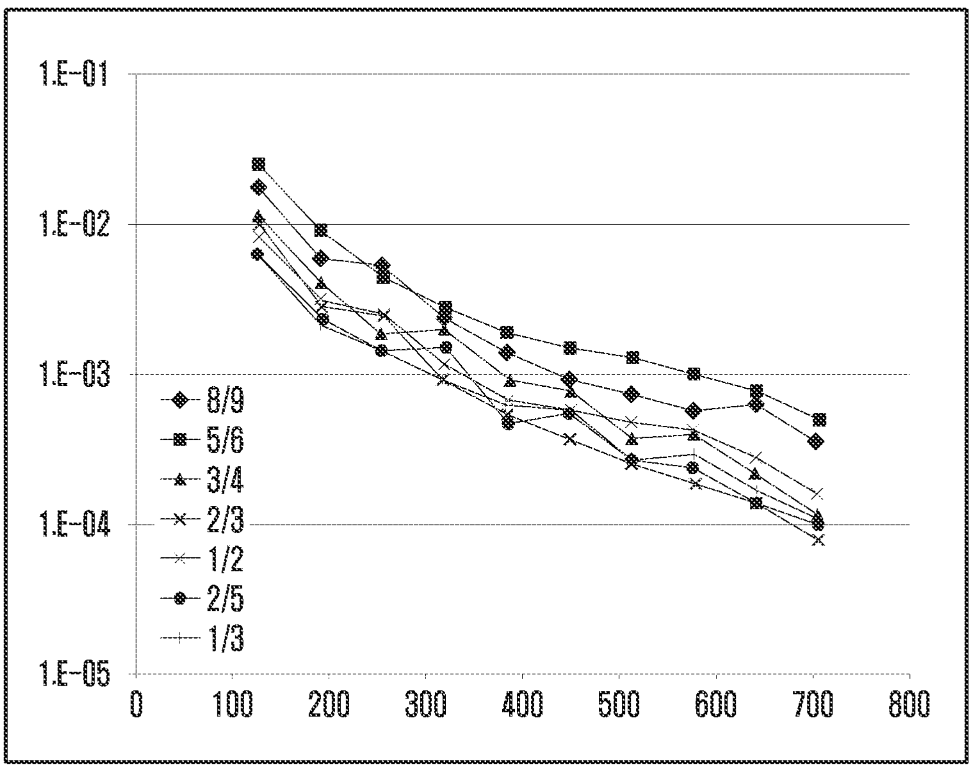
FIG. 33 is an exemplary diagram illustrating an LDPC encoding performance based on the base matrix of FIG. 19A to FIG. 19J.
Figure 34:
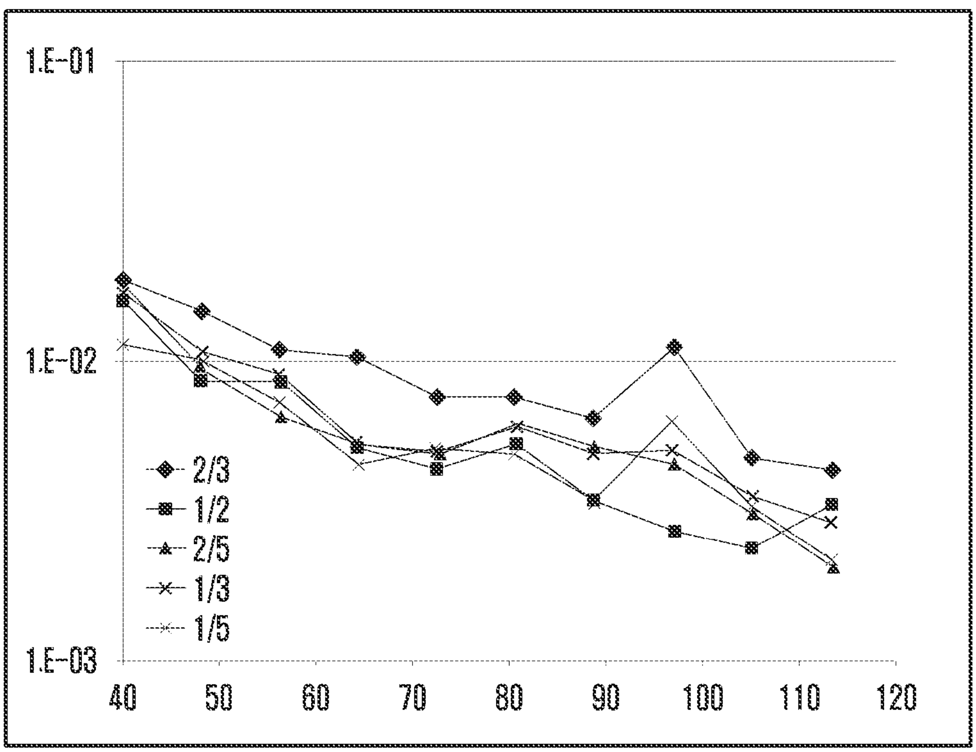
FIG. 34 is an exemplary diagram illustrating an LDPC encoding performance based on the base matrix of FIG. 20A to FIG. 20J.

FIG. 33 and FIG. 34 are diagrams illustrating FAR performance according to each code rate and CBS when LDPC encoding and decoding have been applied based on the base matrix in FIG. 19A and FIG. 20A and Equation 15 to Equation 18.

Assuming that the FAR required by the system is $FAR_T$, at least $(-\log_2(FAR_T))$ bits of CRC bits are necessary to accomplish $FAR_T$ only by CRC. As used herein, (x) refers to the smallest integer among integers equal to or larger than x.

However, as in FIG. 33 and FIG. 34, the LDPC code is advantageous in that CRC bits can be reduced to some extent because some degree of FAR can be overcome by itself through a function such as syndrome check in the decoding process. Theoretically, assuming that the maximum value regarding the FAR that the LDPC code can overcome is $FAR_{LDPC}$, at least $(-\log_2(FAR_{LDPC}))$ bits of CRC bits can be reduced. That is, in a system using LDPC encoding and decoding techniques based on the base matrix of FIG. 19A and FIG. 20A, $FAR_T$ required by the system can be accomplished only by $N_{CRC}$ CRC bits defined as in Equation 24 or Equation 25 below:

$$N_{CRC} = \lceil -\log_2(FAR_T) \rceil - \lfloor -\log_2(FAR_{LDPC}) \rfloor \qquad \text{Equation 24}$$

$$N_{CRC} = \lceil -\log_2(FAR_T) + \log_2(FAR_{LDPC}) \rceil = \left\lceil \log_2\left(\frac{FAR_{LDPC}}{FAR_T}\right) \right\rceil \qquad \text{Equation 25}$$

As a specific example, if $FAR_T=10^{-6}$ is configured by the system, then $(-\log_2(FAR_T))=20$, and thus a total of 20 CRC bits is necessary. However, since the FAR maximum value is close to 0.026 if $128\le K\le 192$ in FIG. 33, $N_{CRC}=15$ can be obtained if the necessary CRC bit number is calculated based on Equation 24 or Equation 25. This consequently means that, if reference value KTh regarding the TBS is configured to be 192 in FIG. 32, the Y1 value can be configured to be equal to or less than $N_{CRC}=15$. Obviously, this is only an example, and various values are applicable according to $FAR_T$, $FAR_{LDPC}$, or other system requirements. If TBS=512 in FIG. 33, the FAR has an approximate value of about 0.0013. If the size of TBS is always 512, only $N_{CRC}=11$ CRC bits are enough to obtain the FAR required by the system.

It can be confirmed that, if the necessary CRC bits are calculated according to the TBS by a similar method in FIG. 34, approximately 12-15 bits are necessary. However, the FAR tends to increase if the TBS size is small and if the code rate is high. In addition, the LDPC encoding and decoding based on the base matrix of FIG. 20A are suitable for supporting a relatively small TBS. Accordingly, if enough CRC bits are used, the overhead increases, while the system stability improves. Considering this, an appropriate CRC bit number needs to be determined.

For example, if $K_{Th}$ is configured to be 512 in FIG. 32, and if a configuration such as X=16, Y1=16, Y2=12 is made, not only the FAR required by the system can be accomplished sufficiently, but the overhead can also be reduced. As another example, even if X=24, Y1=24 are fixed by other system requirements, the overhead reducing effect can be obtained by configuring a lower value such as Y2=12.

It can also be understood that, since the FAR performance in FIG. 33 and FIG. 34 appears differently depending on the code rate, different CRC bit numbers can be applied, in connection with the method for variably determining the number of CRC bits, not only according to the TBS and LDPC base matrix, but also according to the code rate.

Figure 35:
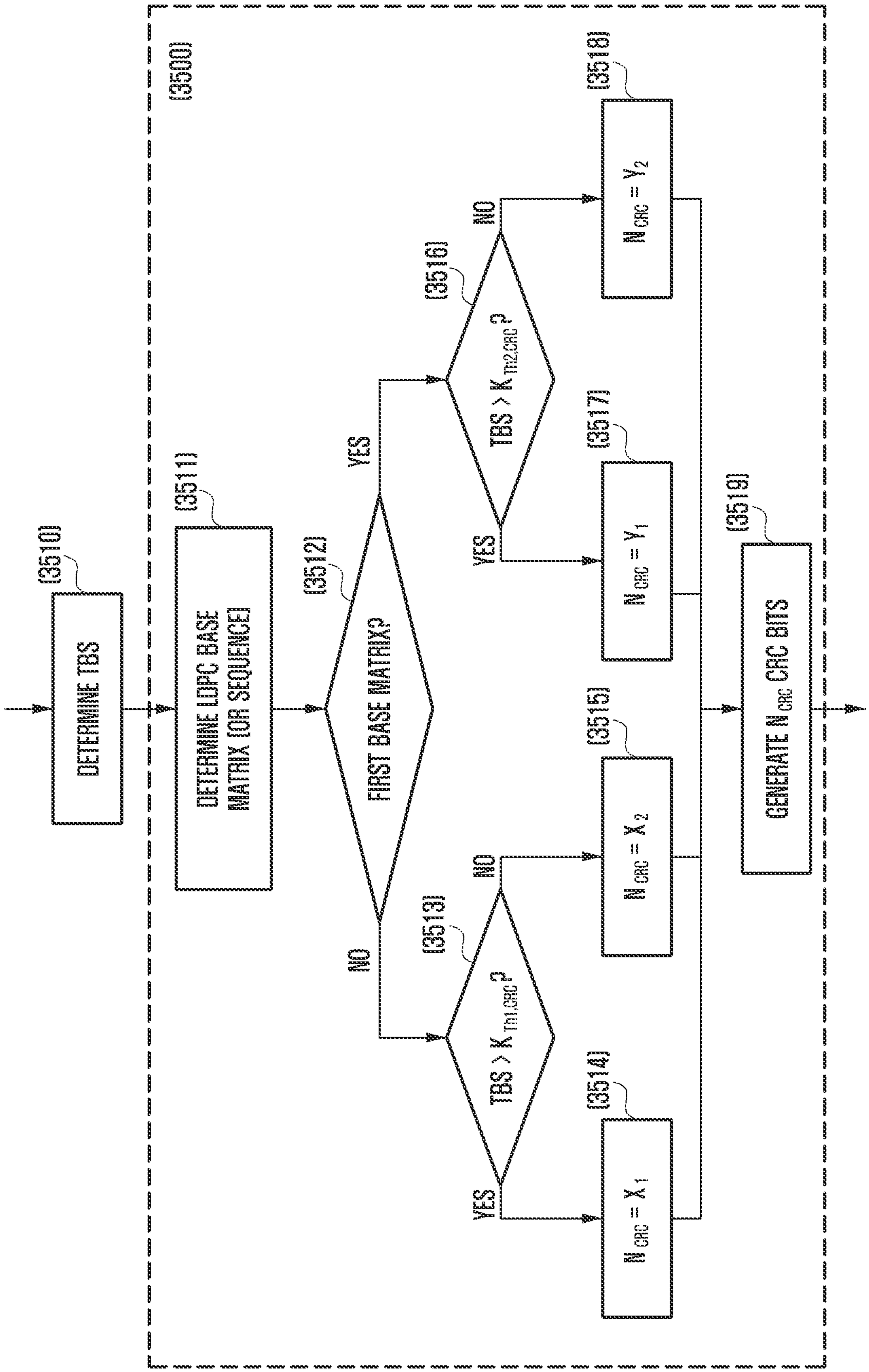
FIG. 35 is another exemplary diagram according to an embodiment of varying the number of CRC bits to be attached to a transport block according to an LDPC base matrix to be applied to encoding.

Another embodiment regarding the method for variably determining, by the transmitter, the number of CRC bits to be attached to a transport block in view of characteristics of the LDPC code is illustrated in FIG. 35 as another embodiment of the disclosure.

FIG. 35 is another exemplary diagram according to an embodiment of varying the number of CRC bits to be attached to a transport block according to an LDPC base matrix to be applied to encoding.

After determining a TBS in step 3510, the transmitter may determine an LDPC base matrix or sequence to perform encoding in step 3511.

It is obvious that, in the process of determining the LDPC base matrix or sequence in step 3511, the same can be determined not only according to the TBS, but also according to other additional conditions. In addition, as the method for determining the LDPC base matrix or sequence, one of the methods illustrated in FIG. 21 to FIG. 27 or a part thereof may be used.

The transmitter confirms in step 3512 which LDPC base matrix or sequence has been determined in step 3511.

If the LDPC base matrix or sequence determined in step 3511 is not the first LDPC base matrix or sequence, the transmitter may compare a predetermined first CB reference value $K_{Th1,CRC}$ with the TBS in step 3513. The first CBS reference value $K_{Th1,CRC}$ may also be referred to as a CRC-related first threshold value, which is a reference value for determining the CRC. In addition, the transmitter determines the CRC bit number $N_{CRC}$ in steps 3514 and 3515 according to the result of comparison. In this case, $X_1$ and $X_2$ are different integers.

Specifically, if the TBS is larger than $K_{Th1,CRC}$, the transmitter may determine in step 3514 that the CRC bit number is X1. If the TBS is not larger than $K_{Th1,CRC}$, the transmitter may determine in step 3515 that the CRC bit number is X2.

If the LDPC base matrix or sequence determined in step 3511 is the first LDPC base matrix or sequence, the transmitter may compare the TBS with a predetermined second CBS reference value $K_{Th2,CRC}$ in step 3516. The second CBS reference value $K_{Th2,CRC}$ may also be referred to as a CRC-related second threshold value, which is a reference value for determining the CRC. In addition, the transmitter determines the CRC bit number $N_{CRC}$ in steps 3517 and 3518 according to the result of comparison. In this case, $Y_1$ and $Y_2$ are different integers.

Specifically, if the TBS is larger than $K_{Th2,CRC}$, the transmitter may determine in step 3517 that the CRC bit number is Y1. If the TBS is not larger than $K_{Th2,CRC}$, the transmitter may determine in step 3518 that the CRC bit number is Y2.

In addition, the transmitter applies CRC encoding to the transport block, thereby generating $N_{CRC}$ CRC bits, in step 3519. In addition, the generated CRC bits are attached to the transport block, and LDPC encoding is performed appropriately. The block size (Z) value needs to be determined for the LDPC encoding, and the block size value may be variably determined according to the TBS value.

Figure 36:
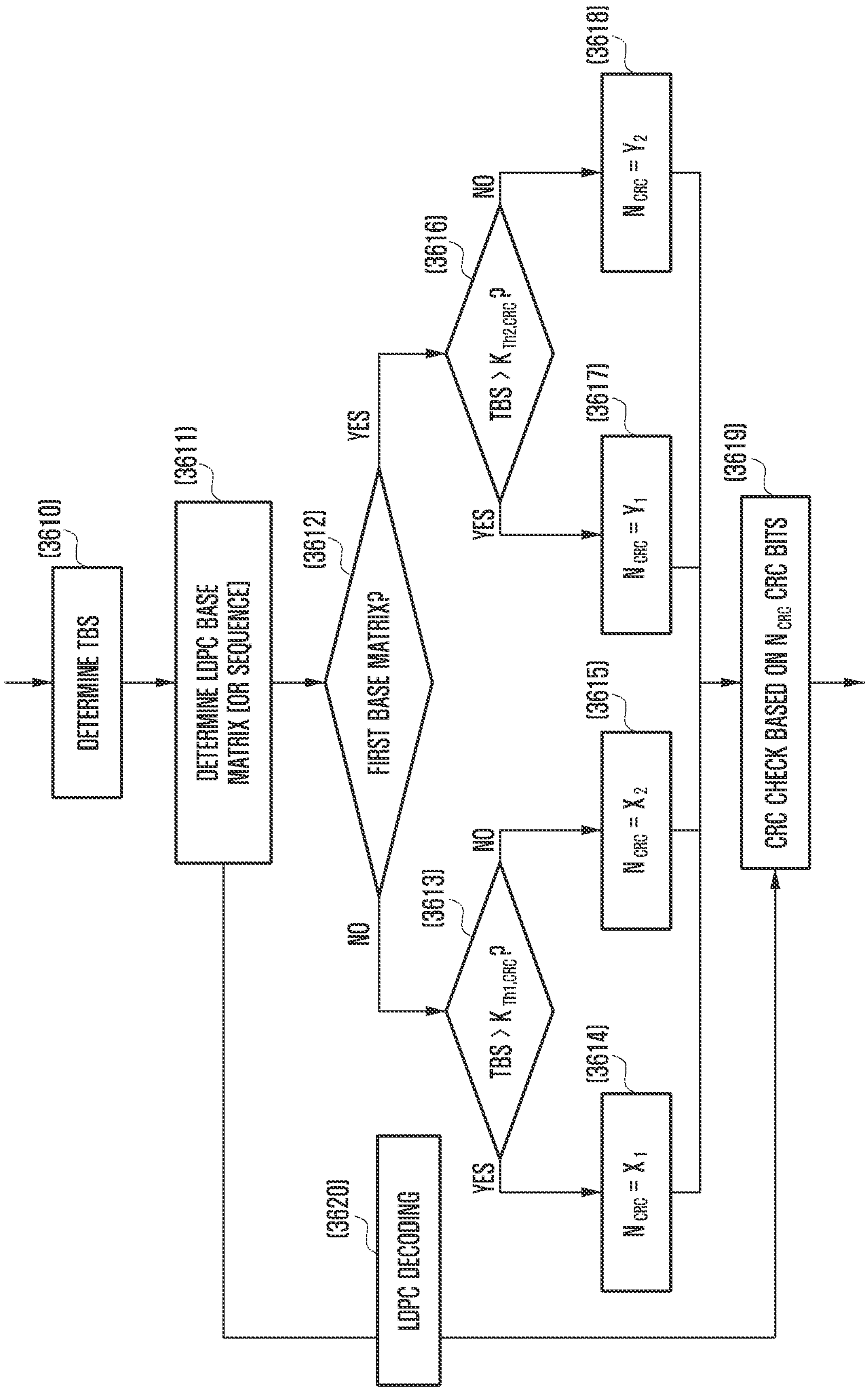
FIG. 36 is another exemplary diagram according to an embodiment of determining the number of CRC bits attached to a transport block according to an LDPC base matrix and accordingly performing a CRC check by a receiver.

FIG. 36 is another exemplary diagram regarding an embodiment regarding the method for determining, by a receiver, the number of CRC bits attached to a transport block in view of characteristics of an LDPC code.

The receiver may receive a signal regarding an LDPC-encoded transport block and CRC bits.

A TBS is determined in step 3610, and the receiver determines an LDPC base matrix or sequence in step 3611. The receiver determines in step 3612 which LDPC base matrix or sequence has been determined in step 3611.

If the LDPC base matrix or sequence determined in step 3611 is not the first LDPC base matrix or sequence, the receiver may compare a predetermined first CBS reference value $K_{Th1,CRC}$ with the TBS in step 3613. The first CBS reference value $K_{Th1,CRC}$ may also be referred to as a CRC-related first threshold value, which is a reference value for determining the CRC.

In addition, the receiver determines the CRC bit number $N_C$RC in steps 3614 and 3615 according to the result of comparison. In this case, $X_1$ and $X_2$ are different integers.

Specifically, if the TBS is larger than $K_{Th1,CRC}$, the receiver may determine in step 3614 that the CRC bit number is X1. If the TBS is not larger than $K_{Th1,CRC}$, the receiver may determine in step 3615 that the CRC bit number is X2.

If the LDPC base matrix or sequence determined in step 3611 is the first LDPC base matrix or sequence, the receiver may compare the TBS with a predetermined second CBS reference value $K_{Th2,CRC}$ in step 3616. The second CBS reference value $K_{Th2,CRC}$ may also be referred to as a CRC-related second threshold value, which is a reference value for determining the CRC. In addition, the receiver determines the CRC bit number $N_{CRC}$ in steps 3617 and 3618 according to the result of comparison. In this case, $Y_1$ and $Y_2$ are different integers.

Specifically, if the TBS is larger than $K_{Th2,CRC}$, the receiver may determine in step 3617 that the CRC bit number is Y1. If the TBS is not larger than $K_{Th2,CRC}$, the receiver may determine in step 3618 that the CRC bit number is Y2.

In addition, the receiver performs LDPC decoding, in step 3620, with regard to the received LDPC-encoded transport block and CRC bits according to the LDPC base matrix or sequence determined in step 3611. Thereafter, the receiver performs a CRC check, in final step 3619, in view of the fact that $N_{CRC}$ CRC bits are attached to the LDPC-decoded transport block, thereby detecting errors.

For reference, in FIG. 35 and FIG. 36, one of the two $X_1=X_2$ and $Y_1=Y_2$ may be hold, and $X_1=X_2$ and $Y_1=Y_2$ may both hold. In addition, if necessary, a configuration may be made such that $K_{Th1,CRC}=K_{Th2,CRC}$ is satisfied. If a configuration is made such that $K_{Th1}=K_{Th2}$, $X_1=X_2$ and $Y_1=Y_2$ are all satisfied simultaneously, step 3520 or step 3612, step 3560 to step 3580, or step 3616 to step 3618 may all be omitted. In addition, although FIG. 35 and FIG. 36 illustrate only a case in which the TBS is determined in steps 3510 and 3610, the same may be changed to a step of determining the CBS instead of the TBS.

Although only CRC bits attached to a transport block have been described with reference to FIG. 29 to FIG. 36, CRC bits attached to a code block may be normally determined by applying a similar method.

Figure 37:
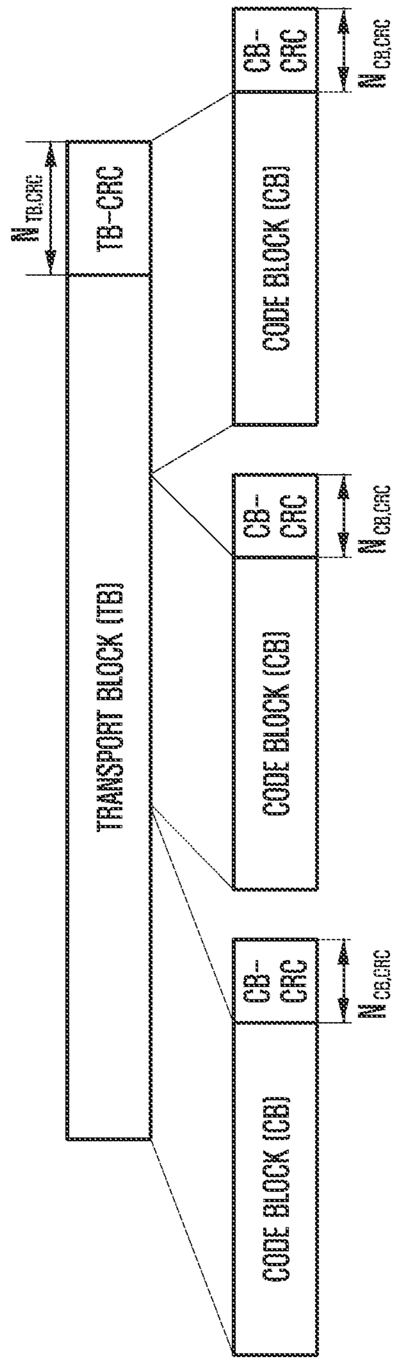
FIG. 37 is an exemplary diagram according to an embodiment of a method for segmenting a transport block.

FIG. 37 is an exemplary diagram according to an embodiment of a method for segmenting a transport block.

For example, if the TBS is normally large as in FIG. 37, the same is divided into multiple code blocks, and then channel encoding and decoding proceed. Then, it is possible to assume a system configured such that, if segmentation is applied to the transport block so as to divide the same into multiple code blocks, code block CRC (CB-CRC) bits need to be attached to each of all code blocks or to each of some code blocks.

Referring to FIG. 37, if the length of the transport block and the transport CRC bits, obtained after performing CRC encoding with regard to the transport block, exceeds a specific length, the transmitter may segment the transport block into multiple code blocks.

In addition, after segmenting the transport block into multiple code blocks, the transmitter performs CRC encoding with regard to each of all code blocks or to each of some code blocks such that code block CRC bits are attached to the code blocks that have undergone the CRC encoding.

Likewise, in the decoding process, the receiver receives a signal regarding an LDPC-encoded transport block and transport block CRC bits, performs LDPC decoding with regard to each code block, performs error detection with regard to the code block CRC, and performs error detection with regard to the transport block CRC according to the result.

In this case, the advantageous effect of further decreased FAR of the transport block can be expected by attaching code block CRC, and the transport block CRC (TB-CRC) bit number can thus be reduced. Hereinafter, as in FIG. 37, the transport block CRC bit number will be referred to as $N_{TB,CRC}$, and the code block CRC bit number will be referred to as $N_{CB,CRC}$.

Figure 38:
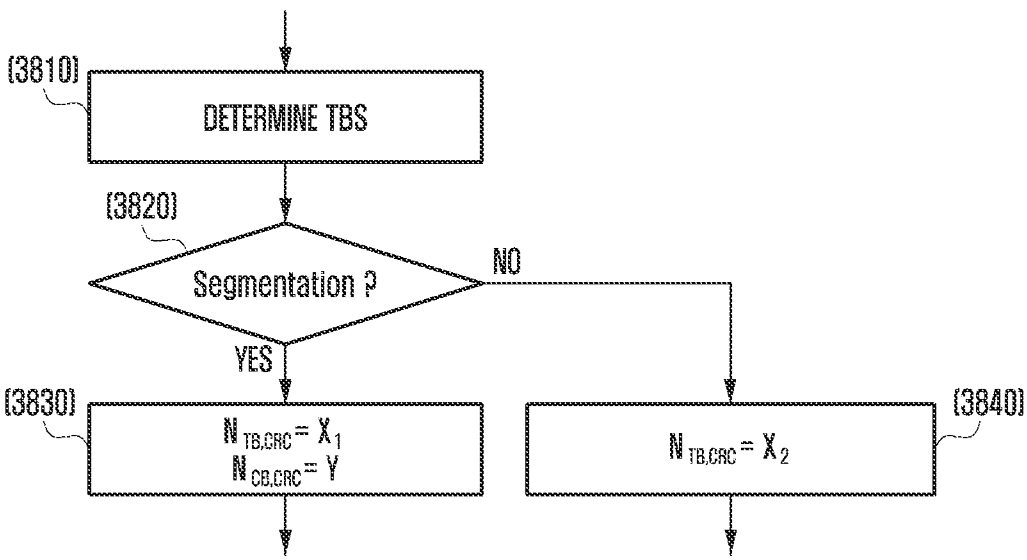
FIG. 38 is an exemplary diagram according to an embodiment regarding a method for determining transport block CRC and code block CRC bit numbers according to a TBS and whether segmentation is conducted or not.

FIG. 38 is an exemplary diagram according to an embodiment regarding a method for determining transport block CRC and code block CRC bit numbers according to a TBS and whether segmentation is conducted or not.

Referring to FIG. 38, after the TBS is determined in step 3810, the transmitter may determine in step 3820, according to the size of TBS, if it is necessary to apply transport block segmentation such that the same is divided into multiple code blocks.

If segmentation is necessary, the transmitter determines in step 3830 that the number $N_{TB,CRC}$ of CRC bits to be attached to the transport block ix $X_1$, and the number $N_{CB,CRC}$ of CRC bits to be attached to the code blocks is Y.

On the other hand, if it is confirmed in step 3820 that segmentation is unnecessary, the transmitter determines in step 3840 that $N_{TB,CRC}$ is $X_2$. In this case, $X_1$ may be always smaller than $X_2$ or may be equal thereto.

The above process is also applicable to a decoding process.

The encoding process in FIG. 38 can be summarized as follows. The transmitter determines the transport block size (TBS), determines whether or not to apply segmentation to the transport block, and then determines the number $N_{TB,CRC}$ of CRC bits to be attached to the transport block according to whether the segmentation is applied or not.

In addition, the transmitter performs CRC encoding with regard to the transport block according to the determined CRC bit number $N_{TB,CRC}$, and then performs LDPC encoding with regard to the transport block and the code blocks regarding the CRC bits. It is to be noted that the number of CRC bits to be attached to the transport block when the segmentation is applied is smaller than or equal to the number of CRC bits to be attached to the transport block when the segmentation is not applied.

A specific example will be described in this regard. It is assumed that, if segmentation is unnecessary according to the TBS value, the transmitter always attaches 24 (=$X_2$) transport block CRC bits so as to accomplish the FAR required by the system. In addition, assuming that the transmitter attaches 16 (=Y) code block CRC bits if segmentation occurs according to the TBS value, the FAR required by the receiver of the system can be satisfied by configuring the transport block CRC bit number to be 8 (=$X_1$). Theoretically, if the number of segmented code blocks is $N_{seg}$(>1), and if $N_{CB,CRC}$ CRC bits are attached to each code block, the FAR required by the system can be accomplished by determining the CRC bit numbers such that Equation 26 below is satisfied:

$$X_1 \geq X_2 - N_{seg} \times Y \qquad \text{Equation 26}$$

According to Equation 26 above, if $X_2$=24, and if Y=8, the same always holds regardless of the $N_{seg}$(>1) value if $X_1$=8 is configured. It can be understood that the same always holds even if Y=8, $X_1$=16, $X_2$=24 are configured.

As such, X2 value, Y value, and the like may be preconfigured. On the other hand, the Y value may be determined according to the number of segmentations. For example, the Y value may be configured to decrease in inverse proportion to the increasing number of segmentations.

Figure 39:
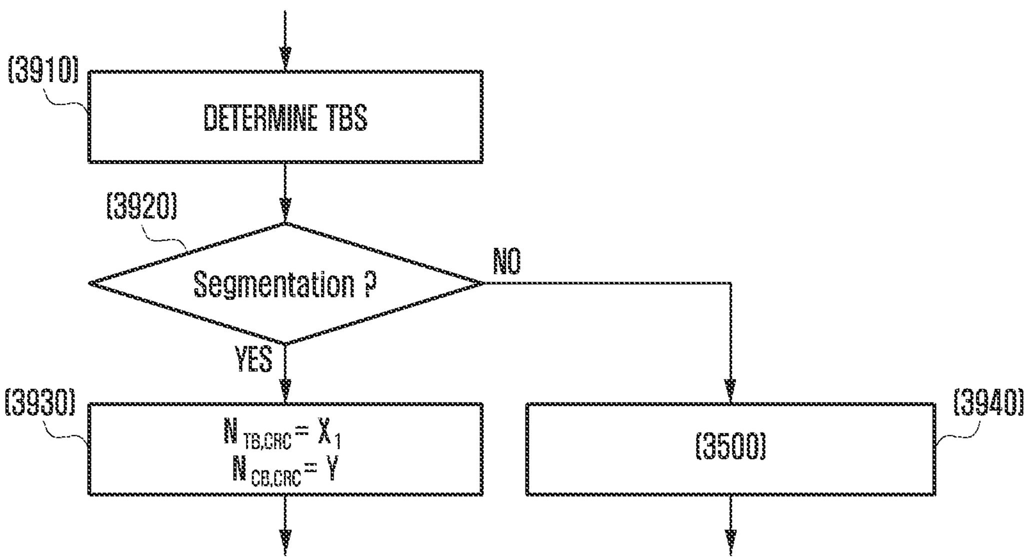
FIG. 39 is another exemplary diagram according to an embodiment regarding a method for determining transport block CRC and code block CRC bit numbers according to a TBS and whether segmentation is conducted or not.

FIG. 39 is another exemplary diagram according to an embodiment regarding a method for determining transport block CRC and code block CRC bit numbers according to a TBS and whether segmentation is conducted or not.

Referring to FIG. 39, steps 3910 to 3930 are the same has described with regard to steps 3810 to 3830 in FIG. 38, and repeated description thereof will be omitted herein.

On the other hand, it is obvious that, if the transport block is not segmented, the transmitter may combine step 3500 in FIG. 35 with the process of determining CRC bits in step 3940 such that the same are determined more specifically, unlike the case in FIG. 38 in which CRC bits are determined to be X2.

The decoding process operates very similarly as the inverse process of the above encoding process. The decoding process can be summarized as follows.

The receiver may receive a signal regarding an LDPC-encoded transport block and CRC bits.

The receiver may determine the transport block size (TBS) from the received signal, and may determine whether or not to apply segmentation to the transport block.

The receiver determines the number $N_{TB,CRC}$ of CRC bits attached to the transport block according to whether or not the segmentation is applied.

The receiver performs LDPC decoding with regard to the received encoded transport block and code blocks regarding CRC bits. After LDPC decoding is completed, the receiver performs CRC error detection in view of the determined CRC bit number $N_{TB,CRC}$ with regard to the LDPC-decoded transport block and CRC bits.

If the transport block has been segmented into multiple code blocks, a process of calculating the number $N_{CB,CRC}$ of CRC bits attached to each code block and a process of detecting errors in view of the $N_{CB,CRC}$ CRC bits with regard to the code blocks, are further included.

Likewise, the number of CRC bits attached to the transport block when segmentation is applied may be smaller than or equal to the number of CRC bits attached to the transport block when segmentation is not applied.

Figure 40:
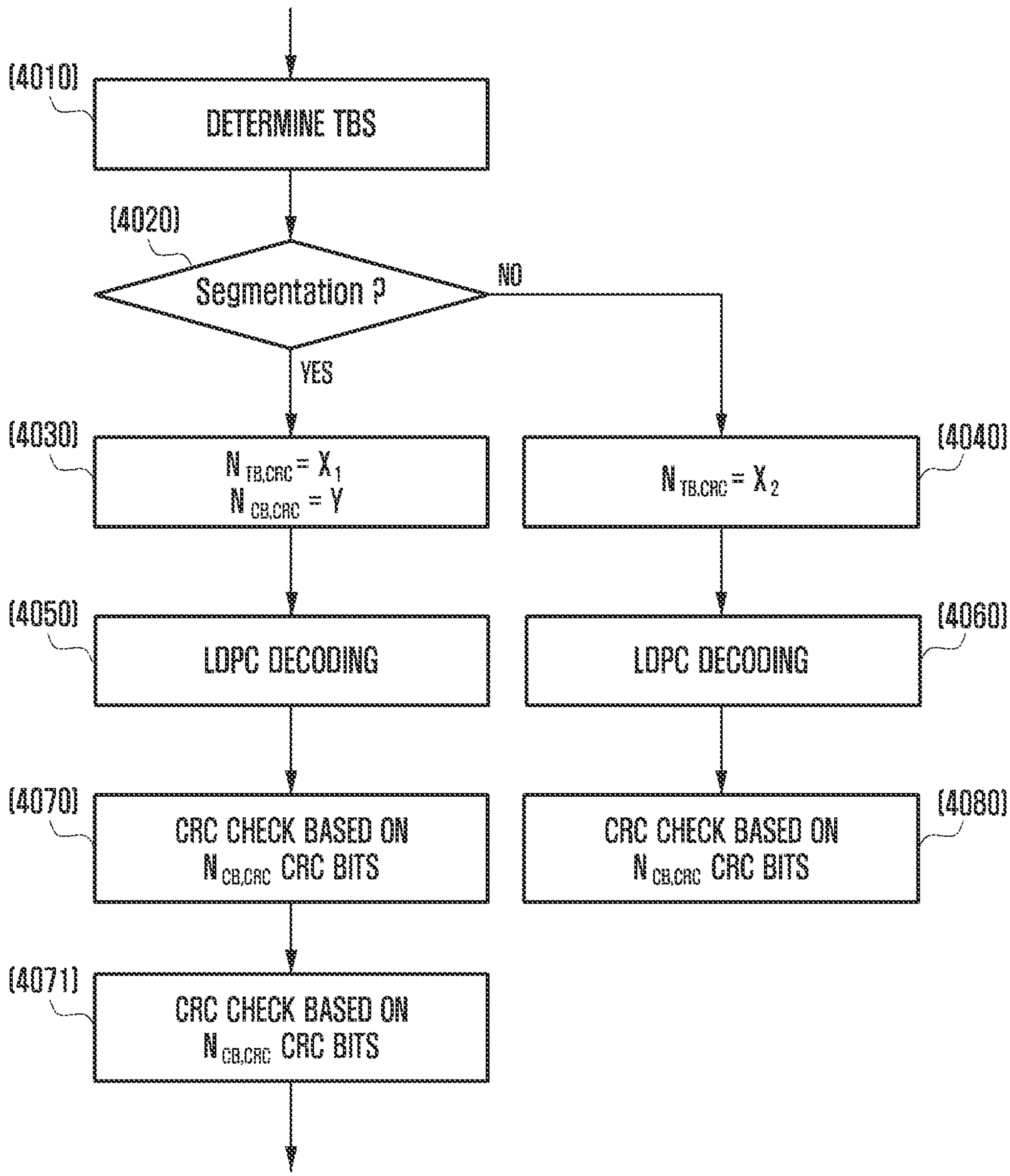
FIG. 40 is an exemplary diagram according to an embodiment of determining transport block CRC and code block CRC bit numbers according to a TBS and whether segmentation is conducted or not and accordingly performing a CRC check by a receiver.

The decoding process is schematically illustrated in FIG. 40.

FIG. 40 is an exemplary diagram according to an embodiment of determining transport block CRC and code block CRC bit numbers according to a TBS and whether segmentation is conducted or not and accordingly performing a CRC check by a receiver.

The TBS is determined in step 4010, and the receiver may determine in step 4020, according to the size of TBS, if it is necessary to apply transport block segmentation such that the same is divided into multiple code blocks.

If segmentation is necessary, the receiver determines in step 4030 that the number $N_{TB,CRC}$ of CRC bits to be attached to the transport block is $X_1$, and the number $N_{CB,CRC}$ of CRC bits to be attached to the code block is Y.

If it is determined in step 4020 that segmentation is unnecessary, the receiver determines in step 4040 that $N_{TB,CRC}$ is $X_2$. However, the embodiment of the disclosure is not limited thereto, and the receiver may determine $N_{TB,CRC}$ according to 3500 in FIG. 35.

In this case, $X_1$ needs to be always smaller than $X_2$ or equal thereto. After the number of CRC bits is determined as above, the receiver performs LDPC decoding with regard to each code block, from the receive signal, as in steps 4050 and 4060.

If segmentation has been applied to the transport block so as to divide the same into multiple code blocks, the receiver performs CRC detection in view of $N_{CB,CRC}$ CRC bits with regard to the LDPC-decoded code blocks, respectively, in step 4070. If all code blocks have passed CRC detection, the receiver combines respective code blocks and performs CRC detection in view of $N_{TB,CRC}$ CRC bits with regard to the restored transport block in step 4071.

If no segmentation has been applied to the transport block, the receiver performs LDPC decoding and then performs CRC detection in view of $N_{TB,CRC}$ CRC bits with regard to the restored transport block only as in step 4080.

Hereinafter, another embodiment regarding the method for selecting a base matrix or exponent matrix to apply LDPC encoding according to the CBS or TBS and the code rate will be described. The criterion for selecting the first base matrix and the second base matrix will be first described with reference to FIG. 41.

Figure 41:
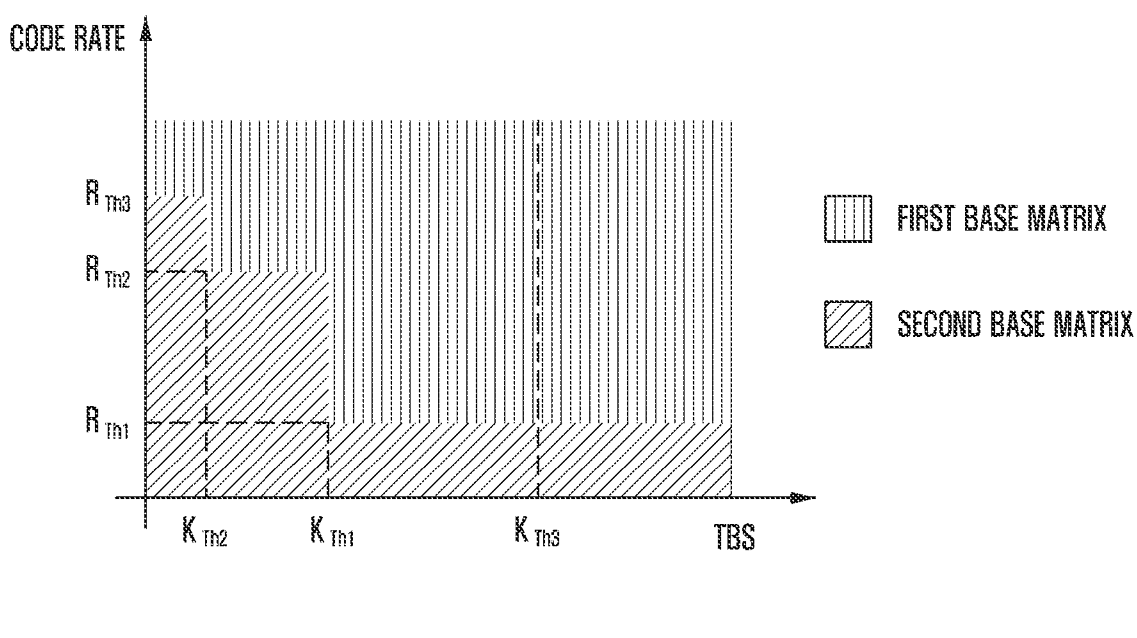
FIG. 41 is a diagram illustrating another exemplary range in which a base matrix is allocated according to a TBS and a code rate.

Referring to FIG. 41, FIG. 41 illustrates a range in which the first base matrix is selected according to the TBS and the code rate, and an area in which the second base matrix is selected. The first base matrix in the disclosure may correspond to the base matrix described with reference to FIG. 19A, and the second base matrix in the disclosure may correspond to the base matrix described with reference to FIG. 20A. However, the embodiment of the disclosure is not limited thereto, and the first base matrix may correspond to the base matrix described with reference to FIG. 20A, and the second base matrix may correspond to the base matrix described with reference to FIG. 19A. In addition, the first base matrix and the second matrix in the disclosure may correspond to two different base matrices configured separately.

Figure 42:
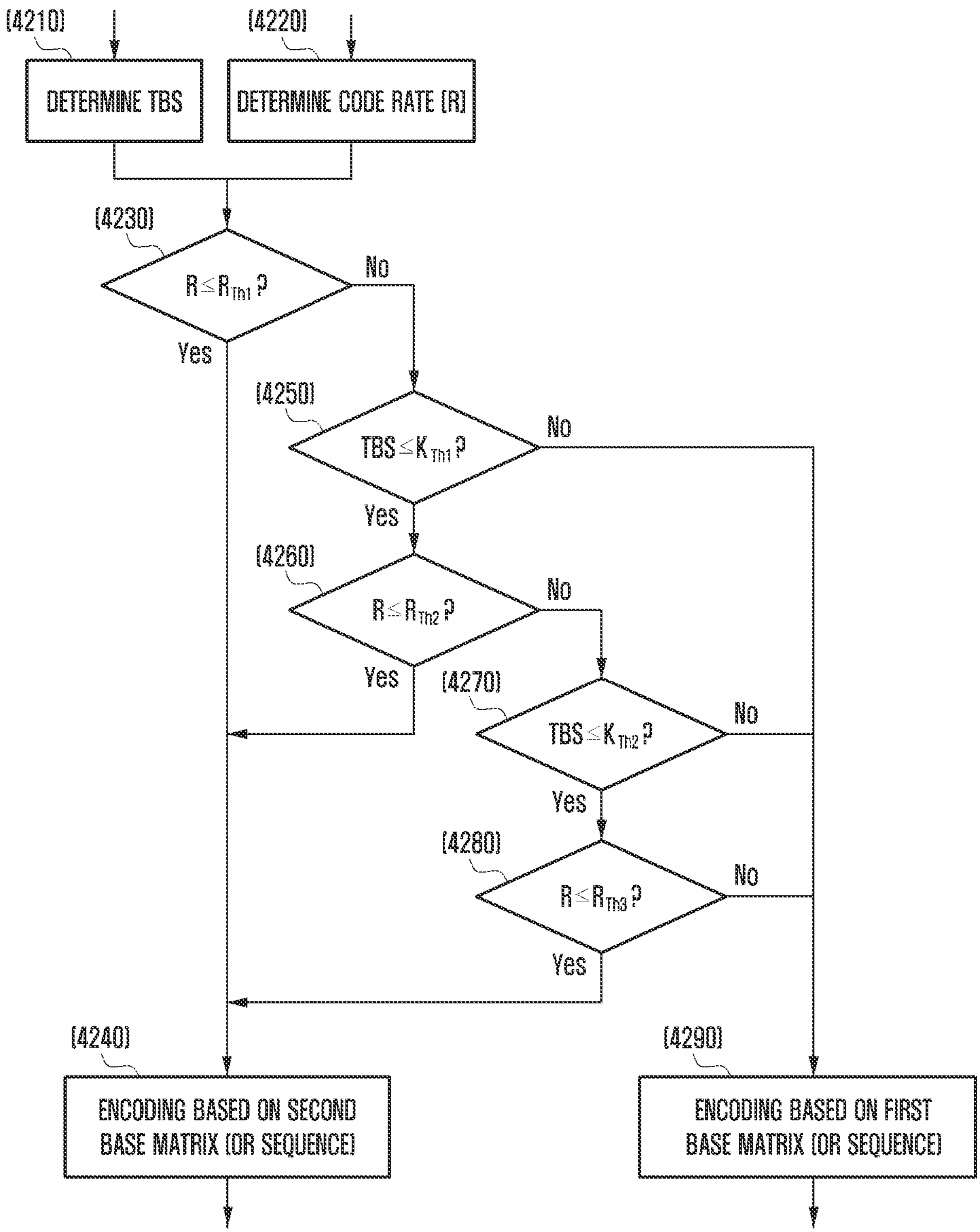
FIG. 42 is another exemplary diagram regarding a method for determining a base matrix according to a TBS and a code rate by a transmitter.

In order to describe the operation of the transmitter corresponding to FIG. 41, an exemplary diagram regarding the flowchart of the transmitter is illustrated in FIG. 42.

If the MCS for transmission is determined by the system, the transmitter may determine the TBS and the transmission code rate, corresponding thereto, in steps 4210 and 4220, respectively.

The transmitter may compare the determined code rate (R) value with a predetermined first code rate reference value $R_{Th1}$ in step 4230, thereby determining if a specific condition is satisfied.

According to FIG. 41, if the code rate (R) value is smaller than the first code rate reference value $R_{Th1}$, the transmitter may perform encoding based on the second LDPC base matrix (or LDPC sequence) in step 4240.

If the code rate (R) value is larger than the first code rate reference value $R_{Th1}$, the transmitter may compare the TBS size with a first TBS reference value $K_{Th1}$ in step 4250, thereby determining if a specific condition is satisfied.

In FIG. 42, if the TBS size is larger than the first TBS reference value $K_{Th1}$, the transmitter may perform encoding based on the first LDPC base matrix (or LDPC sequence) in step 4290.

On the other hand, if the TBS size is smaller than or equal to the first TBS reference value $K_{Th1}$, the transmitter may compare the code rate (R) value with a predetermined second code rate reference value $R_{Th2}$, thereby determining if a specific condition is satisfied. If the determined code rate (R) value is smaller than or equal to the second code rate reference value $R_{Th2}$, the transmitter may perform encoding based on the second LDPC base matrix (or LDPC sequence) in step 4240.

If the determined code rate (R) is larger than the second code rate reference value $R_{Th2}$, the transmitter may compare the TBS size with a second TBS reference value $K_{Th2}$ in step 4270, thereby determining if a specific condition is satisfied.

If the TBS size is larger than the second TBS reference value $K_{Th2}$, the transmitter may perform encoding based on the first LDPC base matrix (or LDPC sequence) in step 4290.

If the TBS size is equal to or smaller than the second TBS reference value $K_{Th2}$, the transmitter may compare the determined code rate (R) value with a predetermined third code rate value $R_{Th3}$, thereby determining if a specific condition is satisfied.

If the determined code rate (R) value is smaller than or equal to the third code rate reference value $R_{Th3}$, the transmitter may perform encoding based on the second LDPC base matrix (or LDPC sequence) in step 4240. If the determined code rate (R) is larger than the third code rate reference value $R_{Th3}$, the transmitter may perform encoding based on the first LDPC base matrix (or LDPC sequence) in step 4290.

The receiver determines a base matrix or LDPC sequence to be used for LDPC encoding through a process similar to the operation of the transmitter.

Figure 43:
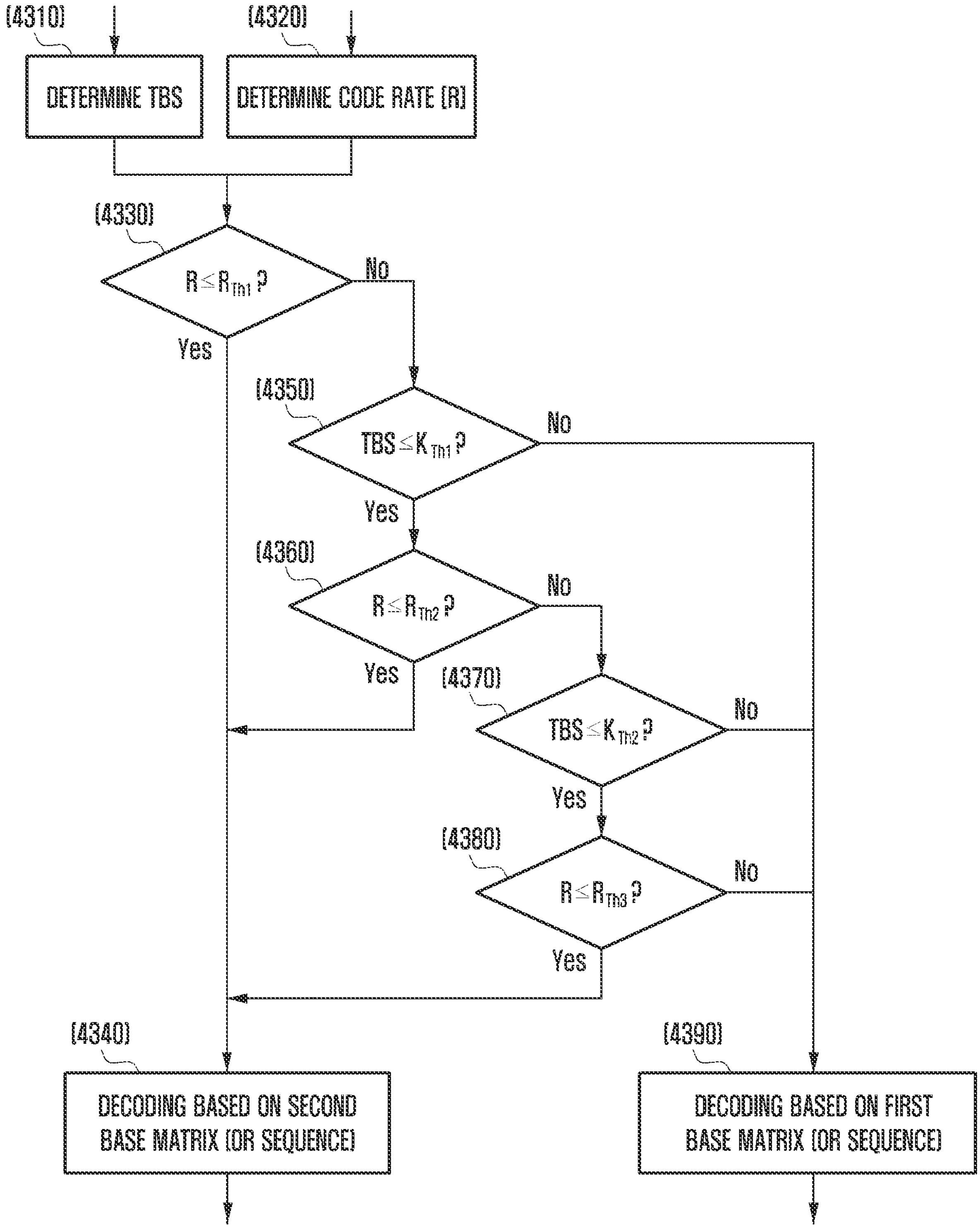
FIG. 43 is another exemplary diagram regarding a method for determining a base matrix according to a TBS and a code rate by a receiver.

FIG. 43 is another exemplary diagram regarding a method for determining a base matrix according to a TBS and a code rate by a receiver.

Firstly, since the receiver can acquire information regarding the MCS or information regarding the TBS from a received signal, the receiver may determine the TBS and the transmission code rate in steps 4310 and 4320, respectively.

The receiver may compare the determined code rate (R) value with a predetermined first code rate reference value $R_{Th1}$ in step 4330, thereby determining if a specific condition is satisfied.

If the code rate (R) value is smaller than the first code rate reference value $R_{Th1}$, the receiver may perform decoding based on the second LDPC base matrix (or LDPC sequence) in step 4340. If the code rate (R) value is larger than the first code rate reference value $R_{Th1}$, the receiver may compare the TBS size with a first TBS reference value $K_{Th1}$ in step 4350, thereby determining if a specific condition is satisfied.

If the TBS size is larger than the first TBS reference value $K_{Th1}$, the receiver may perform decoding based on the first LDPC base matrix (or LDPC sequence) in step 4390.

If the TBS size is smaller than or equal to the first TBS reference value $K_{Th1}$, the receiver may compare the code rate (R) value with a predetermined second code rate reference value $R_{Th2}$, thereby determining if a specific condition is satisfied. If the determined code rate (R) value is smaller than or equal to the second code rate reference value $R_{Th2}$, the receiver may perform decoding based on the second LDPC base matrix (or LDPC sequence) in step 4340.

If the determined code rate (R) is larger than the second code rate reference value $R_{Th2}$, the receiver may compare the TBS size with a second TBS reference value $K_{Th2}$ in step 4370, thereby determining if a specific condition is satisfied.

If the TBS size is larger than the second TBS reference value $K_{Th2}$, the receiver may perform decoding based on the first LDPC base matrix (or LDPC sequence) in step 4390.

If the TBS size is equal to or smaller than the second TBS reference value $K_{Th2}$, the receiver may compare the determined code rate (R) value with a predetermined third code rate value $R_{Th3}$, thereby determining if a specific condition is satisfied.

It can be understood that, if the determined code rate (R) value is smaller than or equal to the third code rate reference value $R_{Th3}$, the receiver performs decoding based on the second LDPC base matrix (or LDPC sequence) in step 4340. It can be understood that, if the determined code rate (R) is larger than the third code rate reference value $R_{Th3}$, the receiver performs decoding based on the first LDPC base matrix (or LDPC sequence).

A TB segmentation operation may be added, according to the length of the TBS, to the operations of the transmitter and the receiver illustrated in FIG. 42 and FIG. 43.

Figure 44:
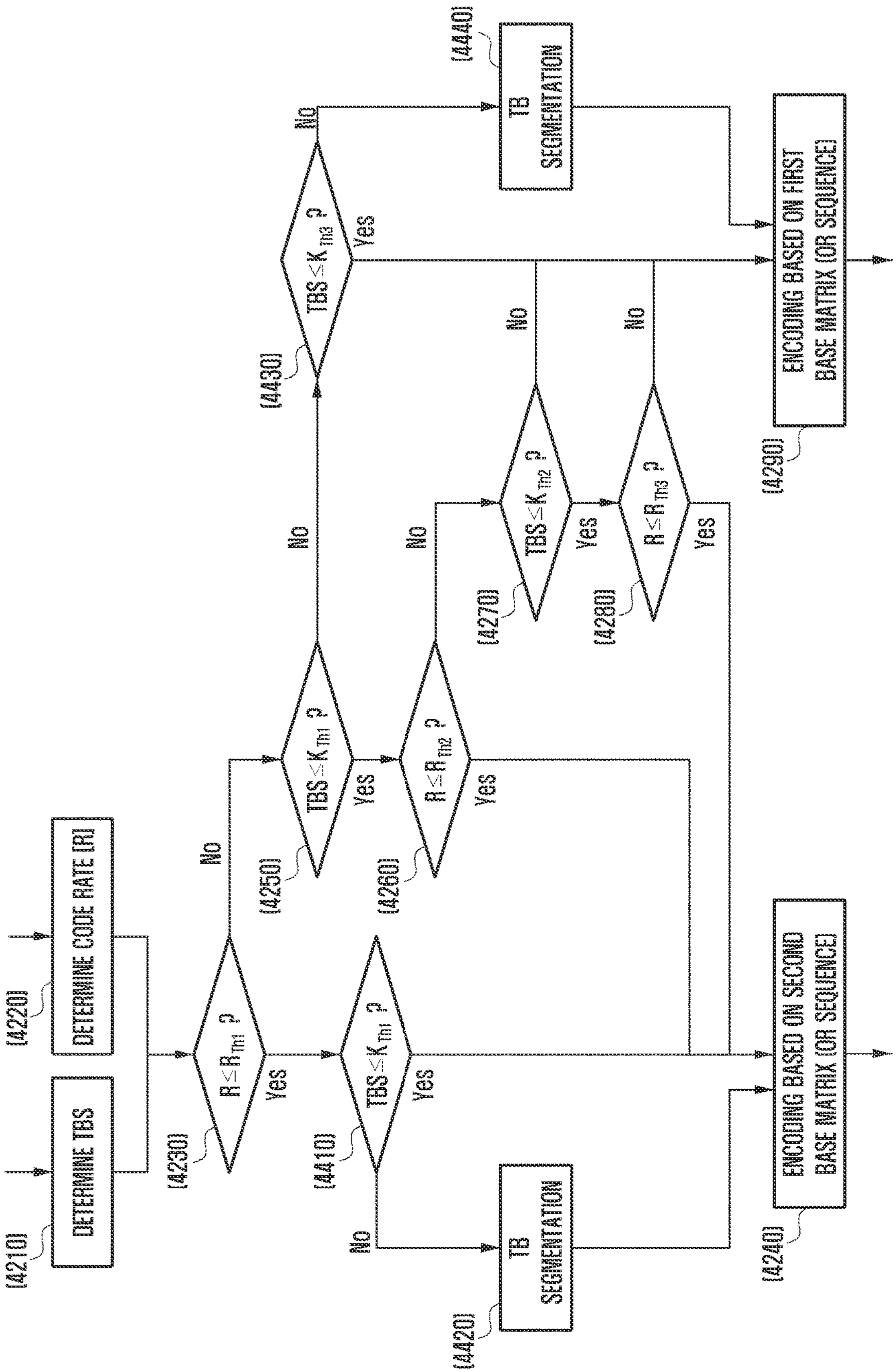
FIG. 44 is another exemplary diagram regarding a method for determining a base matrix according to a TBS and a code rate by a transmitter.

FIG. 44 is another exemplary diagram regarding a method for determining a base matrix according to a TBS and a code rate by a transmitter.

Referring to FIG. 44, as an embodiment of the disclosure, the transmitter may compare the code rate (R) value with a predetermined first code rate reference value $R_{Th1}$ as in step 4230 of FIG. 42.

If R is smaller than or equal to the first code rate reference value $R_{Th1}$ as a result of the comparison, the transmitter determines in step 4410 if the determined TBS is smaller than or equal to a first TBS reference value $K_{Th1}$. If it is determined that the TBS is smaller than or equal to the first TBS reference value, the transmitter performs LDPC encoding based on the second base matrix or sequence without TB segmentation.

However, if it is determined in step 4410 that the determined TBS is larger than the first TBS reference value $K_{Th1}$, the transmitter appropriately segments the given TB in step 4420 so as to generate multiple code blocks, and performs LDPC encoding based on the second LDPC base matrix or sequence with regard to each code block.

If the code rate R is larger than the first code rate $R_{Th1}$, the transmitter may compare the TBS value with a predetermined first TBS reference value $K_{Th1}$ as in step 4250 of FIG. 42.

If the TBS value is larger than the first TBS reference value, the transmitter may determine in step 4430 if the determined TBS is smaller than or equal to a third TBS reference value $K_{Th3}$.

If it is determined that the TBS is smaller than or equal to the third TBS reference value, the transmitter performs LDPC encoding based on the first LDPC base matrix or sequence without TB segmentation.

However, if it is confirmed that the determined TBS is larger than the third TBS reference value KTh3, the transmitter appropriately segments the given TB in step 4440 so as to generate multiple code blocks, and performs LDPC encoding based on the first LDPC base matrix or sequence with regard to each code block.

On the other hand, if it is determined in step 4250 that the TBS value is smaller than or equal to the first TBS reference value, the transmitter may perform steps 4260 to 4280, and the detailed content thereof is the same as described with reference to FIG. 42.

Figure 45:
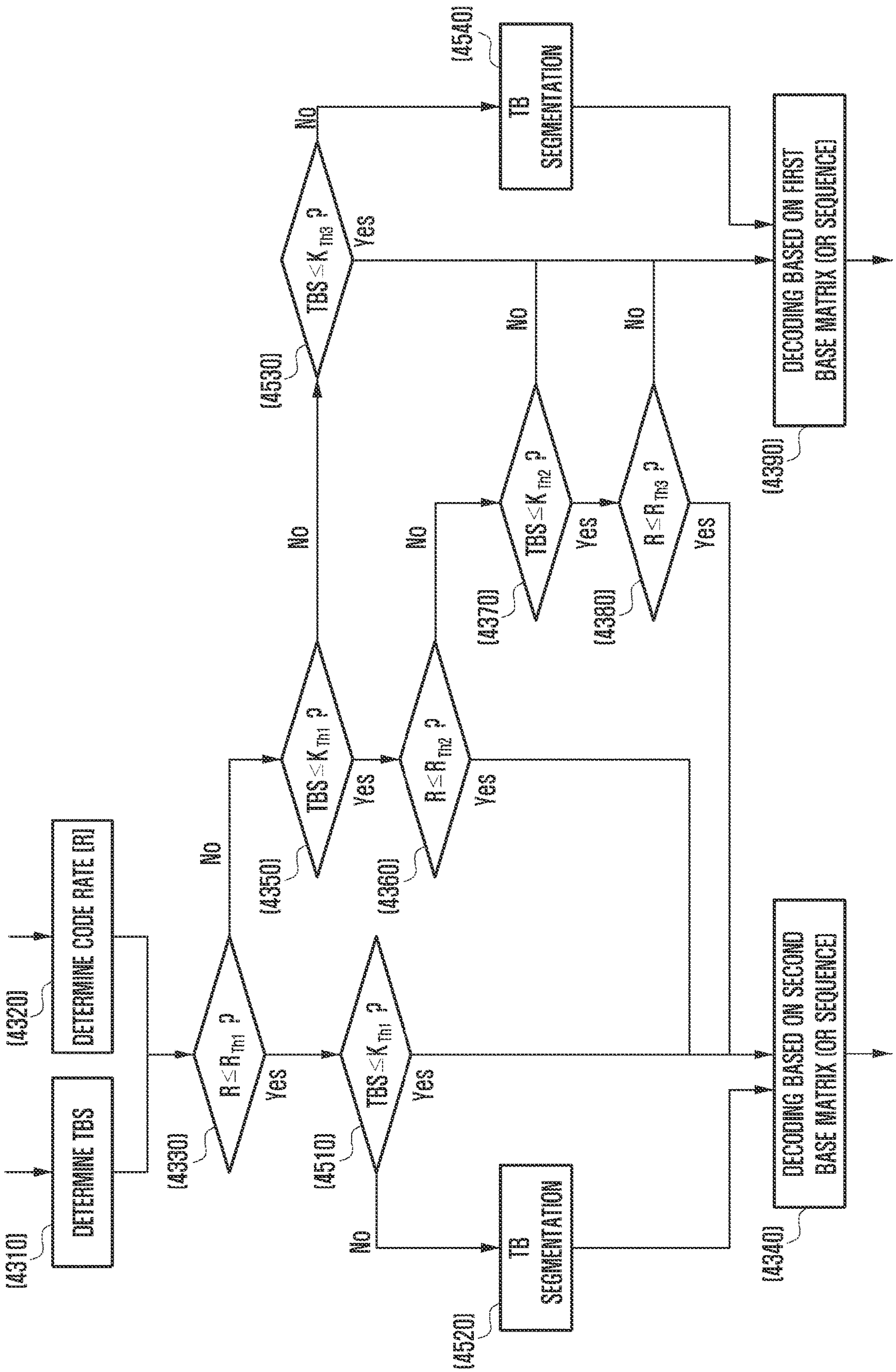
FIG. 45 is another exemplary diagram regarding a method for determining a base matrix according to a TBS and a code rate by a receiver.

FIG. 45 is another exemplary diagram regarding the method for determining a base matrix according to a TBS and a code rate by a receiver.

Referring to FIG. 45, the receiver may compare the determined code rate (R) value with a predetermined first code rate reference value $R_{Th1}$ as in step 4330 of FIG. 43.

If R is smaller than the first code rate reference value $R_{Th1}$ as a result of the comparison, the receiver determines in step 4510 if the determined TBS is smaller than or equal to a first TBS reference value $K_{Th1}$. If it is determined that the TBS is smaller than or equal to the first TBS reference value, the receiver performs LDPC decoding based on the second LDPC base matrix or sequence without applying segmentation to the received TB block.

However, if it is determined in step 4510 that the determined TBS is larger than the first TBS reference value $K_{Th1}$, the receiver appropriately segments the received TB in step 4520 so as to generate multiple reception code blocks, and performs LDPC decoding based on the second LDPC base matrix or sequence with regard to each reception code block.

If the code rate R is larger than the first code rate $R_{Th1}$, the receiver may compare the TBS value with a predetermined first TBS reference value $K_{Th1}$ as in step 4350 of FIG. 43.

If the TBS value is larger than the first TBS reference value, the receiver may determine in step 4530 if the determined TBS is smaller than or equal to a third TBS reference value KTh3.

If it is determined that the TBS is smaller than or equal to the third TBS reference value, the receiver performs LDPC decoding based on the first LDPC base matrix or sequence without TB segmentation.

However, if it is confirmed that the determined TBS is larger than the third TBS reference value KTh3, the receiver appropriately segments the received TB so as to generate multiple reception code blocks, and performs LDPC decoding based on the first LDPC base matrix or sequence with regard to each reception code block.

On the other hand, if it is confirmed in step 4350 that the TBS value is smaller than or equal to the first TBS reference value, the transmitter may perform steps 4260 to 4280, and the detailed content thereof is the same as described with reference to FIG. 42.

For reference, a received TB and a reception code block may refer to reception signals corresponding to a transmitted TB and a code block, or may refer to values stored from the reception signals such that the receiver can perform decoding (for example, quantized value of LLR or reception signal).

The operation of the transmitter can be summarized as follows. The transmitter first determines the size of the TB to be transmitted (TBS) and the transmission code rate (R). Thereafter, the transmitter performs a process of comparing the code rate (R) with at least one of a first code rate reference value $R_{Th1}$, a second code rate reference value $R_{Th2}$, and a third code rate reference value $R_{Th3}$, performs a process of comparing the TBS with at least one of a first TBS reference value $K_{Th1}$, a second TBS reference value $K_{Th1}$, and a third TBS reference value KTh3, and performs a process of determining one from the first LDPC base matrix (or sequence) and the second LDPC base matrix (or sequence) according to the code rate (R) and the size of TBS, and performing LDPC encoding.

The operation of the receiver can be summarized as follows. The receiver first determines the size of a transmitted TB (TBS) and the transmission code rate (R) from a received signal. Thereafter, the receiver performs a process of comparing the code rate R with at least one of a first code rate reference value $R_{Th1}$, a second code rate reference value $R_{Th2}$, and a third code rate reference value $R_{Th3}$, performs a process of comparing the TBS with at least one of a first TBS reference value $K_{Th1}$, a second TBS reference value $K_{Th2}$, and a third TBS reference value KTh3, and performs a process of determining one from the first LDPC base matrix (or sequence) and the second LDPC base matrix (or sequence) according to the code rate R and the size of TBS, and performing LDPC decoding.

The case in FIG. 41 in which encoding and decoding are performed based on the second LDPC base matrix (or sequence) from among the first LDPC base matrix (or sequence) and the second LDPC base matrix (or sequence) corresponds to a case in which one of the conditions in Equation 27 below is satisfied. Otherwise, encoding and decoding based on the first LDPC base matrix (or sequence) are performed.

Condition 1) $R \le R_{Th1}$

Condition 2) $R \le R_{Th2}$ and $TBS \le K_{Th1}$

Condition 3) $R \le R_{Th3}$ and $TBS \le K_{Th2}$ Equation 27

In addition, the case in which LDPC encoding and decoding are performed after additionally applying TB segmentation corresponds to a case in which one of the equations in Equation 28 below is satisfied.

Condition 1) $R \le R_{Th1}$ and $TBS > K_{Th1}$

Condition 2) $R > R_{Th1}$ and $TBS > K_{Th3}$ Equation 28

Characteristically, if condition 1) is satisfied in Equation 28 above, TB segmentation is performed, and encoding and decoding are then performed based on the second LDPC base matrix (or sequence). If condition 2) is satisfied, encoding and decoding are then performed based on the first LDPC base matrix (or sequence).

It is to be noted that, as the above-mentioned reference values including the first code rate reference value $R_{Th1}$, the second code rate reference value $R_{Th2}$, the third code rate reference value $R_{Th3}$, the first TBS reference value KTh1, the second TBS reference value $K_{Th2}$, and the third TBS reference value $K_{Th3}$, values preconfigured by the system may be used, or values that are variable according to the system condition may be used.

For example, fixed values such as $K_{Th1}=3824$, $K_{Th2}=176$, $K_{Th3}=8424$, $R_{Th1}=0.25$, $R_{Th2}=0.67$, $R_{Th3}=5/6$ may be used. Alternatively, fixed values may be used for $K_{Th1}$, $K_{Th2}$, $K_{Th3}$, $R_{Th2}$, and $R_{Th3}$, such as $K_{Th1}=3824$, $K_{Th2}=176$, $K_{Th3}=8424$, $R_{Th}2=0.67$, $R_{Th3}=5/6$, and a value that is variable according to a condition such as the amount of allocated system resources or the limited buffer size of the receiver may be used as the $R_{Th1}$ value.

Another embodiment regarding the method for selecting a base matrix or exponent matrix to apply LDPC encoding according to the TBS and code rate will be described with reference to FIG. 46.

Figure 46:
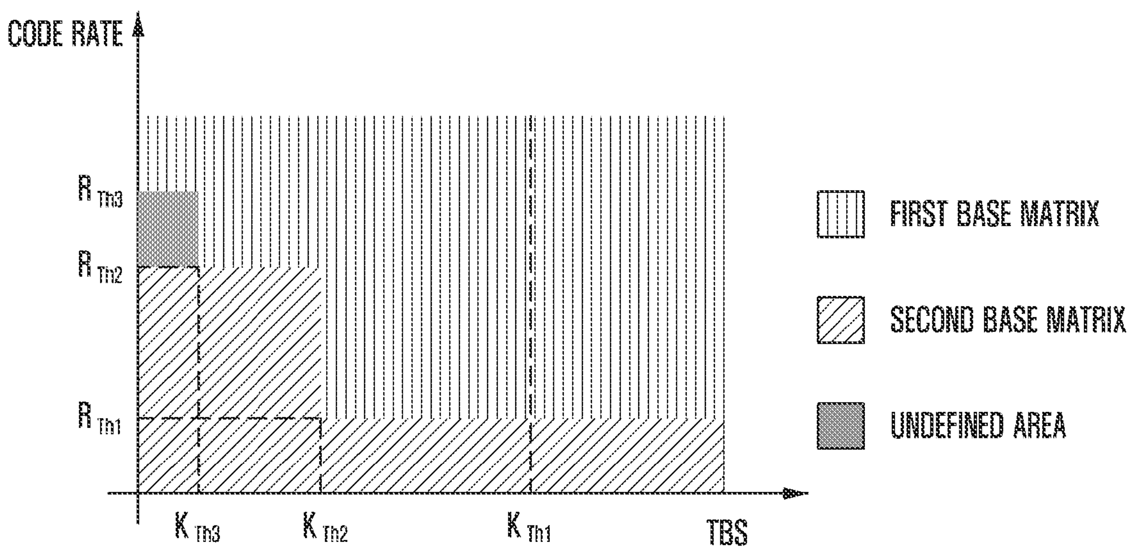
FIG. 46 is a diagram illustrating another exemplary range in which a base matrix is allocated according to a TBS and a code rate.

Referring to FIG. 46, FIG. 46 illustrates a range in which the first base matrix is selected according to the TBS and the code rate, and an area in which the second base matrix is selected. The first base matrix in the disclosure may correspond to the base matrix described with reference to FIG. 19A, and the second base matrix in the disclosure may correspond to the base matrix described with reference to FIG. 20A. However, the embodiment of the disclosure is not limited thereto, and the first base matrix may correspond to the base matrix described with reference to FIG. 20A, and the second base matrix may correspond to the base matrix described with reference to FIG. 19A. In addition, the first base matrix and the second matrix in the disclosure may correspond to two different base matrices configured separately.

FIG. 46 means that the system does not consider a case in which the same has a specific TBS and a specific code rate (R). That is, the undefined area in FIG. 46 may not be used depending on the system, and may also be freely determined by the transmitter and the receiver regardless of the standard.

Figure 47:
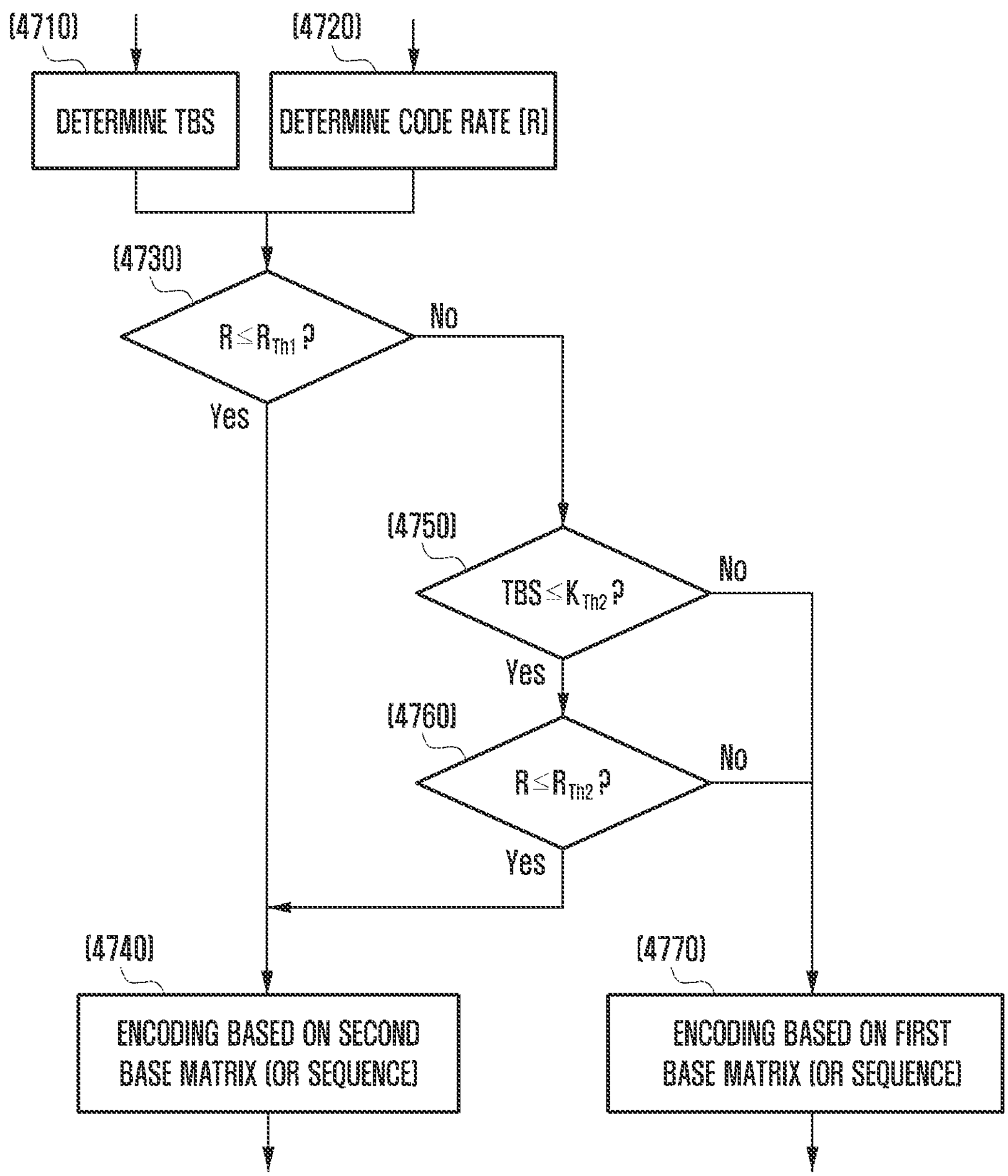
FIG. 47 is another exemplary diagram regarding a method for determining a base matrix according to a TBS and a code rate by a transmitter.
Figure 48:
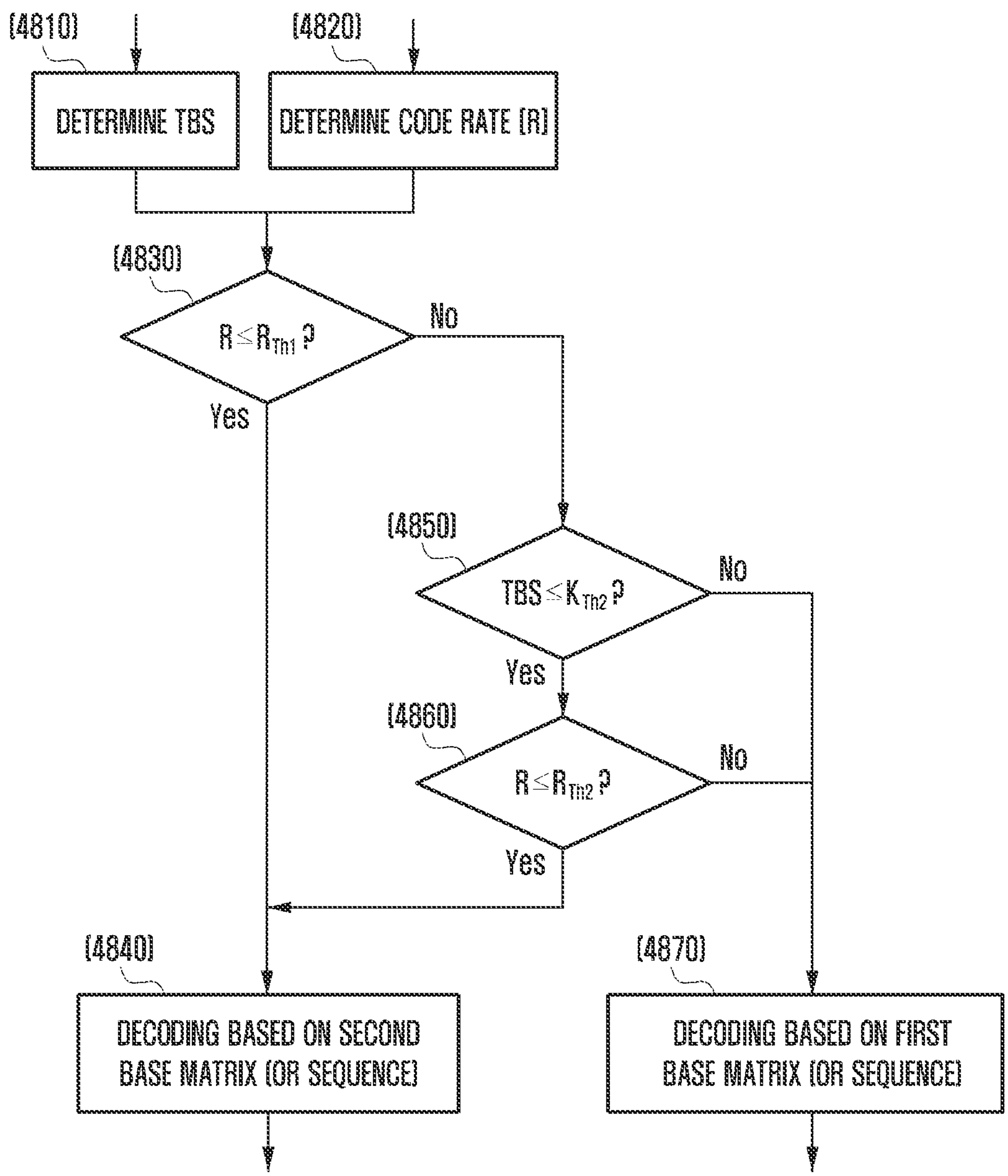
FIG. 48 is another exemplary diagram regarding a method for determining a base matrix according to a TBS and a code rate by a receiver.

As an example regarding FIG. 46, if the system does not use a case in which the same corresponds to TBS and code rate ranges, the process of comparing the determined TBS and code rate R with the third TBS reference value $K_{Th3}$ and the third code rate reference value $R_{Th3}$ as in FIG. 47 and FIG. 48 may be omitted, unlike the flowcharts of operations of the transmitter and the receiver illustrated in FIG. 42 to FIG. 45.

The case in FIG. 46 in which encoding and decoding are performed based on the second LDPC base matrix (or sequence) from among the first LDPC base matrix (or sequence) and the second LDPC base matrix (or sequence) corresponds to a case in which one of the conditions in Equation 29 below is satisfied.

Condition 1) $R \le R_{Th1}$

Condition 2) $R \le R_{Th2}$ and $TBS \le K_{Th2}$ Equation 29

In addition, the case in which encoding and decoding are performed based on the first LDPC base matrix (or sequence) corresponds to a case in which one of the conditions in Equation 30 below is satisfied.

Condition 1) $R > R_{Th3}$

Condition 2) $R > R_{Th2}$ and $TBS > K_{Th3}$

Condition 3) $R > R_{Th1}$ and $TBS > K_{Th2}$ Equation 30

It is to be noted that the areas defined in Equation 29 and Equation 30 above do not include the area satisfying $R_{Th2} < R \le R_{Th3}$ and $TBS \le K_{Th3}$.

In addition, it is when one of the conditions in Equation 28 above is satisfied that LDPC encoding and decoding are performed after additionally applying TB segmentation. Characteristically, if condition 1) is satisfied in Equation 28 above, TB segmentation is performed, and encoding and decoding are then performed based on the second LDPC base matrix (or sequence). If condition 2) is satisfied, encoding and decoding are performed based on the first LDPC base matrix (or sequence).

The above-described LDPC encoding and decoding methods are characterized in that they are based on an LDPC base matrix (or sequence) determined according to the CBS or TBS and the transmission code rate (R). However, the transmission code rate may be defined in various methods, which will now be described. It is obvious that, although the transmission code rate is herein referred to as R for convenience of description, the same may be represented in various manners depending on the system (for example, R_T, R_init, or the like).

Hereinafter, a process of determining the transmission code rate for LDPC encoding and decoding and a process of determining major LDPC code-related parameters will be described.

Respective parameters for description are briefly defined below:

$R_{nominal}$: a code rate related to the MCS. It can be signaled in control information or determined based on information signaled in control information.

$R_{limit}$: a code rate that can be determined based on user equipment (UE) category information. It normally refers to a minimum code rate determined by the buffer size for rate matching. Determination by a given buffer size may mean that repetition of the codeword bit is not considered (for reference, the buffer size as used herein may refer to a space in which a reception signal can be converted appropriately and stored such that decoding can be performed with regard to a received TB)

R_init: refers to a code rate (R) defined to determine an LDPC base matrix in the disclosure. This value may be determined based on $R_{nominal}$ and $R_{limit}$.

BG Index: an index representing an LDPC base matrix. It can be variously expressed. For example, the first base matrix (or sequence) may be represented as BG#1, and the second base matrix (or sequence) may be represented as BG#2. It can be determined based on TBS and R_init.

$K_{cb}$: maximum code block size corresponding to a selected base matrix or BG index.

C: number of code blocks determined by TBS and $K_{cb}$.

K': refers to the number of information bits per code block, and is determined based on TBS and C values. The information word bits include CRC bits. It may be defined while including filler bits or without including the same.

$N_{TBCRC}$: the number of CRC bits attached to the TB.

$Z_C$, $K_b$: parameters for LDPC encoding and decoding, and are necessary values to define a parity-check matrix.

Given below are exemplary expressions of parts of a process of selecting a base matrix of an LDPC code based on the above-defined parameters, and an encoding or decoding process.

Process Example 1

Step 1) TBS and $R_{nominal}$ are signaled in control information.

$R_{nominal}$ is the nominal code rate, as signaled in control information to schedule the transmission of the transport block.

Step 2) $R_{limit}$ may be determined by UE category information.

$R_{limit}$ is lower limit of code rate based on limited circular buffer.

Step 3) $R_{init}$ determination $$R\text{init}=\max(R_{nominal}, R_{limit})$$

Step 4) Base graph selection using TBS and $R_{init}$

BG#1 for (TBS<=3840, $R_{init}$>0.67) or (TBS>3840, $R_{init}$>0.25)

BG#2 for (TBS<=3840, $R_{init}$<=0.67) or (TBS>3840, $R_{init}$<=0.25)

Step 5) Determination of the maximum code block size $K_{cb}$ based on BG index $K_{cb}$=8448 for BG#1

$K_{cb}$=3840 for BG#2

Step 6) Calculation of the number of code blocks C using TBS and $K_{cb}$.

If TBS+$N_{TBCRC}$<$K_{cb}$, C=1;

Otherwise C=(TBS+$N_{TBCRC}$)/($K_{cb}$−24)

If TBS<=3824, $N_{\_TBCRC}$=16, otherwise $N_{\_TBCRC}$=24.

Step 7) Calculation of the number of information bits for the code block (including CRC bits) K' using TBS and C If C=1, K'=TBS+$N_{TBCRC}$;

Otherwise, K'=(TBS+$N_{TBCRC}$)/C+24

Step 8) $K_b$ selection using K' and BG index.

Step 9) $Z_c$ selection using $K_b$ and CBS.

Step 10) PCM selection using $Z_c$ and BG index

In order to describe another embodiment of the disclosure, additional parameters are defined as follows:

$N_{soft}$: refers to the total buffer size that can be used by the receiver. It may be determined based on UE category information.

$K_C$: a parameter related to the maximum allowed carrier aggregation (CA). it may be determined based on $N_{soft}$.

$K_{MIMO}$: a transmit diversity-related parameter determined by the transmission mode.

$M_{DL\_HARQ}$: the maximum value of downlink HARQ (DL HARQ) process number $M_{limit}$: a value related to the downlink HARQ (DL HARQ) process number. It may be a pre-promised value, signaled in control information, or determined based on $N_{soft}$ value (8 in LTE)

$N_{IR}$: refers to a buffer size that can be used per TB by the receiver. It may be determined based on at least two parameters from among $N_{soft}$, $K_C$, $K_{MIMO}$, $M_{DL\_HARQ}$, $M_{limit}$ values.

C1, C2: refer to the number of code blocks when the first LDPC base matrix (or sequence) and the second LDPC base matrix (or sequence) are used, respectively, and may be determined based on TBS and $N_{IR}$.

$K_1$', $K_2$': refer to the number of information word bits regarding a code block when the first LDPC base matrix (or sequence) and the second LDPC base matrix (or sequence) are used, respectively, and may be determined based on TBS and $N_{IR}$.

$N_{cb1}$, $N_{cb2}$: refer to the buffer size corresponding to one code block when the first LDPC base matrix (or sequence) and the second LDPC base matrix (or sequence) are used, respectively, and may be determined based on TBS and $N_{IR}$. If segmentation has been applied to a given TB, the code block refers to a code block after segmentation.

Given below are exemplary expressions of parts of a process of selecting a base matrix of an LDPC code based on the above-defined parameters, and an encoding or decoding process.

Process Example 2

Step 1) TBS and $R_{nominal}$ are signaled in control information.

Step 2) $N_{soft}$ may be determined by UE category.

Step 3) $K_C$, $K_{MIMO}$, $M_{DL\_HARQ}$, and $M_{limit}$ determination by control information and $N_{soft}$.

Step 4) Calculation of $N_{IR}$ using $N_{soft}$, $K_C$, $K_{MIMO}$, $M_{DL\_HARQ}$, and $M_{limit}$.

$N_{IR}$ is the soft buffer size for the transport block $$N_{IR}=\text{floor}(N_{soft}/(K_C \cdot K_{MIMO} \cdot \min(M_{DL\_HARQ}, M_{limit})))$$

Step 5) Calculation of C1 and C2 using TBS $C_1$ and $C_2$ is the number of code blocks based on BG#1 and BG#2 parameters, respectively.

If TBS<8424, $C_1$=1; Otherwise, $C_1$=(TBS+24)/8424

If TBS<3824, $C_2$=1; Otherwise, $C_2$=(TBS+24)/3816

Step 6) Calculation of $N_{cb1}$ and $N_{cb2}$ using $N_{IR}$, $C_1$ and $C_2$ $N_{cb1}$ and $N_{cb2}$ is the soft buffer size for the code block based on BG#1 and BG#2 parameters, respectively.

$$N_{cb1}=\text{floor}(N_{IR}/C_1)$$

$$N_{cb2}=\text{floor}(N_{IR}/C_2)$$

Step 7) Calculation of the number of information bits for the code block (including CRC bits) $K_1$' and $K_2$' using TBS, $C_1$ and $C_2$ If $C_1$=1, $K_1$'=TBS+$N_{TBCRC}$; otherwise $K_1$'=(TBS+$N_{TBCRC}$)/$C_2$+24

If $C_2$=1, $K_2$'=TBS+$N_{TBCRC}$; otherwise $K_2$'=(TBS+$N_{TBCRC}$)/$C_2$+24

Step 8) $R_{limit}$ calculation using K2' and $N_{cb2}$ $R_{limit}$ is lower limit of code rate based on limited circular buffer using BG#2 parameters $$R_{limit}=K2'/N_{cb2}$$

Step 9) $R_{init}$ determination $$R_{init}=\max(R_{nominal},R_{limit})$$

Step 10) Base graph selection using TBS and $R_{init}$.

BG#1 for (TBS<=3840, $R_{init}$>0.67) or (TBS>3840, $R_{init}$>0.25)

BG#2 for (TBS<=3840, $R_{init}$<=0.67) or (TBS>3840, $R_{init}$<=0.25)

Step 11) Determination of C and K' using base graph index)

C=$C_1$, K'=$K_1$' for BG#1

C=$C_2$, K'=$K_2$' for BG#2

Step 12) Calculation of the number of information bits for the code block (including CRC bits) K' calculation using TBS and C If C=1, K'=TBS+$N_{TBCRC}$ Otherwise $K_2$'=(TBS+$N_{TBCRC}$)/C+24

If TBS<=3824 $N_{\_TBCRC}$=16, otherwise $N_{\_TBCRC}$=24.

Step 13) $K_b$ selection using K' and BG index.

Step 14) $Z_c$ selection using $K_b$ and CBS.

Step 15) PCM selection using $Z_c$ and BG index

The biggest difference of process example 2, compared with process example 1, is that $R_{limit}$ can be determined based on $N_{cb2}$ and $K_2$'. After $R_{limit}$ is determined based on $N_{cb2}$ and $K_2$' in this manner, $R_{init}$ can be determined by using $R_{nominal}$ and $R_{limit}$, and the BG index or LDPC base matrix (or sequence) can finally be determined according to the TBS and $R_{init}$.

Given below are various embodiments regarding a more detailed method for determining the $R_{init}$ value.

$R_{init}$ Determination Method 1.

$R_{nominal}$ is the nominal code rate, as signaled in control information to schedule the transmission of the transport block.

$R_{limit}$ is lower limit of code rate based on limited circular buffer $$R_{init}=\max(R_{nominal},R_{limit})$$

Base graph #1 is used for the initial transmission or subsequent re-transmissions of the same TB) when TBS<=3840 and $R_{init}$>0.67

TBS>3840 and $R_{init}$>0.25

Base graph #2 is used for the initial transmission and subsequent re-transmissions of the same TB) when TBS<=3840 and $R_{init}$<=0.67

TBS>3840 and $R_{init}$<=0.25

$R_{init}$ Determination Method 2.

$R_{nominal}$ is the nominal code rate, as signaled in control information to schedule the transmission of the transport block.

$$R_{limit}=K'/N_{cb,limit} \text{ where}$$

K' is the number of input bits for the code block (including CRC bits, not including filler bits)) and $N_{cb,limit}$ is the limited (or full) circular buffer size for the transmission of one code block calculated using BG#2 parameters $$R_{init}=\max(R_{nominal},R_{limit})$$

Base graph #1 is used for the initial transmission or subsequent re-transmissions of the same TB) when TBS<=3840 and $R_{init}$>0.67

TBS>3840 and $R_{init}$>0.25

Base graph #2 is used for the initial transmission and subsequent re-transmissions of the same TB) when TBS<=3840 and $R_{init}$<=0.67

TBS>3840 and $R_{init}$<=0.25

$R_{init}$ Determination Method 3.

$R_{nominal}$ is the nominal code rate, as signaled in control information to schedule the transmission of the transport block.

$$R_{limit}=K'/N_{cb,limit} \text{ where}$$

K' is the number of input bits for the code block (including CRC bits and filler bits)) and $N_{cb,limit}$ is the limited (or full) circular buffer size for the transmission of one code block calculated using BG#2 parameters $$R_{init}=\max(R_{nominal},R_{limit})$$

Base graph #1 is used for the initial transmission and subsequent re-transmissions of the same TB) when TBS<=3840 and $R_{init}$>0.67

TBS>3840 and $R_{init}$>0.25

Base graph #2 is used for the initial transmission and subsequent re-transmissions of the same TB) when TBS<=3840 and $R_{init}$<=0.67

TBS>3840 and $R_{init}$<=0.25

$R_{init}$ Determination Method 4.

$R_{init}$=$R_{nominal}$ when TBS<=3824

$R_{nominal}$ is the nominal code rate, and may be signaled in control information to schedule the transmission of the transport block.

$R_{init}$=max($R_{nominal}$, $R_{limit}$) when TBS>3824

$$R_{limit}=K'/N_{cb,limit} \text{ where}$$

K' is the number of input bits for the code block (including CRC bits, not including filler bits)) and $N_{cb,limit}$ is the limited (or full) circular buffer size for the transmission of one code block calculated using BG#2 parameters Base graph #1 is used for the initial transmission and subsequent re-transmissions of the same TB) when TBS<=3840 and $R_{init}$>0.67

TBS>3840 and $R_{init}$>0.25

Base graph #2 is used for the initial transmission and subsequent re-transmissions of the same TB) when TBS<=3840 and $R_{init}$<=0.67

TBS>3840 and $R_{init}$<=0.25

$R_{init}$ Determination Method 5.

$R_{init}$=$R_{nominal}$ when TBS<=3824

$R_{nominal}$ is the nominal code rate, as signaled in control information to schedule the transmission of the transport block.

$R_{init}$=max($R_{nominal}$, $R_{limit}$) when TBS>3824

$$R_{limit}=K'/N_{cb,limit} \text{ where}$$

K' is the number of input bits for the code block (including CRC bits and filler bits) and $N_{cb,limit}$ is the limited (or full) circular buffer size for the transmission of one code block calculated using BG#2 parameters Base graph #1 is used for the initial transmission and subsequent re-transmissions of the same TB) when
TBS<=3840 and $R_{init}$>0.67
TBS>3840 and $R_{init}$>0.25
Base graph #2 is used for the initial transmission and subsequent re-transmissions of the same TB) when
TBS<=3840 and $R_{init}$<=0.67
TBS>3840 and $R_{init}$<=0.25

$R_{init}$ Determination Method 6.

If TBS<=3824
$R_{init}=R_{nominal}$, wherein $R_{nominal}$ is the nominal code rate, as signaled in control information to schedule the transmission of the transport block.
Base graph #1 is used for the initial transmission and subsequent re-transmissions of the same TB when $R_{init}$>0.67
Base graph #2 is used for the initial transmission and subsequent re-transmissions of the same TB when $R_{init}$<=0.67
If TBS>3824
$R_{init}=\max(R_{nominal},R_{limit})$ wherein,
$R_{limit}=K'/N_{cb,limit}$ and
K' is the number of input bits for the code block (including CRC bits, not including filler bits)) and
$N_{cb,limit}$ is the limited (or full) circular buffer size for the transmission of one code block calculated using BG#2 parameters
Base graph #1 is used for the initial transmission and subsequent re-transmissions of the same TB when $R_{init}$>0.25
Base graph #2 is used for the initial transmission and subsequent re-transmissions of the same TB when $R_{init}$<=0.25

$R_{init}$ Determination Method 7.

If TBS<=3824
$R_{init}=R_{nominal}$ wherein $R_{nominal}$ is the nominal code rate, as signaled in control information to schedule the transmission of the transport block.
Base graph #1 is used for the initial transmission and subsequent re-transmissions of the same TB when $R_{init}$>0.67
Base graph #2 is used for the initial transmission and subsequent re-transmissions of the same TB when $R_{init}$<=0.67
If TBS>3824
$R_{init}=\max(R_{nominal},R_{limit})$ wherein,
$R_{limit}=K'/N_{cb,limit}$ and
K' is the number of input bits for the code block (including CRC bits and filler bits) and
$N_{cb,limit}$ is the limited (or full) circular buffer size for the transmission of one code block calculated using BG#2 parameters
Base graph #1 is used for the initial transmission and subsequent re-transmissions of the same TB when $R_{init}$>0.25
Base graph #2 is used for the initial transmission and subsequent re-transmissions of the same TB when $R_{init}$<=0.25

Next, another specific embodiment of determining $R_{nominal}$ will be described. Reference will now be made to Equation 31 below:

$$R_{nominal} = f\left(\frac{\#RB \times R_{MCS}}{\#\text{OFDM\_symbol}}\right) \quad \text{Equation 31}$$

-continued or $$R_{nominal} = f\left(\frac{TBS}{\#\text{OFDM\_symbol} \times \#\text{sub\_carrier\_RB} \times MOD}\right)$$

In Equation 31 above, #RB refers to the number of resource blocks (RB) for transmitting the TB, and may be transmitted as control information. RMCS refers to a code rate indicated to the MCS, and is determined according to the MCS value. #OFDM_symbol refers to the number of OFDM symbols for transmitting the TB, and may be transmitted as control information. #sub_carrier_RB refers to the number of subcarriers allocated per RB. MOD refers to the modulation order, and is 2 in the case of QPSK, 4 in the case of 16QAM, 6 in the case of 640QAM, and 8 in the case of 256QAM. The $R_{nominal}$ value may also be determined by additionally considering reference signaling (RS).

As another embodiment corresponding to Equation 31 above, at least one of #OFDM_symbol, #sub_carrier_RB, RMCS, #RB, MOD, TBS of the initial transmission used to determine the $R_{nominal}$ may be stored by the transmitter and the receiver, and the LDPC base matrix (or sequence) may be determined based on the same.

As still another embodiment, LDPC base matrices (or sequences) to be used may all be determined in advance and configured as a table, and LDPC matrices to be used may be determined based on the table. In this case, since the table is configured based on MCS and #RB, the LDPC base matrix (or sequence) may be determined by a combination of the MCS and #RB. However, the LDPC base matrix (or sequence) may be determined differently from the given table, depending on the situation. For example, if a limited buffer is used, a limitation may be made in view thereof such that the LDPC base matrix (or sequence) is finally determined regardless of the table, as long as the following condition is satisfied:

if $R_{limit}>R_{th}$ and $R_{nominal}<R_{th}$ are satisfied simultaneously, encoding and decoding may be performed always based on the first LDPC base matrix (or sequence).

The $R_{th}$ value is a predetermined value, and a value such as 0.25, for example, may be used therefor.

Although the disclosure has been described with regard to preferred embodiments, various changes and modifications may be presented to those skilled in the art. Such changes and modifications are intended to be included in the accompanying claims.

What is claimed is:

1. A method for low density parity check (LDPC) encoding performed by a transmitting device in a communication system, the method comprising:
identifying a code rate;
identifying a size of a data block;
identifying a base matrix as one of a first base matrix and a second base matrix based on the size of the data block and the code rate;
identifying a block size (Z) for lifting based on the size of the data block;
identifying an H matrix based on the base matrix and the block size (Z); and
performing the LDPC encoding of at least part of the data block based on the base matrix,
wherein the base matrix is identified as the second base matrix in case that the code rate is smaller than or equal to a first code rate threshold,
wherein in case that the size of the data block is smaller than or equal to a first data block size threshold and larger than a second data block size threshold, the base matrix is identified as the second base matrix in case that the code rate is smaller than or equal to a second code rate threshold, wherein the second code rate threshold is larger than the first code rate threshold, and wherein in case that the size of the data block is smaller than or equal to the first data block size threshold and larger than the second data block size threshold, the base matrix is identified as the first base matrix in case that the code rate is larger than the second code rate threshold.

2. The method of claim 1, further comprising:

identifying a block size group (Zi) including the block size (Z) among following block size groups:

$$Z1=\{2,4,8,16,32,64,128,256\},$$

$$Z2=\{3,6,12,24,48,96,192,384\},$$

$$Z3=\{5,10,20,40,80,160,320\},$$

$$Z4=\{7,14,28,56,112,224\},$$

$$Z5=\{9,18,36,72,144,288\},$$

$$Z6=\{11,22,44,88,176,352\},$$

$$Z7=\{13,26,52,104,208\},\text{or}$$

$$Z8=\{15,30,60,120,240\},$$

wherein the H matrix is identified further based on the block size group.

3. The method of claim 1, wherein cyclic redundancy check (CRC) bits are attached to the data block, wherein a size of the CRC bits is a first size in case that the size of the data block is larger than a threshold value, wherein the size of the CRC bits is a second size in case that the size of the data block is smaller than or equal to the threshold value, and wherein the first size and the second size are different.

4. A method for low density parity check (LDPC) decoding performed by a receiving device in a communication system, the method comprising:

identifying a code rate;

identifying a size of a data block;

identifying a base matrix as one of a first base matrix and a second base matrix based on the size of the data block and the code rate;

identifying a block size (Z) based on the size of the data block;

identifying an H matrix based on the base matrix and the block size (Z); and performing the LDPC decoding of at least part of the data block based on the base matrix, wherein the base matrix is identified as the second base matrix in case that the code rate is smaller than or equal to a first code rate threshold, wherein in case that the size of the data block is smaller than or equal to a first data block size threshold and larger than a second data block size threshold, the base matrix is identified as the second base matrix in case that the code rate is smaller than or equal to a second code rate threshold, wherein the second code rate threshold is larger than the first code rate threshold, and wherein in case that the size of the data block is smaller than or equal to the first data block size threshold and larger than the second data block size threshold, the base matrix is identified as the first base matrix in case that the code rate is larger than the second code rate threshold.

5. The method of claim 4, further comprising:

identifying a block size group (Zi) including the block size (Z) among following block size groups:

$$Z1=\{2,4,8,16,32,64,128,256\},$$

$$Z2=\{3,6,12,24,48,96,192,384\},$$

$$Z3=\{5,10,20,40,80,160,320\},$$

$$Z4=\{7,14,28,56,112,224\},$$

$$Z5=\{9,18,36,72,144,288\},$$

$$Z6=\{11,22,44,88,176,352\},$$

$$Z7=\{13,26,52,104,208\},\text{or}$$

$$Z8=\{15,30,60,120,240\},$$

wherein the H matrix is identified further based on the block size group.

6. The method of claim 4, wherein cyclic redundancy check (CRC) bits are attached to the data block, wherein a size of the CRC bits is a first size in case that the size of the data block is larger than a threshold value, wherein the size of the CRC bits is a second size in case that the size of the data block is smaller than or equal to the threshold value, and wherein the first size and the second size are different.

7. An apparatus for low density parity check (LDPC) encoding in a communication system, the apparatus comprising:

a transceiver; and a controller coupled with the transceiver and configured to:

identify a code rate, identify a size of a data block, identify a base matrix as one of a first base matrix and a second base matrix based on the size of the data block and the code rate, identify a block size (Z) for lifting based on the size of the data block, identify an H matrix based on the base matrix and the block size (Z), and perform the LDPC encoding of at least part of the data block based on the base matrix, wherein the base matrix is identified as the second base matrix in case that the code rate is smaller than or equal to a first code rate threshold, wherein in case that the size of the data block is smaller than or equal to a first data block size threshold and larger than a second data block size threshold, the base matrix is identified as the second base matrix in case that the code rate is smaller than or equal to a second code rate threshold, wherein the second code rate threshold is larger than the first code rate threshold, and wherein in case that the size of the data block is smaller than or equal to the first data block size threshold and larger than the second data block size threshold, the base matrix is identified as the first base matrix in case that the code rate is larger than the second code rate threshold.

8. The apparatus of claim 7, wherein the controller is configured to identify a block size group (Zi) including the block size (Z) among following block size groups:

$$Z1=\{2,4,8,16,32,64,128,256\},$$

$$Z2=\{3,6,12,24,48,96,192,384\},$$

$$Z3=\{5,10,20,40,80,160,320\},$$

$$Z4=\{7,14,28,56,112,224\},$$

$$Z5=\{9,18,36,72,144,288\},$$

$$Z6=\{11,22,44,88,176,352\},$$

$$Z7=\{13,26,52,104,208\},\text{or}$$

$$Z8=\{15,30,60,120,240\},$$

wherein the H matrix is identified further based on the block size group.

9. The apparatus of claim 7, wherein cyclic redundancy check (CRC) bits are attached to the data block, wherein a size of the CRC bits is a first size in case that the size of the data block is larger than a threshold value, wherein the size of the CRC bits is a second size in case that the size of the data block is smaller than or equal to the threshold value, and wherein the first size and the second size are different.

10. An apparatus for low density parity check (LDPC) decoding in a communication system, the apparatus comprising:

a transceiver; and a controller coupled with the transceiver and configured to:

identify a code rate, identify a size of a data block, identify a base matrix as one of a first base matrix and a second base matrix based on the size of the data block and the code rate, identify a block size (Z) based on the size of the data block, identify an H matrix based on the base matrix and the block size (Z), and perform the LDPC decoding of at least part of the data block based on the base matrix, wherein the base matrix is identified as the second base matrix in case that the code rate is smaller than or equal to a first code rate threshold, wherein in case that the size of the data block is smaller than or equal to a first data block size threshold and larger than a second data block size threshold, the base matrix is identified as the second base matrix in case that the code rate is smaller than or equal to a second code rate threshold, wherein the second code rate threshold is larger than the first code rate threshold, and wherein in case that the size of the data block is smaller than or equal to the first data block size threshold and larger than the second data block size threshold, the base matrix is identified as the first base matrix in case that the code rate is larger than the second code rate threshold.

11. The apparatus of claim 10, wherein the controller is configured to identify a block size group (Zi) including the block size (Z) among following block size groups:

$$Z1=\{2,4,8,16,32,64,128,256\},$$

$$Z2=\{3,6,12,24,48,96,192,384\},$$

$$Z3=\{5,10,20,40,80,160,320\},$$

$$Z4=\{7,14,28,56,112,224\},$$

$$Z5=\{9,18,36,72,144,288\},$$

$$Z6=\{11,22,44,88,176,352\},$$

$$Z7=\{13,26,52,104,208\},\text{or}$$

$$Z8=\{15,30,60,120,240\},$$

wherein the H matrix is identified further based on the block size group.

12. The apparatus of claim 10, wherein cyclic redundancy check (CRC) bits are attached to the data block, wherein a size of the CRC bits is a first size in case that the size of the data block is larger than a threshold value, wherein the size of the CRC bits is a second size in case that the size of the data block is smaller than or equal to the threshold value, and wherein the first size and the second size are different.

* * * * *